United States Patent
Yamade et al.

(10) Patent No.: US 8,772,094 B2
(45) Date of Patent: Jul. 8, 2014

(54) METHOD FOR MANUFACTURING SEMICONDUCTOR DEVICE

(71) Applicant: Semiconductor Energy Laboratory Co., Ltd., Atsugi (JP)

(72) Inventors: Naoto Yamade, Isehara (JP); Junichi Koezuka, Tochigi (JP); Shunpei Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 39 days.

(21) Appl. No.: 13/681,895

(22) Filed: Nov. 20, 2012

(65) Prior Publication Data

US 2013/0137226 A1    May 30, 2013

(30) Foreign Application Priority Data

Nov. 25, 2011 (JP) ................... 2011-257793
Dec. 6, 2011 (JP) ................... 2011-267307

(51) Int. Cl.
*H01L 21/00* (2006.01)
(52) U.S. Cl.
USPC .......................................... 438/158; 438/530
(58) Field of Classification Search
USPC .......................................................... 438/530
See application file for complete search history.

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |

(Continued)

FOREIGN PATENT DOCUMENTS

| EP | 1737044 A | 12/2006 |
|---|---|---|
| EP | 2226847 A | 9/2010 |

(Continued)

OTHER PUBLICATIONS

Fortunato.E et al., "Wide-Bandgap High-Mobility ZNO Thin-Film Transistors Produced at Room Temperature,", Appl. Phys. Lett. (Applied Physics Letters), Sep. 27, 2004, vol. 85, No. 13, pp. 2541-2543.

(Continued)

*Primary Examiner* — Lex Malsawma
(74) *Attorney, Agent, or Firm* — Eric J. Robinson; Robinson Intellectual Property Law Office, P.C.

(57) ABSTRACT

A highly reliable semiconductor device that includes a transistor including an oxide semiconductor is provided. In a manufacturing process of a semiconductor device that includes a bottom-gate transistor including an oxide semiconductor, an insulating film which is in contact with an oxide semiconductor film is subjected to dehydration or dehydrogenation treatment by heat treatment and oxygen doping treatment in this order. The insulating film which is in contact with the oxide semiconductor film refers to a gate insulating film provided under the oxide semiconductor film and an insulating film which is provided over the oxide semiconductor film and functions as a protective insulating film. The gate insulating film and/or the insulating film are/is subjected to dehydration or dehydrogenation treatment by heat treatment and oxygen doping treatment in this order.

20 Claims, 17 Drawing Sheets

(56) References Cited

U.S. PATENT DOCUMENTS

| | | |
|---|---|---|
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,910,490 B2 | 3/2011 | Akimoto et al. |
| 7,932,521 B2 | 4/2011 | Akimoto et al. |
| 8,274,077 B2 | 9/2012 | Akimoto et al. |
| 8,461,007 B2 * | 6/2013 | Yamazaki ............... 438/287 |
| 8,546,225 B2 * | 10/2013 | Yamazaki ............... 438/287 |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308796 A1 | 12/2008 | Akimoto et al. |
| 2008/0308805 A1 | 12/2008 | Akimoto et al. |
| 2009/0008639 A1 | 1/2009 | Akimoto et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2009/0305461 A1 | 12/2009 | Akimoto et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0136743 A1 | 6/2010 | Akimoto et al. |
| 2011/0104851 A1 | 5/2011 | Akimoto et al. |
| 2011/0117697 A1 | 5/2011 | Akimoto et al. |
| 2011/0121290 A1 | 5/2011 | Akimoto et al. |
| 2011/0136301 A1 | 6/2011 | Yamazaki et al. |
| 2011/0163311 A1 | 7/2011 | Akimoto et al. |
| 2011/0212569 A1 | 9/2011 | Yamazaki et al. |
| 2011/0263082 A1* | 10/2011 | Yamazaki ............... 438/158 |
| 2011/0263083 A1* | 10/2011 | Yamazaki ............... 438/161 |
| 2011/0263084 A1* | 10/2011 | Yamazaki ............... 438/161 |
| 2011/0263085 A1* | 10/2011 | Yamazaki ............... 438/161 |
| 2011/0263091 A1* | 10/2011 | Yamazaki ............... 438/287 |
| 2012/0051117 A1 | 3/2012 | Yamazaki et al. |
| 2012/0319183 A1* | 12/2012 | Yamazaki et al. ......... 257/288 |
| 2013/0009209 A1* | 1/2013 | Yamazaki ............... 257/192 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 A | 4/2007 |
| JP | 2007-123861 A | 5/2007 |
| JP | 2009-224479 A | 10/2009 |
| JP | 2011-181801 A | 9/2011 |
| WO | WO-2004/114391 | 12/2004 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

(56) References Cited

OTHER PUBLICATIONS

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08: Proceedings of the 15th International Display Workshops, Dec. 3, 2008, pp. 1637-1640.

Hayashi.R et al., "42.1: Invited Paper: Improved Amorphous In—Ga—Zn—O TFTS,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the In2O3—Ga2ZnO4—ZnO system at 1350° C.,", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m= 3, 4, and 5), InGaO3(ZnO)3, and Ga2O3(ZnO)m (m= 7, 8, 9, and 16) in the In2O3—ZnGa2O4—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630

Asakuma.N et al., "Crystallization and Reduction of Sol-Gel-Derived Zinc Oxide Films by Irradiation with Ultraviolet Lamp,", Journal of Sol-Gel Science and Technology, 2003, vol. 26, pp. 181-194.

Osada.T et al., "15.2: Development of Driver-Integrated Panel using Amorphous In—Ga—Zn—Oxide TFT,", SID Digest'09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.

Lee.J et al., "World'S Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem Oleds,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 29, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits, 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTS,", IDW '09 : Proceedings of the 16th International Display Workshops, 2009, pp. 689-692.

Park.J et al., "Amorphous Indium—Gallium—Zinc Oxide TFTS and Their Application for Large Size AMOLDED,", AM-FPD '08 Digest of Technical Papers, Jul. 2, 2008, pp. 275-278.

Park.S et al., "Challenge to Future Displays: Transparent AM-OLED Driven by Peald Grown ZNO TFT,", IMID '07 Digest, 2007, pp. 1249-1252.

Godo.H et al., "Temperature Dependence of Characteristics and Electronic Structure for Amorphous In—Ga—Zn-Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors (ZNO TFTS) for AMLCDS,", Journal of the SID, 2007, vol. 15, No. 1, pp. 17-22

Hosono.H, "68.3:Invited Paper:Transparent Amorphous Oxide Semiconductors for High Performance TFT,", SID Digest '07 : SID International Symposium Digest of Technical Papers, 2007 vol. 38, pp. 1830-1833.

Godo.H et al., "P-9:Numerical Analysis on Temperature Dependence of Characteristics of Amorphous In—Ga—Zn—Oxide TFT,", SID Digest '-09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTS With a Novel Passivation Layer,", SID Digest '09 : SID International Symposium Digest of Technical Papers, May 31, 2009, pp. 284-287.

Miyasaka.M, "Suftla flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions of Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

(56) References Cited

OTHER PUBLICATIONS

Asaoka.Y et al., "29.1: Polarizer-Free Reflective LCD Combined With Ultra Low-Power Deriving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 633-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papaers, 2007, vol. 38, pp. 1737-1740.

Nakamura.M, "Synthesis of Homologous Compound wiht New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "Spinel,YBFE2O4, and YB2FE3O7 Types of Structures for Compounds in the In2O3 and SC2O3—A2O3—BO Systems [A; Fe, Ga, or Al; B: Mg, Mn, Fe, Ni, Cu,Or Zn] at teperatures over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 56, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, p. 4304-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZNO Thin-Film Transistors with Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistors on SrTiO3 With Sputtered Al2O3 Gate Insulator,", Appl. Phys. Lett. (Applied Physics Letters) , Sep. 1, 2003, vol. 82, No. 9, pp. 1755-1757.

\* cited by examiner

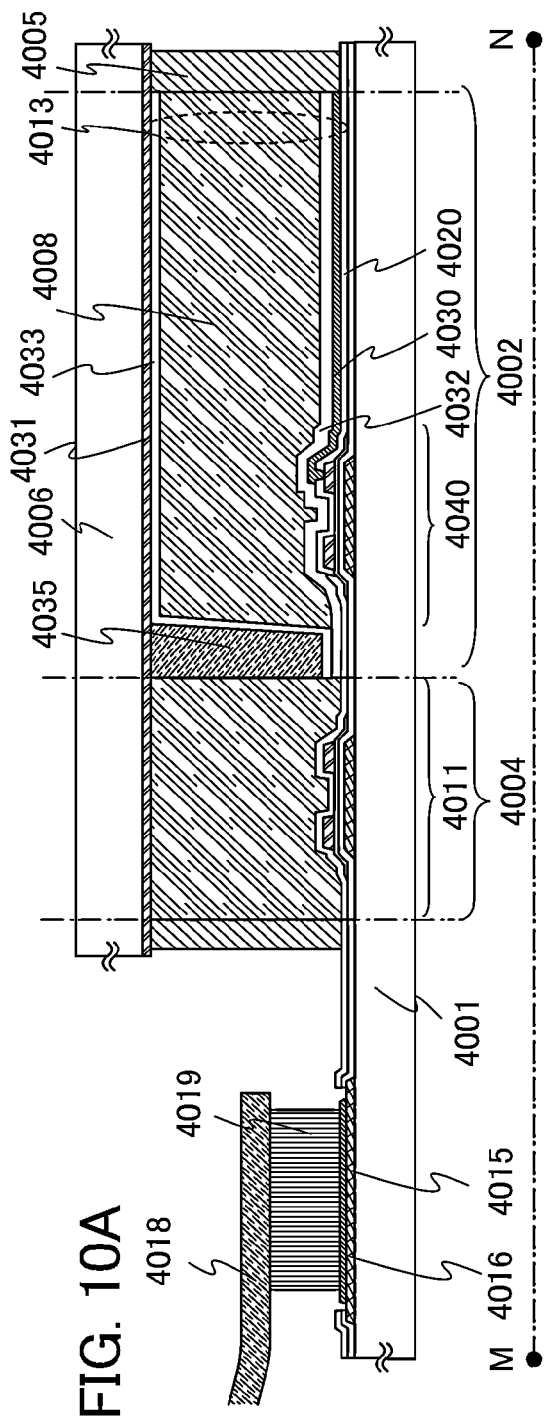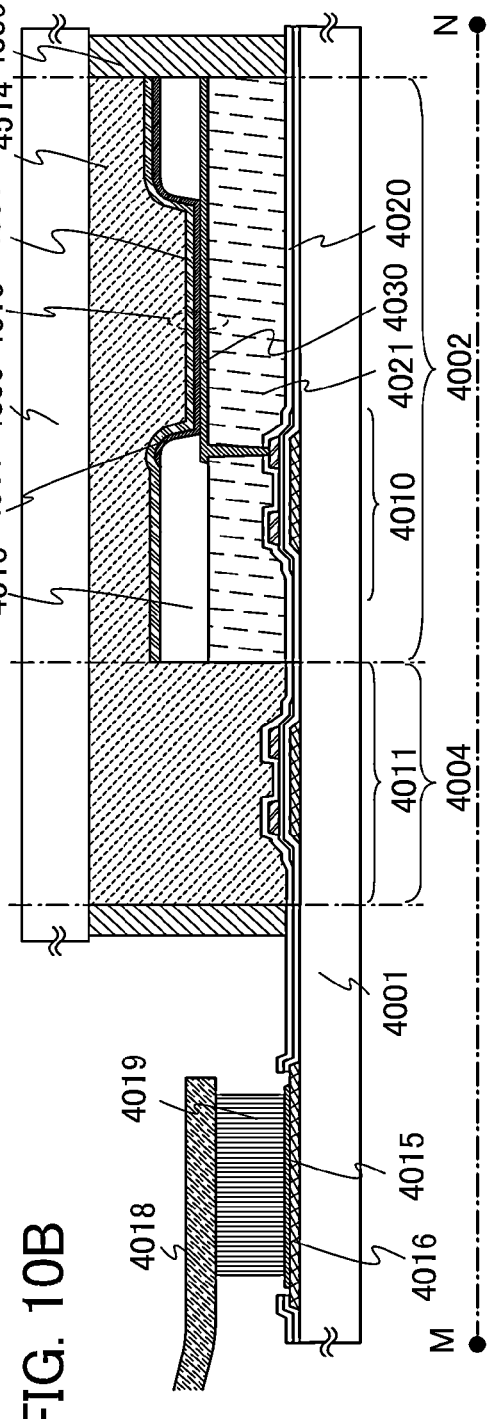

50nm

30nm

50nm

30nm

METHOD FOR MANUFACTURING SEMICONDUCTOR DEVICE

BACKGROUND OF THE INVENTION

1. Field of the Invention

The present invention relates to a semiconductor device and a method for manufacturing the semiconductor device.

In this specification, a semiconductor device generally means a device which can function by utilizing semiconductor characteristics, and an electrooptic device, a semiconductor circuit, and an electronic device are all semiconductor devices.

2. Description of the Related Art

Attention has been focused on a technique for forming a transistor using a semiconductor thin film formed over a substrate having an insulating surface (also referred to as a thin film transistor (TFT)). The transistor is applied to a wide range of electronic devices such as an integrated circuit (IC) or an image display device (display device). A silicon-based semiconductor material is widely known as a material for a semiconductor thin film applicable to a transistor. As another material, an oxide semiconductor has been attracting attention.

For example, a transistor including a semiconductor layer formed using an amorphous oxide containing indium (In), gallium (Ga), and zinc (Zn) (an In—Ga—Zn—O-based amorphous oxide) over a substrate is disclosed (see Patent Document 1).

REFERENCE

Patent Document

[Patent Document 1] Japanese Published Patent Application No. 2011-181801

SUMMARY OF THE INVENTION

Improvement in reliability is important for commercialization of semiconductor devices including transistors that include an oxide semiconductor.

In particular, variation and decrease in electric characteristics of the semiconductor device might reduce the reliability thereof.

In view of the above problem, it is an object to provide a highly reliable semiconductor device including a transistor using an oxide semiconductor.

In a manufacturing process of a semiconductor device that includes a bottom-gate transistor including an oxide semiconductor film, an insulating film which is in contact with the oxide semiconductor film is subjected to dehydration or dehydrogenation treatment by heat treatment and then oxygen doping treatment.

The insulating film which is in contact with the oxide semiconductor film refers to a gate insulating film provided under the oxide semiconductor film and an insulating film functioning as a protective insulating film (and an interlayer insulating film) and provided over the oxide semiconductor film. The gate insulating film and/or the insulating film are/is subjected to dehydration or dehydrogenation treatment by heat treatment and then oxygen doping treatment.

Oxygen doping treatment may be performed on an insulating film before dehydration or dehydrogenation treatment is performed by heat treatment. The oxygen doping treatment and heat treatment may be performed plural times. When oxygen doping treatment is performed on an insulating film before heat treatment is performed, dehydration or dehydrogenation treatment can be performed effectively on the insulating film.

It is preferable that heat treatment be performed in a state where a gate insulating film and/or an insulating film which are/is subjected to dehydration or dehydrogenation treatment and oxygen doping treatment is in contact with an oxide semiconductor film. By the heat treatment, oxygen can be supplied from the gate insulating film and/or the insulating film to the oxide semiconductor film. By supplying oxygen to the oxide semiconductor film, oxygen vacancies in the film can be repaired.

One embodiment of a structure of the invention disclosed in this specification is a method for manufacturing a semiconductor device including the steps of forming a gate electrode layer, forming a gate insulating film over the gate electrode layer, removing water or hydrogen from the gate insulating film by performing heat treatment on the gate insulating film, supplying oxygen to the gate insulating film by performing oxygen doping treatment on the gate insulating film from which water or hydrogen is removed, forming an oxide semiconductor film over a region of the gate insulating film, which overlaps with the gate electrode layer, and forming a source electrode layer and a drain electrode layer electrically connected to the oxide semiconductor film.

Oxygen doping treatment may be performed on the gate insulating film before dehydration or dehydrogenation treatment is performed by heat treatment.

Further, it is preferable that heat treatment be performed on the gate insulating film and the oxide semiconductor film after the oxide semiconductor film is formed over the gate insulating film which is subjected to dehydration or dehydrogenation treatment by heat treatment and then oxygen doping treatment.

Another embodiment of a structure of the invention disclosed in this specification is a method for manufacturing a semiconductor device including the steps of forming a gate electrode layer, forming a gate insulating film over the gate electrode layer, forming an oxide semiconductor film over a region of the gate insulating film, which overlaps with the gate electrode layer, forming a source electrode layer and a drain electrode layer electrically connected to the oxide semiconductor film, forming an insulating film over the oxide semiconductor film, the source electrode layer, and the drain electrode layer and in contact with the oxide semiconductor film, removing water or hydrogen from the insulating film by performing heat treatment on the insulating film, and supplying oxygen to an insulating film from which water or hydrogen is removed by performing oxygen doping treatment on the insulating film.

Oxygen doping treatment may be performed on the insulating film before dehydration or dehydrogenation treatment is performed on the insulating film by heat treatment.

Another embodiment of a structure of the invention disclosed in this specification is a method for manufacturing a semiconductor device including the steps of forming a gate electrode layer, forming a gate insulating film over the gate electrode layer, removing water or hydrogen from the gate insulating film by performing first heat treatment on the gate insulating film, supplying oxygen to the gate insulating film by performing first oxygen doping treatment on the gate insulating film from which water or hydrogen is removed, forming an oxide semiconductor film over a region of the gate insulating film, which overlaps with the gate electrode layer, forming a source electrode layer and a drain electrode layer electrically connected to the oxide semiconductor film, forming an insulating film over the oxide semiconductor film, the source electrode layer, and the drain electrode layer and in contact with the oxide semiconductor film, removing water or hydrogen from the insulating film by performing second heat treatment on the insulating film, and supplying oxygen to an insulating film from which water or hydrogen is removed by performing second oxygen doping treatment on the insulating film.

In the above structure, oxygen doping treatment may be performed on the gate insulating film before dehydration or dehydrogenation treatment is performed by the first heat treatment. Oxygen doping treatment may be performed on the insulating film before dehydration or dehydrogenation treatment is performed by the second heat treatment.

Further, it is preferable that heat treatment be performed on the gate insulating film, the oxide semiconductor film, and the insulating film after a highly dense film, typically an aluminum oxide film, is formed over the gate insulating film and the insulating film on which dehydration or dehydrogenation treatment by heat treatment and oxygen doping treatment are performed. The aluminum oxide film has a high shielding effect (blocking effect) of preventing penetration of both oxygen and impurities such as hydrogen and moisture. Therefore, during and after the manufacturing process, the aluminum oxide film can prevent mixture of impurities such as hydrogen and moisture which cause variation in characteristics into the gate insulating film, the oxide semiconductor film, and the insulating film and release of oxygen from the gate insulating film, the oxide semiconductor film, and the insulating film.

The gate insulating film and/or the insulating film can be formed by a deposition method using a deposition gas. For example, the gate insulating film or/and the insulating film can be formed by a chemical vapor deposition (CVD) method.

Note that the above-described "oxygen doping" means that oxygen (which includes at least one of an oxygen radical, an oxygen atom, an oxygen molecule, an ozone, an oxygen ion (an oxygen molecule ion), and/or an oxygen cluster ion) is added to a bulk. Note that the term "bulk" is used in order to clarify that oxygen is added not only to a surface of a thin film but also to the inside of the thin film. In addition, "oxygen doping" includes "oxygen plasma doping" in which oxygen which is made to be plasma is added to a bulk.

A gas containing oxygen can be used for oxygen doping treatment. As a gas containing oxygen, oxygen, dinitrogen monoxide, nitrogen dioxide, carbon dioxide, carbon monoxide, or the like can be used. Alternatively, a rare gas can be used for oxygen doping treatment.

An embodiment of the present invention relates to a semiconductor device including a transistor or a semiconductor device including a circuit which is formed by using a transistor. For example, an embodiment of the present invention relates to a semiconductor device including a transistor in which a channel formation region is formed using an oxide semiconductor or a semiconductor device including a circuit which is formed by using such a transistor. For example, the present invention relates to an electronic device which includes, as a component, an LSI, a CPU, a power device mounted in a power circuit, a semiconductor integrated circuit including a memory, a thyristor, a converter, an image sensor, or the like, or a light-emitting display device including a light-emitting element or an electro-optical device typified by a liquid crystal display panel.

With an embodiment of the present invention, a highly reliable semiconductor device including a transistor using an oxide semiconductor is provided.

BRIEF DESCRIPTION OF THE DRAWINGS

In the accompanying drawings:

FIGS. 10A and 10B are cross-sectional views each illustrating one embodiment of a semiconductor device;

DETAILED DESCRIPTION OF THE INVENTION

Hereinafter, embodiments of the invention disclosed in this specification will be described in detail with reference to the accompanying drawings. Note that the invention disclosed in this specification is not limited to the following description, and it is easily understood by those skilled in the art that modes and details can be variously changed. Therefore, the invention disclosed in this specification is not construed as being limited to the description of the following embodiments. Note that the ordinal numbers such as "first" and "second" in this specification are used for convenience and do not denote the order of steps and the stacking order of layers. In addition, the ordinal numbers in this specification do not denote particular names which specify the present invention.

(Embodiment 1)

In this embodiment, one embodiment of a semiconductor device and a method for manufacturing the semiconductor device is described with reference to FIGS. 1A to 1E. In this embodiment, a transistor including an oxide semiconductor film will be described as an example of the semiconductor device.

The transistor may have a single-gate structure in which one channel formation region is formed, a double-gate structure in which two channel formation regions are formed, or a triple-gate structure in which three channel formation regions are formed. Alternatively, the transistor may have a dual-gate structure including two gate electrode layers positioned above and below a channel formation region with a gate insulating film provided therebetween.

Figure 4A:
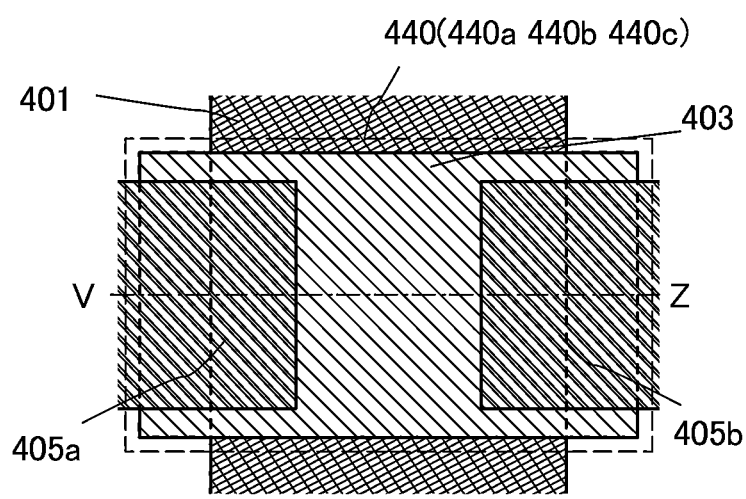
FIGS. 4A and 4B are a plan view and a cross-sectional view illustrating one embodiment of a semiconductor device.
Figure 4B:
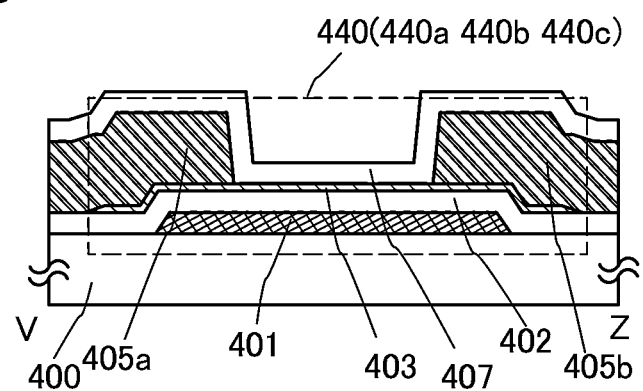

A transistor 440 (440a, 440b, and 440c) illustrated in FIGS. 4A and 4B is an example of an inverted staggered transistor that is one type of a bottom-gate transistor. FIG. 4A is a plan view, and FIG. 4B is a cross-sectional view taken along the chain line V-Z in FIG. 4A.

As illustrated in FIG. 4B which is the cross-sectional view of the transistor 440 (440a, 440b, and 440c) in a channel length direction, a semiconductor device including the transistor 440 (440a, 440b, and 440c) includes a gate electrode layer 401 over a substrate 400, and a gate insulating film 402, an oxide semiconductor film 403, a source electrode layer 405a, and a drain electrode layer 405b over the gate electrode layer 401. An insulating film 407 is provided to cover the transistor 440.

In the process for manufacturing the transistor 440 (440a, 440b, and 440c) disclosed in this specification, after dehydration or dehydrogenation treatment by heat treatment is performed on an insulating film (the gate insulating film 402 and/or the insulating film 407) which is in contact with the oxide semiconductor film 403, oxygen doping treatment is performed thereon.

In this embodiment, the transistor 440a which is manufactured by performing dehydration or dehydrogenation treatment by heat treatment and then oxygen doping treatment on a gate insulating film which is in contact with a lower side of the oxide semiconductor film is described as an example.

An oxide semiconductor used for the oxide semiconductor film 403 contains at least indium (In). In particular, In and zinc (Zn) are preferably contained. It is preferable that gallium (Ga) be additionally contained as a stabilizer for reducing a variation in electric characteristics of a transistor including the oxide semiconductor. Tin (Sn) is preferably contained as a stabilizer. Hafnium (Hf) is preferably contained as a stabilizer. Aluminum (Al) is preferably contained as a stabilizer. Zirconium (Zr) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, any of the following can be used: indium oxide; tin oxide; zinc oxide; a two-component metal oxide such as an In—Zn-based oxide, an In—Mg-based oxide, or an In—Ga-based oxide; a three-component metal oxide such as an In—Ga—Zn-based oxide (also referred to as IGZO), an In—Al—Zn-based oxide, an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

Note that here, for example, an "In—Ga—Zn-based oxide" means an oxide containing In, Ga, and Zn as its main component and there is no particular limitation on the ratio of In:Ga:Zn. The In—Ga—Zn-based oxide may contain a metal element other than In, Ga, and Zn.

Alternatively, a material represented by a chemical formula $InMO_3(ZnO)_m$ (m>0 is satisfied, and m is not an integer) may be used as an oxide semiconductor. Note that M represents one or more metal elements selected from Ga, Fe, Mn, and Co. Alternatively, as the oxide semiconductor, a material represented by a chemical formula $In_2SnO_5(ZnO)_n$ (n>0, n is an integer) may be used.

For example, an In—Ga—Zn-based oxide with an atomic ratio of In:Ga:Zn being 1:1:1 (=1/3:1/3:1/3), 2:2:1 (=2/5:2/5:1/5), or 3:1:2 (=1/2:1/6:1/3), or any of oxides whose composition is in the neighborhood of the above compositions can be used. Alternatively, an In—Sn—Zn-based oxide with an atomic ratio of In:Sn:Zn is 1:1:1 (=1/3:1/3:1/3), 2:1:3 (=1/3:1/6:1/2), or 2:1:5 (=1/4:1/8:5/8), or any of oxides whose composition is in the neighborhood of the above compositions can be used.

However, the composition of the oxide semiconductor containing indium is not limited to those described above, and a material having an appropriate composition can be used in accordance with semiconductor characteristics which are necessary (such as mobility, threshold value, and variation). In order to obtain semiconductor characteristics which are necessary, it is preferable that the carrier density, the impurity concentration, the defect density, the atomic ratio of a metal element to oxygen, the interatomic distance, the density, and the like be set as appropriate.

For example, high mobility can be obtained relatively easily in the case of using an In—Sn—Zn oxide. However, mobility can be increased by reducing the defect density in a bulk also in the case of using an In—Ga—Zn-based oxide.

Note that for example, the expression "the composition of an oxide including In, Ga, and Zn at the atomic ratio, In:Ga:Zn=a:b:c (a+b+c=1), is in the neighborhood of the composition of an oxide including In, Ga, and Zn at the atomic ratio, In:Ga:Zn=A:B:C (A+B+C=1)" means that a, b, and c satisfy the following relation: $(a-A)^2+(b-B)^2+(c-C)^2 \leq r^2$, and r may be 0.05, for example. The same applies to other oxides.

Note that the oxide semiconductor film 403 is in a single crystal state, a polycrystalline (also referred to as polycrystal) state, an amorphous state, or the like.

The oxide semiconductor film is preferably a c-axis aligned crystalline oxide semiconductor (CAAC-OS) film.

Figure 14:
FIG. 14 is a conceptual diagram of a CAAC-OS film.

The CAAC-OS film is not completely single crystal nor completely amorphous (see FIG. 14). The CAAC-OS film is an oxide semiconductor film with a crystal-amorphous mixed phase structure where a crystal portion and an amorphous portion are included in an amorphous phase. Note that in most cases, the crystal portion fits inside a cube whose one side is less than 100 nm. From an observation image obtained with a transmission electron microscope (TEM), a boundary between an amorphous portion and a crystal portion in the CAAC-OS film is not clear. Further, with the TEM, a grain boundary in the CAAC-OS film is not found. Thus, in the CAAC-OS film, a reduction in electron mobility due to the grain boundary is suppressed.

A CAAC-OS film is a thin film including crystals single-crystallized along the c-axis, in which an a-b plane has a mosaic pattern and a crystal grain boundary is not clear. In each of the crystal portions included in the CAAC-OS film, a c-axis is aligned in a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal portions, the directions of the a-axis and the b-axis of one crystal region may be different from those of another crystal region. In this specification, a simple term "perpendicular" includes a range from 85° to 95°. In addition, a simple term "parallel" includes a range from −5° to 5°.

In the CAAC-OS film, distribution of crystal portions is not necessarily uniform. For example, in the formation process of the CAAC-OS film, in the case where crystal growth occurs from a surface side of the oxide semiconductor film, the proportion of crystal portions in the vicinity of the surface of the oxide semiconductor film is higher than that in the vicinity of the surface where the oxide semiconductor film is formed in some cases. Further, when an impurity is added to the CAAC-OS film, the crystal portion in a region to which the impurity is added becomes amorphous in some cases.

Since the c-axes of the crystal portions included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of c-axis of the crystal portion is the direction parallel to a normal vector of the surface where the CAAC-OS film is formed or a normal vector of the surface of the CAAC-OS film. The crystal portion is formed by film formation or by performing a treatment for crystallization such as a heat treatment after film formation.

With use of the CAAC-OS film in a transistor, change in electric characteristics of the transistor due to irradiation with visible light or ultraviolet light is small. Thus, the transistor has high reliability.

Note that part of oxygen included in the oxide semiconductor film may be substituted with nitrogen.

In an oxide semiconductor having a crystal portion such as the CAAC-OS, defects in the bulk can be further reduced and when the surface flatness of the oxide semiconductor is improved, mobility higher than that of an oxide semiconductor in an amorphous state can be obtained. In order to improve the surface flatness, the oxide semiconductor is preferably formed over a flat surface. Specifically, the oxide semiconductor is preferably formed over a surface with an average surface roughness (Ra) of less than or equal to 1 nm, more preferably less than or equal to 0.3 nm, much more preferably less than or equal to 0.1 nm.

Note that an average surface roughness (Ra) is obtained by expanding arithmetic mean surface roughness, which is defined by JIS B0601: 2001 (ISO4287: 1997), into three dimensions so as to be applicable to a curved surface. Moreover, an average surface roughness (Ra) can be expressed as "the average value of the absolute values of deviations from a reference surface to a specific surface" and is defined by the following formula.

$$Ra = \frac{1}{S_0} \int_{y_1}^{y_2} \int_{x_1}^{x_2} |f(x, y) - Z_0| \, dx \, dy \quad \text{[FORMULA 1]}$$

Here, the specific surface is a surface which is a target of roughness measurement, and is a quadrilateral region which is specified by four points represented by the coordinates ($x_1$, $y_1$, $f(x_1, y_1)$), ($x_1$, $y_2$, $f(x_1, y_2)$), ($x_2$, $y_1$, $f(x_2, y_1)$), and ($x_2$, $y_2$, $f(x_2, y_2)$). The area of a rectangle which is obtained by projecting the specific surface on the xy plane is represented by $S_0$, and the height of the reference surface (the average height of the specific surface) is represented by $Z_0$. The average surface roughness Ra can be measured using an atomic force microscope (AFM).

Note that since the transistor 440 (440a, 440b, and 440c) is a bottom-gate transistor, the substrate 400, the gate electrode layer 401, and the gate insulating film 402 are located below the oxide semiconductor film. Accordingly, planarization treatment such as CMP treatment may be performed after the gate electrode layer 401 and the gate insulating film 402 are formed to obtain the above flat surface.

The oxide semiconductor film 403 has a thickness larger than or equal to 1 nm and smaller than or equal to 30 nm (preferably larger than or equal to 5 nm and smaller than or equal to 10 nm) and can be formed by a sputtering method, a molecular beam epitaxy (MBE) method, a CVD method, a pulse laser deposition method, an atomic layer deposition (ALD) method, or the like as appropriate. Alternatively, the oxide semiconductor film 403 may be formed with a sputtering apparatus where deposition is performed with surfaces of a plurality of substrates set substantially perpendicular to a surface of a sputtering target.

In addition, the oxide semiconductor film 403 is preferably a highly purified oxide semiconductor film which hardly contains impurities such as copper, aluminum, and chlorine. As a manufacturing process of the transistor, a process in which these impurities might not be contained and attached to the surface of the oxide semiconductor film is preferably selected as appropriate. When the impurity is attached to the surface of the oxide semiconductor film, it is preferable that the oxide semiconductor film be exposed to oxalic acid or dilute hydrofluoric acid, or be subjected to plasma treatment ($N_2O$ plasma treatment or the like), whereby the impurities on the surface of the oxide semiconductor film be removed. Specifically, the concentration of copper in the oxide semiconductor film is less than or equal to $1\times10^{18}$ atoms/cm$^3$, preferably less than or equal to $1\times10^{17}$ atoms/cm$^3$. The concentration of aluminum in the oxide semiconductor film is less than or equal to $1\times10^{18}$ atoms/cm$^3$. The concentration of chlorine in the oxide semiconductor film is less than or equal to $2\times10^{18}$ atoms/cm$^3$.

An example of a method for manufacturing a semiconductor device including the transistor 440a is described with reference to FIGS. 1A to 1E.

There is no particular limitation on a substrate that can be used as the substrate 400 having an insulating surface as long as it has heat resistance enough to withstand heat treatment performed later. For example, a variety of glass substrates for electronics industry, such as a barium borosilicate glass substrate or an aluminoborosilicate glass substrate can be used. Note that as the substrate, a glass substrate having a coefficient of thermal expansion which is greater than or equal to $25\times10^{-7}$/° C. and less than or equal to $50\times10^{-7}$/° C. (preferably, greater than or equal to $30\times10^{-7}$/° C. and less than or equal to $40\times10^{-7}$/° C.) and a strain point which is higher than or equal to 650° C. and lower than or equal to 750° C. (preferably, higher than or equal to 700° C. and lower than or equal to 740° C.) is preferably used.

Microfabrication is difficult because of the shrinkage of the substrate by heat treatment or the like in a process of manufacturing a semiconductor device in the case of using a large-sized glass substrate with any of the following sizes: the fifth generation (1000 mm×1200 mm or 1300 mm×1500 mm); the sixth generation (1500 mm×1800 mm); the seventh generation (1870 mm×2200 mm); the eighth generation (2200 mm×2500 mm); the ninth generation (2400 mm×2800 mm); the tenth generation (2880 mm×3130 mm); and the like.

Therefore, in the case where the above-described large-sized glass substrate is used as the substrate, a substrate with little shrinkage is preferably used. For example, as the substrate, a large-sized glass substrate whose shrinkages after heat treatment for one hour at preferably 450° C., more preferably 500° C. are less than or equal to 20 ppm, preferably less than or equal to 10 ppm, more preferably less than or equal to 5 ppm may be used.

Alternatively, as the substrate 400, a ceramic substrate, a quartz substrate, a sapphire substrate, or the like can be used. Alternatively, a single crystal semiconductor substrate or a polycrystalline semiconductor substrate made of silicon or silicon carbide, a compound semiconductor substrate made of silicon germanium or the like, an SOI substrate, or the like can be used. Any of these substrates over which a semiconductor element is provided may be used.

The semiconductor device may be manufactured using a flexible substrate as the substrate 400. To manufacture a flexible semiconductor device, the transistor 440a including the oxide semiconductor film 403 may be directly formed over a flexible substrate; or alternatively, the transistor 440a including the oxide semiconductor film 403 may be formed over a substrate, and then may be separated and transferred to a flexible substrate. Note that in order to separate the transistor 440a including the oxide semiconductor film from the manufacturing substrate and transfer it to the flexible substrate, a separation layer may be provided between the manufacturing substrate and the transistor 440a.

As a base film, an insulating film may be provided over the substrate 400. The insulating film can be formed by a plasma CVD method, a sputtering method, or the like using an oxide insulating film such as silicon oxide, silicon oxynitride, aluminum oxide, aluminum oxynitride, hafnium oxide, gallium oxide, or the like; a nitride insulating film such as silicon nitride, silicon nitride oxide, an aluminum nitride, aluminum nitride oxide, or the like; or a mixed material thereof.

The substrate 400 (or the substrate 400 and the base film) may be subjected to heat treatment. For example, the heat treatment may be performed with a gas rapid thermal annealing (GRTA) apparatus, in which heat treatment is performed using a high-temperature gas, at 650° C. for 1 minute to 5 minutes. As the high-temperature gas for GRTA, an inert gas which does not react with an object to be processed by heat treatment, such as nitrogen or a rare gas like argon, is used. Alternatively, the heat treatment may be performed with an electric furnace at 500° C. for 30 minutes to one hour.

Then, a conductive film is formed over the substrate 400 and etched to form the gate electrode layer 401. Note that the etching of the conductive film may be performed using either dry etching or wet etching, or using both dry etching and wet etching.

The gate electrode layer 401 can be formed using a metal material such as molybdenum, titanium, tantalum, tungsten, aluminum, copper, chromium, neodymium, or scandium or an alloy material which contains any of these materials as its main component. A semiconductor film which is doped with an impurity element such as phosphorus and is typified by a polycrystalline silicon film, or a silicide film of nickel silicide or the like can also be used as the gate electrode layer 401. The gate electrode layer 401 has either a single-layer structure or a stacked-layer structure.

The gate electrode layer 401 can also be formed using a conductive material such as indium oxide-tin oxide, indium oxide containing tungsten oxide, indium zinc oxide containing tungsten oxide, indium oxide containing titanium oxide, indium tin oxide containing titanium oxide, indium oxide-zinc oxide, or indium tin oxide to which silicon oxide is added. It is also possible that the gate electrode layer 401 has a stacked structure of the above conductive material and the above metal material.

As the gate electrode layer 401, a metal oxide containing nitrogen, specifically, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a metal nitride (e.g., InN or SnN) film can be used. These films each have a work function of 5 eV or higher, preferably 5.5 eV or higher, which enables the threshold voltage of the transistor to take a positive value when used as the gate electrode layer, so that a switching element of what is called normally-off type can be realized.

In this embodiment, a 100-nm-thick tungsten film is formed by a sputtering method.

After the formation of the gate electrode layer 401, the substrate 400 and the gate electrode layer 401 may be subjected to heat treatment. For example, the heat treatment may be performed with a GRTA apparatus at 650° C. for 1 minute to 5 minutes. Alternatively, the heat treatment may be performed with an electric furnace at 500° C. for 30 minutes to one hour.

Figure 1A:
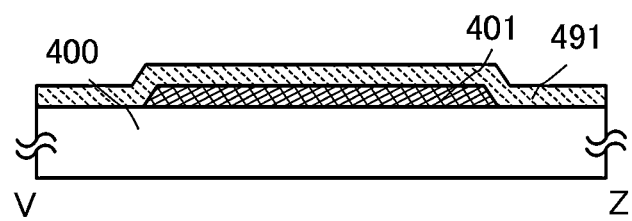
FIGS. 1A to 1E are cross-sectional views illustrating one embodiment of a method for manufacturing a semiconductor device.

Next, the gate insulating film 491 is formed over the gate electrode layer 401 (see FIG. 1A).

To improve the coverage with the gate insulating film 491, planarization treatment may be performed on a surface of the gate electrode layer 401. It is preferable that the flatness of the surface of the gate electrode layer 401 is good particularly when the thickness of the gate insulating film 491 is small.

The thickness of the gate insulating film 491 is set to be greater than or equal to 1 nm and less than or equal to 300 nm, and a CVD method using a deposition gas can be used. As a CVD method, an LPCVD method, a plasma CVD method, or the like can be used, and as another method, a coating film or the like can also be used.

As a material of the gate insulating film 491, a silicon oxide film, a gallium oxide film, an aluminum oxide film, a silicon nitride film, a silicon oxynitride film, an aluminum oxynitride film, or a silicon nitride oxide film can be used.

When the gate insulating film 491 is formed using a high-k material such as hafnium oxide, yttrium oxide, hafnium silicate ($HfSi_xO_y$ (x>0, y>0)), hafnium silicate ($HfSi_xO_y$ (x>0, y>0)) to which nitrogen is added, hafnium aluminate ($HfAl_xO_y$ (x>0, y>0)), or lanthanum oxide, gate leakage current can be reduced. Further, the gate insulating film 491 may have either a single-layer structure or a stacked-layer structure.

In this embodiment, a silicon oxynitride film having a thickness of 200 nm is formed as the gate insulating film 491 by a plasma CVD method. The conditions for forming the gate insulating film 491 can be as follows: gas flow rate of $SiH_4$ and $N_2O$ is $SiH_4$:$N_2O$=4 sccm: 800 sccm; a pressure is 40 Pa, a power of the RF power supply (power supply output) is 50 W, and a substrate temperature is 350° C.

Dehydration or dehydrogenation treatment is performed on the gate insulating film 491 by heat treatment.

In this embodiment, even if a gas containing hydrogen is used as a deposition gas of the gate insulating film 491, dehydrogenation treatment is performed on the gate insulating film 491, so that hydrogen in the gate insulating film 491 can be removed. Thus, a plasma CVD method can be preferably used. A plasma CVD method, which enables the film to be formed thick, is advantageous in productivity because attachment or entry of dust or the like into a film at the film formation unlikely occur and the film can be formed at relatively high deposition rate.

The temperature of the heat treatment is higher than or equal to 300° C. and lower than or equal to 700° C., or lower than the strain point of the substrate. The temperature of the heat treatment is preferably higher than the film formation temperature of the gate insulating film 491, because effect of dehydration or dehydrogenation is high. For example, after the substrate is put in an electric furnace which is a kind of heat treatment apparatus, the gate insulating film 491 is subjected to the heat treatment at 450° C. for one hour in vacuum.

Note that the heat treatment apparatus is not limited to the electric furnace and an apparatus for heating an object by heat conduction or heat radiation from a heater such as a resistance heater may be used. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high-temperature gas. As the high temperature gas, an inert gas which does not react with an object by heat treatment, such as nitrogen or a rare gas like argon, is used.

For example, as the heat treatment, GRTA may be performed as follows. The substrate is put in an inert gas heated at high temperatures of 650° C. to 700° C., heated for several minutes, and taken out of the inert gas.

The heat treatment may be performed under reduced pressure (vacuum), in a nitrogen atmosphere, or in a rare gas atmosphere. It is preferable that water, hydrogen, and the like be not contained in the atmosphere of nitrogen, a rare gas, or the like. It is also preferable that the purity of nitrogen or a rare gas which is introduced into a heat treatment apparatus be set to be higher than or equal to 6N (99.9999%), preferably higher than or equal to 7N (99.99999%) (that is, the impurity concentration is lower than or equal to 1 ppm, preferably lower than or equal to 0.1 ppm).

Figure 1B:
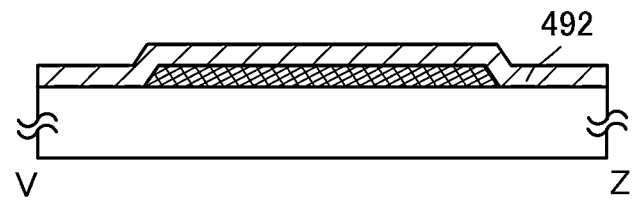

With the heat treatment, dehydration or dehydrogenation can be performed on the gate insulating film 491, so that a gate insulating film 492 from which impurities such as hydrogen and water causing variation in the characteristics of the transistor are removed can be formed (see FIG. 1B).

In the heat treatment where dehydration or dehydrogenation treatment is performed, it is preferable that a surface of the gate insulating film 491 be not in a state where hydrogen, water, or the like is prevented from being released (for example, by providing a film or the like which is not permeable to (or blocks) hydrogen, water, or the like), but in a state where the surface of the gate insulating film 491 is exposed.

The heat treatment for dehydration or dehydrogenation may be performed plural times, and may also serve as another heat treatment.

Figure 1C:
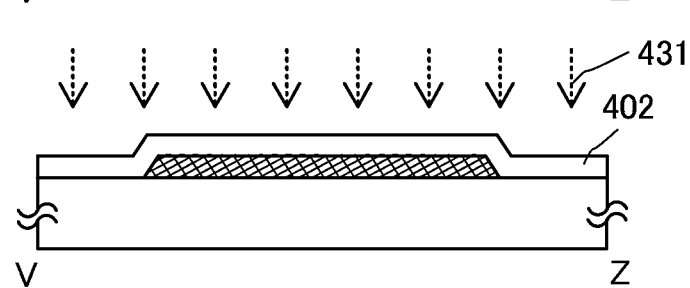

Next, oxygen doping treatment is performed on the gate insulating film 492 which is dehydrated or dehydrogenated, whereby a gate insulating film 402 containing excessive oxygen is formed (see FIG. 1C). The oxygen doping treatment is performed on the gate insulating film 492 and oxygen 431 is supplied to the gate insulating film 492, whereby oxygen is contained in the gate insulating film 492 or in the gate insulating film 492 and the vicinity of the interface between the gate insulating film 492 and an oxide semiconductor film 441 which is to be formed over the gate insulating film 402 in a later step.

The gate insulating film 402 preferably contains a large amount of oxygen which exceeds at least the stoichiometric ratio in (a bulk of) the film.

For the doped oxygen 431 (an oxygen radical, an oxygen atom, an oxygen molecule, ozone, an oxygen ion (an oxygen molecule ion) and/or an oxygen cluster ion), ion implantation method, ion doping method, plasma immersion ion implantation method, plasma treatment, or the like can be used. Further, a gas cluster ion beam may be used for ion implantation method. Oxygen doping treatment may be performed on the whole surface at a time, or may be performed using and moving (scanning) a linear ion beam or the like.

For example, oxygen for the doping (an oxygen radical, an oxygen atom, an oxygen molecule, ozone, an oxygen ion (an oxygen molecule ion) and/or an oxygen cluster ion) 431 may be supplied from a plasma generating apparatus with use of a gas containing oxygen or from an ozone generating apparatus. More specifically, for example, the oxygen 431 can be generated with an apparatus for etching treatment on a semiconductor device, an apparatus for ashing on a resist mask, or the like to process the gate insulating film 491 and form the gate insulating film 402.

A gas containing oxygen can be used for oxygen doping treatment. As a gas containing oxygen, oxygen, dinitrogen monoxide, nitrogen dioxide, carbon dioxide, carbon monoxide, or the like can be used. Alternatively, a rare gas can be used for oxygen doping treatment.

In doping treatment of the oxygen 431, for example, in the case where an oxygen ion is implanted by an ion implantation method, the dosage may be set to be greater than or equal to $1\times10^{13}$ ions/cm$^2$ and less than or equal to $5\times10^{16}$ ions/cm$^2$.

Further, by the oxygen doping treatment, planarity of the surface of the gate insulating film 402 can be improved.

Figure 1D:
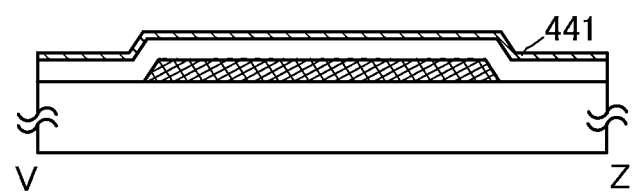

Next, the film-like oxide semiconductor film 441 is formed over the gate insulating film 402 (see FIG. 1D). Note that in this embodiment, the oxide semiconductor film 441 is a film-shaped oxide semiconductor film and the oxide semiconductor film 403 included in the manufactured transistor 440$a$ is an island-shaped oxide semiconductor film.

Planarization treatment may be performed on a region of the gate insulating film 402 which is in contact with the oxide semiconductor film 441. The planarization treatment may be, but not particularly limited to, a polishing treatment (such as chemical mechanical polishing (CMP)), a dry etching treatment, or a plasma treatment. Moreover, the above-described oxygen doping treatment can also serve as the planarization treatment of the gate insulating film 402.

As the plasma treatment, for example, reverse sputtering in which an argon gas is introduced and plasma is generated can be performed. The reverse sputtering is a method in which voltage is applied to a substrate side with the use of an RF power source in an argon atmosphere and plasma is generated in the vicinity of the substrate so that a surface is modified. Note that, instead of an argon atmosphere, a nitrogen atmosphere, a helium atmosphere, an oxygen atmosphere, or the like may be used. The reverse sputtering can remove particle substances (also referred to as particles or dust) attached to the surface of the gate insulating film 402.

As the planarization treatment, polishing treatment, dry etching treatment, or plasma treatment may be performed plural times, or these treatments may be performed in combination. In the case where the treatments are combined, the order of steps is not particularly limited and may be set as appropriate in accordance with the roughness of the surface of the gate insulating film 402.

The oxide semiconductor film 441 is preferably formed under a condition such that much oxygen is contained (e.g., by a sputtering method in a 100% oxygen atmosphere) so as to be a film containing much oxygen (preferably a film including a region where oxygen is contained in excess of that in the stoichiometric composition of the oxide semiconductor in a crystalline state).

In this embodiment, a 35-nm-thick In—Ga—Zn-based oxide film (IGZO film) is formed as the oxide semiconductor film 441 by a sputtering method using a sputtering apparatus including an AC power supply device. In this embodiment, an In—Ga—Zn-based oxide target having an atomic ratio of In:Ga:Zn=1:1:1 (=1/3:1/3:1/3) is used. Note that the film formation condition is as follows: the atmosphere is an atmosphere of oxygen and argon (oxygen flow rate: 50%), the pressure is 0.6 Pa, the power of the power source is 5 kW, and the substrate temperature is 170° C. The deposition rate under the film formation condition is 16 nm/min.

It is preferable that a high-purity gas from which impurities such as hydrogen, water, a hydroxyl group, and hydride are removed be used as a sputtering gas for the formation of the oxide semiconductor film 441.

The substrate is held in a deposition chamber kept under reduced pressure. Then a sputtering gas from which hydrogen and moisture are removed is introduced while moisture remaining in the deposition chamber is removed, and the oxide semiconductor film 441 is formed over the substrate 400 with the use of the above target. In order to remove moisture remaining in the deposition chamber, an entrapment vacuum pump such as a cryopump, an ion pump, or a titanium sublimation pump is preferably used. As an evacuation unit, a turbo molecular pump provided with a cold trap may be used. From the deposition chamber which is evacuated with a cryopump, a hydrogen, (a hydrogen atom) a compound containing a hydrogen (a hydrogen atom), such as water ($H_2O$), (preferably also a compound containing a carbon atom), and the like are removed, whereby the concentration of an impurity in the oxide semiconductor film 441 formed in the deposition chamber can be reduced.

The gate insulating film 402 which is in contact with the oxide semiconductor film 403 can supply oxygen to the oxide semiconductor film 403 because much (excess) oxygen that serves as a source of the oxygen is contained therein.

The oxide semiconductor film 403 is preferably subjected to heat treatment while being in contact with the gate insulating film 402. With the heat treatment, oxygen can be supplied effectively from the gate insulating film 402 to the oxide semiconductor film 403.

Note that the heat treatment for supplying oxygen from the gate insulating film 402 to the oxide semiconductor film 403 is preferably performed before the oxide semiconductor film 441 is processed into an island shape, in which case release of oxygen contained in the gate insulating film 402 by the heat treatment can be prevented.

By supply of oxygen to the oxide semiconductor film 403, oxygen vacancies in the oxide semiconductor film 403 can be repaired.

The oxide semiconductor film 441 is processed into an island-shaped oxide semiconductor film 403 by a photolithography step.

A resist mask for forming the island-shaped oxide semiconductor film 403 may be formed by an inkjet method. Formation of the resist mask by an inkjet method needs no photomask; thus, manufacturing cost can be reduced.

Note that the etching of the oxide semiconductor film 441 may be dry etching, wet etching, or both dry etching and wet etching. As an etchant used for wet etching of the oxide semiconductor film 441, for example, a mixed solution of phosphoric acid, acetic acid, and nitric acid can be used. Alternatively, ITO-07N (produced by KANTO CHEMICAL CO., INC.) may be used. It is also possible to employ dry etching using an inductively coupled plasma (ICP) etching method.

Next, a conductive film to be the source electrode layer and the drain electrode layer (including a wiring formed in the same layer as the source electrode layer and the drain electrode layer) is formed over the gate electrode layer 401, the gate insulating film 402, and the oxide semiconductor film 403.

The conductive film is formed using a material that can withstand a heat treatment in a later step. As the conductive film used for the source electrode layer and the drain electrode layer, it is possible to use, for example, a metal film containing an element selected from Al, Cr, Cu, Ta, Ti, Mo, and W, a metal nitride film containing any of these elements as its component (e.g., a titanium nitride film, a molybdenum nitride film, or a tungsten nitride film), or the like. A metal film having a high melting point such as Ti, Mo, W, or the like or a metal nitride film of any of these elements (e.g., a titanium nitride film, a molybdenum nitride film, or a tungsten nitride film) may be stacked on one of or both of a lower side and an upper side of a metal film of Al, Cu, or the like. Alternatively, the conductive film used for the source electrode layer and the drain electrode layer may be formed using a conductive metal oxide. As the conductive metal oxide, indium oxide ($In_2O_3$), tin oxide ($SnO_2$), zinc oxide (ZnO), indium oxide-tin oxide ($In_2O_3$—$SnO_2$), indium oxide-zinc oxide ($In_2O_3$—ZnO), or any of these metal oxide materials in which silicon oxide is contained can be used.

Through a photolithography process, a resist mask is formed over the conductive film, and the source electrode layer 405a and the drain electrode layer 405b are formed by selective etching. After the source electrode layer 405a and the drain electrode layer 405b are formed, the resist mask is removed.

Ultraviolet, KrF laser light, ArF laser light, or the like can be used for light exposure at the time of forming a resist mask. The channel length L of the transistor 440 that is to be completed later is determined by a distance between bottom edges of the source electrode layer 405a and the drain electrode layer 405b which are adjacent to each other over the oxide semiconductor film 403. In the case where the channel length L is less than 25 nm, the light exposure at the time of forming the resist mask can be performed using extreme ultraviolet having an extremely short wavelength of several nanometers to several tens of nanometers. In the light exposure by extreme ultraviolet light, the resolution is high and the focus depth is large. Therefore, the channel length L of the transistor that is to be completed later can be greater than or equal to 10 nm and less than or equal to 1000 nm, which enables high operation speed of a circuit.

In order to reduce the number of photomasks used in the photolithography process and reduce the number of photolithography processes, an etching step may be performed with the use of a multi-tone mask which is a light-exposure mask through which light is transmitted to have a plurality of intensities. A resist mask formed with the use of a multi-tone mask has a plurality of thicknesses and further can be changed in shape by etching; therefore, the resist mask can be used in a plurality of etching steps for processing into different patterns. Therefore, a resist mask corresponding to at least two kinds of different patterns can be formed by one multi-tone mask. Thus, the number of light-exposure masks can be reduced and the number of corresponding photolithography processes can also be reduced, whereby the process can be simplified.

In this embodiment, the conductive film can be etched using a gas containing chlorine, for example, a gas containing chlorine ($Cl_2$), boron trichloride ($BCl_3$), silicon tetrachloride ($SiCl_4$), or carbon tetrachloride ($CCl_4$). Alternatively, a gas containing fluorine, for example, a gas containing carbon tetrafluoride ($CF_4$), sulfur hexafluoride ($SF_6$), nitrogen trifluoride ($NF_3$), or trifluoromethane ($CHF_3$) can be used. Alternatively, any of these gases to which a rare gas such as helium (He) or argon (Ar) is added, or the like can be used.

As the etching method, a parallel plate reactive ion etching (RIE) method or an inductively coupled plasma (ICP) etching method can be used. In order to etch the films into desired shapes, the etching condition (the amount of electric power applied to a coil-shaped electrode, the amount of electric power applied to an electrode on a substrate side, the temperature of the electrode on the substrate side, or the like) is adjusted as appropriate.

In this embodiment, as the conductive film, a stack of a titanium film with a thickness of 100 nm, an aluminum film with a thickness of 400 nm, and a titanium film with a thickness of 100 nm which are formed by a sputtering method is used. As the etching of the conductive film, the stack of the titanium film, the aluminum film, and the titanium film is etched by a dry etching method, and the source electrode layer 405a and the drain electrode layer 405b are formed.

In this embodiment, the upper titanium film and the aluminum film are etched under first etching conditions and then the lower titanium film is etched under second etching conditions. The first etching conditions are as follows: etching gas, $BCl_3:Cl_2=750$ sccm: 150 sccm; bias power, 1500 W; ICP power, 0 W; and pressure, 2.0 Pa. The second etching conditions are as follows: etching gas, $BCl_3:Cl_2=700$ sccm: 100 sccm; bias power, 750 W; ICP power, 0 W; and pressure, 2.0 Pa.

Note that it is preferable that etching conditions be optimized so as not to etch and divide the oxide semiconductor film 403 when the conductive film is etched. However, it is difficult to obtain etching conditions under which only the conductive film is etched and the oxide semiconductor film 403 is not etched at all. In some cases, part of the oxide semiconductor film 403 is etched off through the etching of the conductive film, so that an oxide semiconductor film having a groove (depressed portion) is formed. Further, in the oxide semiconductor film 403, a portion near an interface in contact with the source electrode layer 405a and the drain electrode layer 405b may have higher conductivity than the other portions. In that case, the portion having high conductivity near the source electrode layer 405a may be referred to as a source, and the portion having high conductivity near the drain electrode layer 405b may be referred to as a drain.

Through the above-described process, the transistor 440a of this embodiment is formed.

Figure 1E:
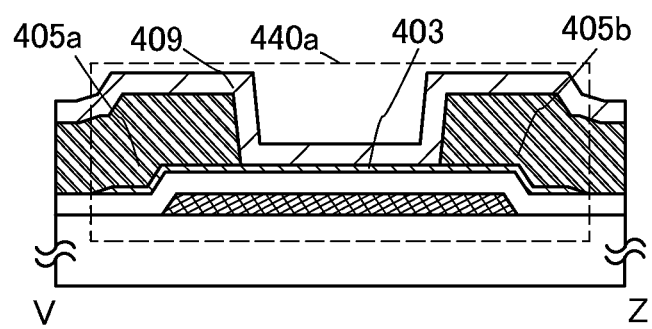

In this embodiment, the insulating film 409 is formed over the source electrode layer 405a and the drain electrode layer 405b and in contact with the oxide semiconductor film 403 (see FIG. 1E).

As the insulating film 409, a single layer or a stack of one or more inorganic insulating films, typical examples of which are a silicon oxide film, a silicon oxynitride film, an aluminum oxide film, an aluminum oxynitride film, a hafnium oxide film, a gallium oxide film, a silicon nitride film, an aluminum nitride film, a silicon nitride oxide film, and an aluminum nitride oxide film, can be used.

Alternatively, a dense inorganic insulating film may be provided over the insulating film 409. For example, an aluminum oxide film is formed over the insulating film 409 by a sputtering method. Providing an aluminum oxide film having high density (film density: 3.2 $g/cm^3$ or higher, preferably 3.6 $g/cm^3$ or higher) can stabilize the electric characteristics of the transistor 440a. The film density can be measured by Rutherford backscattering spectrometry (RBS) or X-ray reflection (XRR).

The aluminum oxide film which can be used as the insulating film provided over the transistor 440a has a high shielding effect (blocking effect) of preventing penetration of both oxygen and an impurity such as hydrogen or moisture through the film.

Therefore, during the manufacturing process and after the manufacture, the aluminum oxide film functions as a protective film for preventing entry of an impurity such as hydrogen or moisture which might cause variation in characteristics into the oxide semiconductor film 403, and release of oxygen which is a main component material of the oxide semiconductor from the oxide semiconductor film 403.

Further, a planarization insulating film may be formed thereover in order to reduce surface roughness due to the transistor 440a. As the planarization insulating film, an organic material such as polyimide, acrylic, or a benzocyclobutene-based resin can be used. Other than such organic materials, it is also possible to use a low dielectric constant material (low-k material) or the like. Note that the planarization insulating film may be formed by stacking a plurality of insulating films formed from these materials.

For example, an acrylic resin film with a thickness of 1500 nm is formed as the planarization insulating film. The acrylic resin film can be formed by a coating method and then baking (e.g., at 250° C. in a nitrogen atmosphere for one hour) is performed.

A heat treatment may be performed after the planarization insulating film is formed. For example, the heat treatment is performed at 250° C. in a nitrogen atmosphere for one hour.

As described above, a heat treatment may be performed after the transistor 440a is formed. The heat treatment may be performed more than once.

The transistor 440a in which the gate insulating film 402 which is in contact with the oxide semiconductor film 403 is subjected to dehydration or dehydrogenation treatment by heat treatment and oxygen doping treatment after the dehydration or dehydrogenation treatment has less change in electric characteristics and is thus electrically stable.

Accordingly, the transistor 440a having stable electric characteristics can be manufactured.

In addition, according to one embodiment of the present invention, a semiconductor device having the transistor 440a with high electric characteristics and reliability can be manufactured.

(Embodiment 2)

In this embodiment, another embodiment of a semiconductor device and a method for manufacturing the semiconductor device is described with reference to FIGS. 2A to 2D. The same portion as or a portion having a function similar to those in the above embodiment can be formed in a manner similar to that described in the above embodiment, and also the steps similar to those in the above embodiment can be performed in a manner similar to that described in the above embodiment, and repetitive description is omitted. In addition, detailed description of the same portions is not repeated.

In this embodiment, the transistor 440b which is manufactured by performing dehydration or dehydrogenation treatment by heat treatment and then oxygen doping treatment on an insulating film which is provided over and in contact with the oxide semiconductor film is described as an example.

An example of a method for manufacturing a semiconductor device including the transistor 440b is described with reference to FIGS. 2A to 2D.

A conductive film is formed over the substrate 400 having an insulating surface and is etched into the gate electrode layer 401. In this embodiment, a tungsten film with a thickness of 100 nm is formed by a sputtering method.

Next, the gate insulating film 408 is formed over the gate electrode layer 401. A material, a thickness, and the like of the gate insulating film 408 can be similar to those of the gate insulating film in Embodiment 1.

After an oxide semiconductor film is formed over the gate insulating film 408, the oxide semiconductor film is processed into an island shape and an oxide semiconductor film 403 is formed. In this embodiment, a 35-nm-thick In—Ga—Zn-based oxide film (IGZO film) is formed as the oxide semiconductor film 403 by a sputtering method using a sputtering apparatus including an AC power supply device. In this embodiment, an In—Ga—Zn-based oxide target with an atomic ratio of In:Ga:Zn=1:1:1 (=1/3:1/3:1/3) is used. The deposition conditions are as follows: the atmosphere is oxygen and argon (the flow rate of oxygen: 50%), the pressure is 0.6 Pa, the power supply is 5 kW, and the substrate temperature is 170° C. The deposition rate under these deposition conditions is 16 nm/min.

Note that it is preferable to form the gate insulating film 408 and the oxide semiconductor film in succession so as not to expose the gate insulating film 408 to the air. Forming the gate insulating film 408 and the oxide semiconductor film in succession so as not to expose the gate insulating film 408 to the air can prevent impurities such as hydrogen and moisture from being adsorbed to the surface of the gate insulating film 408.

Heat treatment may be performed on the oxide semiconductor film 403 in order to remove (perform dehydration or dehydrogenation treatment) excess hydrogen (including water and a hydroxyl group). For example, the substrate is introduced into an electric furnace which is one kind of heat treatment apparatuses, and the oxide semiconductor film 403 may be subjected to heat treatment at 450° C. in a nitrogen atmosphere for one hour and then heat treatment at 450° C. in an atmosphere including nitrogen and oxygen for one hour. The oxide semiconductor film 403 is subjected to the dehydration or dehydrogenation treatment and then to heat treatment under an atmosphere including oxide, whereby the oxide semiconductor film 403 can be highly purified.

Next, a conductive film to be processed into a source electrode layer and a drain electrode layer is formed over the gate electrode layer 401, the gate insulating film 402, and the oxide semiconductor film 403.

In this embodiment, as the conductive film, a stack of a titanium film with a thickness of 100 nm, an aluminum film with a thickness of 400 nm, and a titanium film with a thickness of 100 nm which are formed by a sputtering method is used. As the etching of the conductive film, the stack of the titanium film, the aluminum film, and the titanium film is etched by a dry etching method, and the source electrode layer 405a and the drain electrode layer 405b are formed.

In this embodiment, two layers of the titanium film and the aluminum film are etched under a first etching condition, and then the other titanium film is removed singly under a second etching condition. Note that the first etching condition is as follows: an etching gas ($BCl_3$:$Cl_2$=750 sccm: 150 sccm) is used, the bias power is 1500 W, the ICP power supply is 0 W, and the pressure is 2.0 Pa. The second etching condition is as follows: an etching gas ($BCl_3$:$Cl_2$=700 sccm: 100 sccm) is used, the bias power is 750 W, the ICP power supply is 0 W, and the pressure is 2.0 Pa.

Figure 2A:
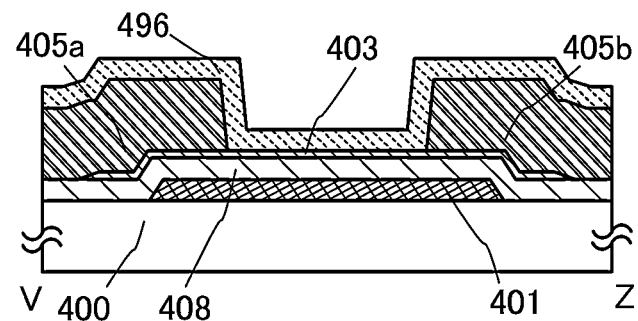
FIGS. 2A to 2D are cross-sectional views illustrating one embodiment of a method for manufacturing a semiconductor device.

An insulating film 496 is formed in contact with the oxide semiconductor film 403 over the source electrode layer 405a and the drain electrode layer 405b (see FIG. 2A).

As the insulating film 496, a single layer or a stack of one or more inorganic insulating films, typical examples of which are a silicon oxide film, a silicon oxynitride film, an aluminum oxide film, an aluminum oxynitride film, a hafnium oxide film, a gallium oxide film, a silicon nitride film, an aluminum nitride film, a silicon nitride oxide film, and an aluminum nitride oxide film, can be used.

As a method for forming the insulating film 496, a CVD method using a deposition gas can be used. As a CVD method, an LPCVD method, a plasma CVD method, or the like can be used, and as another method, a coating film or the like can also be used.

In this embodiment, a silicon oxynitride film having a thickness of 300 nm is formed as the insulating film 496 by a plasma CVD method. The conditions for forming the insulating film 496 can be as follows: gas flow rate of $SiH_4$ and $N_2O$ is $SiH_4$:$N_2O$=4 sccm: 800 sccm; a pressure is 40 Pa, a power of the RF power supply (power supply output) is 50 W, and a substrate temperature is 350° C.

Dehydration or dehydrogenation treatment is performed on the insulating film 496 by heat treatment.

In this embodiment, even if a gas containing hydrogen is used as a deposition gas of the insulating film 496, dehydrogenation treatment is performed on the insulating film 496, so that hydrogen in the insulating film 496 can be removed. Thus, a plasma CVD method can be preferably used. A plasma CVD method, which enables the film to be formed thick, is advantageous in productivity because attachment or entry of dust or the like into a film at the film formation unlikely occur and the film can be formed at relatively high deposition rate.

The temperature of the heat treatment is higher than or equal to 300° C. and lower than or equal to 700° C., or lower than the strain point of the substrate. The temperature of the heat treatment is preferably higher than the film formation temperature of the insulating film 496, because effect of dehydration or dehydrogenation is high. For example, after the substrate is put in an electric furnace which is a kind of heat treatment apparatus, the insulating film 496 is subjected to the heat treatment at 450° C. for one hour in vacuum.

Note that the heat treatment apparatus is not limited to an electric furnace, and an apparatus for heating an object to be processed by heat conduction or heat radiation from a heating element such as a resistance heating element may be used. For example, a rapid thermal annealing (RTA) apparatus such as a gas rapid thermal annealing (GRTA) apparatus or a lamp rapid thermal annealing (LRTA) apparatus can be used. The LRTA apparatus is an apparatus for heating an object to be processed by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. In the GRTA apparatus, a heat treatment is performed using a high-temperature gas. As the high-temperature gas, an inert gas which does not react by a heat treatment with an object to be processed, such as nitrogen or a rare gas like argon, is used.

For example, as the heat treatment, GRTA may be performed as follows. The substrate is put in an inert gas heated at high temperatures of 650° C. to 700° C., heated for several minutes, and taken out of the inert gas.

The heat treatment may be performed under reduced pressure, in a nitrogen atmosphere, or in a rare gas atmosphere. It is preferable that water, hydrogen, and the like be not contained in the atmosphere of nitrogen, a rare gas, or the like. It is also preferable that the purity of nitrogen or a rare gas which is introduced into a heat treatment apparatus be set to be higher than or equal to 6N (99.9999%), preferably higher than or equal to 7N (99.99999%) (that is, the impurity concentration is lower than or equal to 1 ppm, preferably lower than or equal to 0.1 ppm).

Figure 2B:
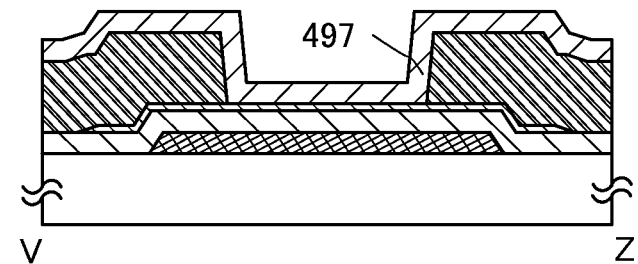

With the heat treatment, dehydration or dehydrogenation can be performed on the insulating film 496, so that an insulating film 497 from which impurities such as hydrogen and water are removed can be formed (see FIG. 2B).

In the heat treatment where dehydration or dehydrogenation treatment is performed, it is preferable that a surface of the insulating film 496 be not in a state where hydrogen, water, or the like is prevented from being released (for example, by providing a film or the like which is not permeable to (or blocks) hydrogen, water, or the like), but in a state where the surface of the insulating film 496 is exposed.

The heat treatment for dehydration or dehydrogenation may be performed plural times, and may also serve as another heat treatment.

By performing the heat treatment for dehydration or dehydrogenation, impurities contained in the insulating film 497, such as water or hydrogen, can be removed from the insulating film 497 and reduced. When hydrogen is contained in the insulating film 497, entry of the hydrogen into the oxide semiconductor film 403 or extraction of oxygen from the oxide semiconductor film 403 by the hydrogen may occur; thus, the backchannel of the oxide semiconductor film 403 might have lower resistance (n-type conductivity) and a parasitic channel might be formed. Therefore, by performing the heat treatment for dehydration or dehydrogenation, the insulating film 497 contains hydrogen as little as possible, so that the transistor 440b has less change in electric characteristics and has stable electric characteristics.

Figure 2C:
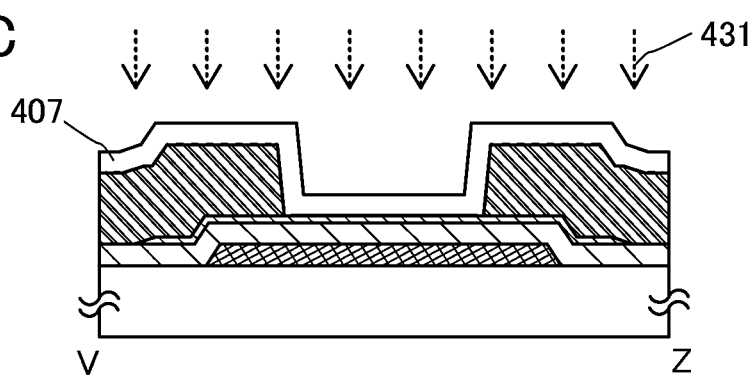

Next, oxygen doping treatment is performed on the insulating film 497 which is dehydrated or dehydrogenated, whereby an insulating film 407 containing excessive oxygen is formed (see FIG. 2C). The oxygen doping treatment is performed on the insulating film 497 and oxygen 431 is supplied to the insulating film 497, whereby oxygen is contained in the insulating film 497 or in the insulating film 497 and the vicinity of the interface between the insulating film 497 and the oxide semiconductor film 403.

The insulating film 407 preferably contains a large amount of oxygen which exceeds at least the stoichiometric ratio in (a bulk of) the film.

For the doped oxygen 431 (an oxygen radical, an oxygen atom, an oxygen molecule, ozone, an oxygen ion (an oxygen molecule ion) and/or an oxygen cluster ion), ion implantation method, ion doping method, plasma immersion ion implantation method, plasma treatment, or the like can be used. Further, a gas cluster ion beam may be used for ion implantation method. Oxygen doping treatment may be performed on the whole surface at a time, or may be performed using and moving (scanning) a linear ion beam or the like.

For example, oxygen for the doping (an oxygen radical, an oxygen atom, an oxygen molecule, an oxygen ion (an oxygen molecule ion) and/or an oxygen cluster ion) 431 may be supplied from a plasma generating apparatus with use of a gas containing oxygen or from an ozone generating apparatus. More specifically, for example, the oxygen 431 can be generated with an apparatus for etching treatment on a semiconductor device, an apparatus for ashing on a resist mask, or the like to process the insulating film 497 and form the insulating film 407.

A gas containing oxygen can be used for oxygen doping treatment. As a gas containing oxygen, oxygen, dinitrogen monoxide, nitrogen dioxide, carbon dioxide, carbon monoxide, or the like can be used. Alternatively, a rare gas can be used for oxygen doping treatment.

In doping treatment of the oxygen 431, for example, in the case where an oxygen ion is implanted by an ion implantation method, the dosage may be set to be greater than or equal to $1 \times 10^{13}$ ions/cm$^2$ and less than or equal to $5 \times 10^{16}$ ions/cm$^2$.

The insulating film 407 contains much (excess) oxygen by oxygen doping treatment (it is preferable that the insulating film 407 include a region containing oxygen in excess of that in the stoichiometric composition in a crystalline state); therefore, the insulating film 407 can suitably serve as a source of oxygen to be supplied to the oxide semiconductor film 403.

The oxide semiconductor film 403 is preferably subjected to heat treatment in a state in which part of the oxide semiconductor film 403 (a channel formation region) is in contact with the insulating film 407. By performing the heat treatment, oxygen can be supplied to the oxide semiconductor film 403 from the insulating film 407 effectively.

In this embodiment, oxygen which is added to the dehydrated or dehydrogenated oxide semiconductor film 403 to supply oxygen to the film can highly purify the oxide semiconductor film 403 and make the film an electrically i-type (intrinsic).

The temperature of the heat treatment is 250° C. to 700° C. inclusive, preferably 400° C. to 700° C. inclusive, or is lower than the strain point of the substrate. For example, the substrate is introduced into an electric furnace which is one of heat treatment apparatuses, and the heat treatment is performed on the oxide semiconductor film at 250° C. for one hour in a nitrogen atmosphere.

For the heat treatment, a heating method and a heating apparatus similar to those for the heat treatment where a dehydration or dehydrogenation treatment is performed on the insulating film 407 can be employed.

The heat treatment may be performed under reduced pressure, in a nitrogen atmosphere, in an oxygen atmosphere, in ultra-dry air (air in which the moisture amount is less than or equal to 20 ppm (−55° C. by conversion into a dew point), preferably less than or equal to 1 ppm, more preferably less than or equal to 10 ppb, in the measurement with the use of a dew point meter in the cavity ring down laser spectroscopy (CRDS) system), or in a rare gas (argon, helium, or the like) atmosphere. It is preferable that water, hydrogen, and the like be not contained in the nitrogen atmosphere, in the oxygen atmosphere, in the ultra-dry air, in the rare gas atmosphere, or the like. It is also preferable that the purity of nitrogen, oxygen, or the rare gas which is introduced into a heat treatment apparatus be set to higher than or equal to 6N (99.9999%), preferably higher than or equal to 7N (99.99999%) (that is, the impurity concentration is lower than or equal to 1 ppm, preferably lower than or equal to 0.1 ppm).

The oxide semiconductor film 403 and the insulating film 407 including excessive oxygen are in contact with each other when the heat treatment is performed; thus, oxygen which is one of the main components of the oxide semiconductor film 403 can be supplied from the insulating film 407 including oxygen to the oxide semiconductor film 403.

Further, the above heat treatment is preferably performed after the highly dense inorganic insulating film is provided over the insulating film 407. For example, an aluminum oxide film is formed over the insulating film 407 by a sputtering method.

An aluminum oxide film which can be used as an insulating film provided over the insulating film 407 has a high shielding effect (blocking effect) of preventing penetration of both oxygen and impurities such as hydrogen and moisture. The aluminum oxide film has a high density (film density higher than or equal to 3.2 g/cm$^3$, preferably higher than or equal to 3.6 g/cm$^3$), whereby a higher blocking effect can be obtained.

Therefore, the aluminum oxide film covers the insulating film 407 which has been subjected to the oxygen doping treatment and heat treatment is performed thereto, whereby release of oxygen from the insulating film 407 to the aluminum oxide film can be prevented and oxygen can be supplied to the oxide semiconductor film 403 from the insulating film 407 effectively. Moreover, during and after the manufacturing process, the aluminum oxide film functions as a protective film for preventing entry of impurities such as hydrogen and moisture, which causes a change, into the oxide semiconductor film 403 and release of oxygen, which is a main constituent material of the oxide semiconductor, from the oxide semiconductor film 403.

Figure 2D:
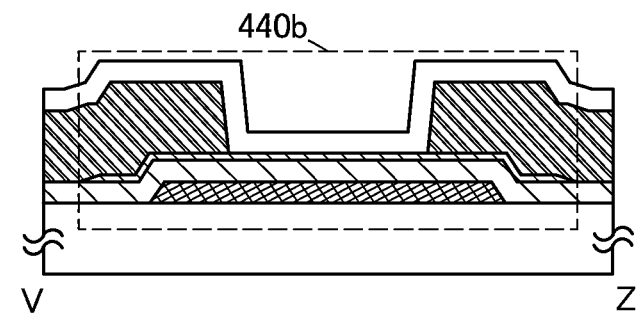

Through the above-described process, the transistor 440b is manufactured (see FIG. 2D).

The transistor 440b in which the insulating film 407 which is in contact with the oxide semiconductor film 403 is subjected to dehydration or dehydrogenation treatment by heat treatment and oxygen doping treatment after the dehydration or dehydrogenation treatment has less change in electric characteristics and is thus electrically stable.

Accordingly, the transistor 440b having stable electric characteristics can be manufactured.

In addition, according to one embodiment of the present invention, a semiconductor device having the transistor 440b with high electric characteristics and reliability can be manufactured.

(Embodiment 3)

In this embodiment, one embodiment of a semiconductor device and a method for manufacturing the semiconductor device is described with reference to FIGS. 3A to 3F. The same portion as or a portion having a function similar to those in the above embodiment can be formed in a manner similar to that described in the above embodiment, and also the steps similar to those in the above embodiment can be performed in a manner similar to that described in the above embodiment, and repetitive description is omitted. In addition, detailed description of the same portions is not repeated.

In this embodiment, the transistor 440c which is manufactured by performing dehydration or dehydrogenation treatment by heat treatment and then oxygen doping treatment on both a gate insulating film which is in contact with a lower layer of the oxide semiconductor film and an insulating film which is provided over and in contact with the oxide semiconductor film is described as an example.

An example of a method for manufacturing the semiconductor device including the transistor 440c is illustrated in FIGS. 3A to 3F.

A conductive film is formed over the substrate 400 and is etched into the gate electrode layer 401.

In this embodiment, a tungsten film with a thickness of 100 nm is formed by a sputtering method.

Next, the gate insulating film is formed over the gate electrode layer 401.

In this embodiment, a silicon oxynitride film having a thickness of 200 nm is formed as the gate insulating film by a plasma CVD method. The conditions for forming the gate insulating film can be as follows: gas flow rate of $SiH_4$ and $N_2O$ is $SiH_4$:$N_2O$=4 sccm: 800 sccm; a pressure is 40 Pa, a power of the RF power supply (power supply output) is 50 W, and a substrate temperature is 350° C.

Dehydration or dehydrogenation treatment is performed on the gate insulating film by heat treatment.

In this embodiment, even if a gas containing hydrogen is used as a deposition gas of the gate insulating film, dehydrogenation treatment is performed on the gate insulating film, so that hydrogen in the gate insulating film can be removed. Thus, a plasma CVD method can be preferably used. A plasma CVD method, which enables the film to be formed thick, is advantageous in productivity because attachment or entry of dust or the like into a film at the film formation unlikely occur and the film can be formed at relatively high deposition rate.

The temperature of the heat treatment is higher than or equal to 300° C. and lower than or equal to 700° C., or lower than the strain point of the substrate. The temperature of the heat treatment is preferably higher than the film formation temperature of the gate insulating film, because effect of dehydration or dehydrogenation is high. For example, after the substrate is put in an electric furnace which is a kind of heat treatment apparatus, the gate insulating film is subjected to the heat treatment at 450° C. for one hour under a nitrogen atmosphere.

Figure 3A:
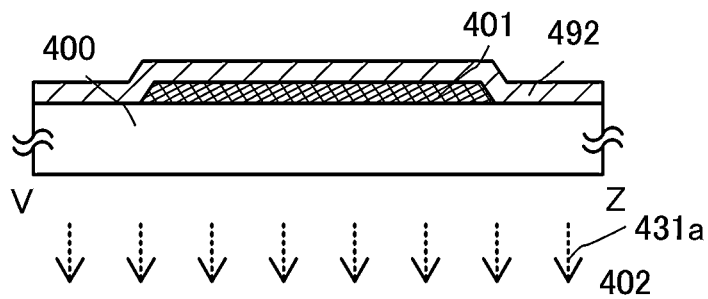
FIGS. 3A to 3F are cross-sectional views illustrating one embodiment of a method for manufacturing a semiconductor device.

With the heat treatment, dehydration or dehydrogenation can be performed on the gate insulating film, so that the gate insulating film 492 from which impurities such as hydrogen and water causing variation in the characteristics of the transistor are removed can be formed (see FIG. 3A).

Figure 3B:
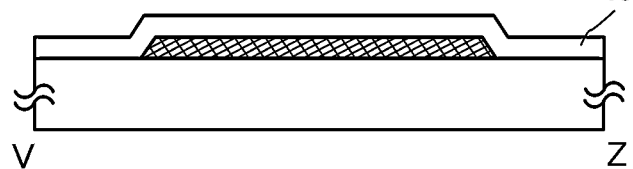

Next, oxygen doping treatment is performed on the gate insulating film 492 which is dehydrated or dehydrogenated, whereby a gate insulating film 402 containing excessive oxygen is formed (see FIG. 3B). The oxygen doping treatment is performed on the gate insulating film 492 and oxygen 431a is supplied to the gate insulating film 492, whereby oxygen is contained in the gate insulating film 492 or in the gate insulating film 492 and the vicinity of the interface between the gate insulating film 492 and an oxide semiconductor film 403 which is to be formed over the gate insulating film 492 in a later step.

The gate insulating film 402 preferably contains a large amount of oxygen which exceeds at least the stoichiometric ratio in (a bulk of) the film.

For the doped oxygen 431a (an oxygen radical, an oxygen atom, an oxygen molecule, ozone, an oxygen ion (an oxygen molecule ion) and/or an oxygen cluster ion), ion implantation method, ion doping method, plasma immersion ion implantation method, plasma treatment, or the like can be used. Further, a gas cluster ion beam may be used for ion implantation method. Oxygen doping treatment may be performed on the whole surface at a time, or may be performed using and moving (scanning) a linear ion beam or the like.

For example, oxygen for the doping (an oxygen radical, an oxygen atom, an oxygen molecule, ozone, an oxygen ion (an oxygen molecule ion) and/or an oxygen cluster ion) 431a may be supplied from a plasma generating apparatus with use of a gas containing oxygen or from an ozone generating apparatus. More specifically, for example, the oxygen 431a can be generated with an apparatus for etching treatment on a semiconductor device, an apparatus for ashing on a resist mask, or the like to process the gate insulating film 491 and form the gate insulating film 402.

A gas containing oxygen can be used for oxygen doping treatment. As a gas containing oxygen, oxygen, dinitrogen monoxide, nitrogen dioxide, carbon dioxide, carbon monoxide, or the like can be used. Alternatively, a rare gas can be used for oxygen doping treatment.

Note that by the oxygen doping treatment, planarity of the surface of the gate insulating film 402 can be improved.

Figure 3C:
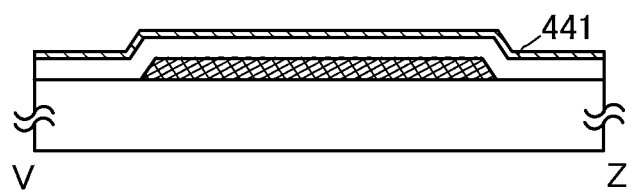

Next, the oxide semiconductor film 441 is formed over the gate insulating film 402 (see FIG. 3C).

In this embodiment, a 35-nm-thick In—Ga—Zn-based oxide film (IGZO film) is formed as the oxide semiconductor film 441 by a sputtering method using a sputtering apparatus including an AC power supply device. In this embodiment, an In—Ga—Zn-based oxide target having an atomic ratio of In:Ga:Zn=1:1:1 (=1/3:1/3:1/3) is used. Note that the film formation condition is as follows: the atmosphere is an atmosphere of oxygen and argon (oxygen flow rate: 50%), the pressure is 0.6 Pa, the power of the power source is 5 kW, and the substrate temperature is 170° C. The deposition rate under the film formation condition is 16 nm/min.

The gate insulating film 402 which is in contact with the oxide semiconductor film 403 can supply oxygen to the oxide semiconductor film 403 because much (excess) oxygen that serves as a source of the oxygen is contained therein.

The oxide semiconductor film 403 is preferably subjected to heat treatment while being in contact with the gate insulating film 402. With the heat treatment, oxygen can be supplied effectively from the gate insulating film 402 to the oxide semiconductor film 403.

Note that the heat treatment for supplying oxygen from the gate insulating film 402 to the oxide semiconductor film 403 is preferably performed before the oxide semiconductor film 441 is processed into an island shape, in which case release of oxygen contained in the gate insulating film 402 by the heat treatment can be prevented.

By supply of oxygen to the oxide semiconductor film 403, oxygen vacancies in the oxide semiconductor film 403 can be repaired.

The heat treatment for supplying oxygen to the oxide semiconductor film 403 from the gate insulating film 402 which is subjected to oxygen doping treatment can also serve as heat treatment performed later. For example, the heat treatment can serve as the heat treatment for dehydration or dehydrogenation or the heat treatment for supplying oxygen to the oxide semiconductor film 403 from the insulating film 407 which is subjected to the oxygen doping treatment.

The oxide semiconductor film 441 is processed into an island-shaped oxide semiconductor film 403 by a photolithography step.

Next, a conductive film to be the source electrode layer and the drain electrode layer is formed over the gate electrode layer 401, the gate insulating film 402, and the oxide semiconductor film 403.

In this embodiment, as the conductive film, a stack of a titanium film with a thickness of 100 nm, an aluminum film with a thickness of 400 nm, and a titanium film with a thickness of 100 nm which are formed by a sputtering method is used. As the etching of the conductive film, the stack of the titanium film, the aluminum film, and the titanium film is etched by a dry etching method, and the source electrode layer 405a and the drain electrode layer 405b are formed.

An insulating film is formed over the source electrode layer 405a and the drain electrode layer 405b and in contact with the oxide semiconductor film 403.

In this embodiment, a silicon oxynitride film having a thickness of 300 nm is formed as the insulating film by a plasma CVD method. The conditions for forming the insulating film can be as follows: gas flow rate of $SiH_4$ and $N_2O$ is $SiH_4$:$N_2O$=4 sccm: 800 sccm; a pressure is 40 Pa, a power of the RF power supply (power supply output) is 50 W, and a substrate temperature is 350° C.

Dehydration or dehydrogenation treatment is performed on the insulating film by heat treatment.

In this embodiment, even if a gas containing hydrogen is used as a deposition gas of the insulating film, dehydrogenation treatment is performed on the insulating film, so that hydrogen in the insulating film can be removed. Thus, a plasma CVD method can be preferably used. A plasma CVD method, which enables the film to be formed thick, is advantageous in productivity because attachment or entry of dust or the like into a film at the film formation unlikely occur and the film can be formed at relatively high deposition rate.

The temperature of the heat treatment is higher than or equal to 300° C. and lower than or equal to 700° C., or lower than the strain point of the substrate. The temperature of the heat treatment is preferably higher than the film formation temperature of the insulating film, because effect of dehydration or dehydrogenation is high. For example, after the substrate is put in an electric furnace which is a kind of heat treatment apparatus, the insulating film is subjected to the heat treatment at 450° C. for one hour under a nitrogen atmosphere.

Figure 3D:
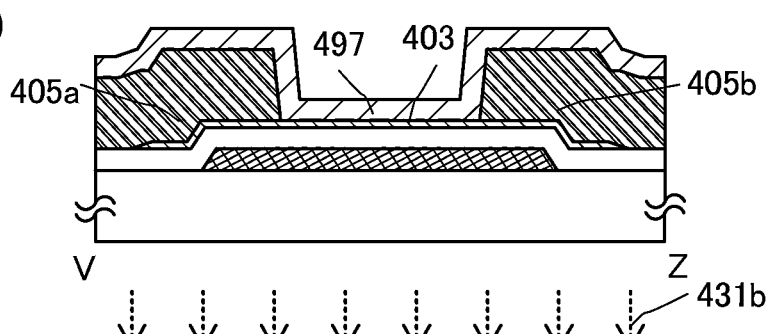

With the heat treatment, dehydration or dehydrogenation can be performed on the insulating film, so that the insulating film 497 from which impurities such as hydrogen and water are removed can be formed (see FIG. 3D).

In the heat treatment where dehydration or dehydrogenation treatment is performed, it is preferable that a surface of the insulating film 496 be not in a state where hydrogen, water, or the like is prevented from being released (for example, by providing a film or the like which is not permeable to (or blocks) hydrogen, water, or the like), but in a state where the surface of the insulating film 496 is exposed.

The heat treatment for dehydration or dehydrogenation may be performed plural times, and may also serve as another heat treatment.

By performing the heat treatment for dehydration or dehydrogenation, impurities contained in the insulating film 497 (the insulating film 407), such as water or hydrogen, can be removed from the insulating film 497 (the insulating film 407) and reduced. When hydrogen is contained in the insulating film 497 (the insulating film 407), entry of the hydrogen into the oxide semiconductor film 403 or extraction of oxygen from the oxide semiconductor film 403 by the hydrogen may occur; thus, the backchannel of the oxide semiconductor film 403 might have lower resistance (n-type conductivity) and a parasitic channel might be formed. Therefore, by performing the heat treatment for dehydration or dehydrogenation, the insulating film 497 (the insulating film 407) contains hydrogen as little as possible, so that the transistor 440b has less change in electric characteristics and has stable electric characteristics.

Figure 3E:
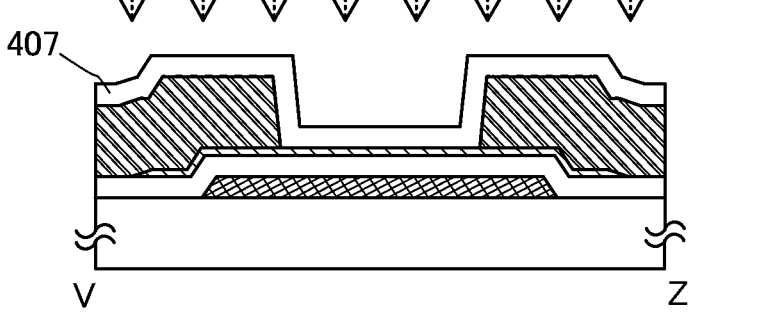

Next, oxygen doping treatment is performed on the insulating film 497 which is dehydrated or dehydrogenated, whereby an insulating film 407 containing excessive oxygen is formed (see FIG. 3E). The oxygen doping treatment is performed on the insulating film 497 and oxygen 431b is supplied to the insulating film 497, whereby oxygen is contained in the insulating film 497 or in the insulating film 497 and the vicinity of the interface between the insulating film 497 and the oxide semiconductor film 403.

The insulating film 407 preferably contains a large amount of oxygen which exceeds at least the stoichiometric ratio in (a bulk of) the film.

For the doped oxygen 431b (an oxygen radical, an oxygen atom, an oxygen molecule, ozone, an oxygen ion (an oxygen molecule ion) and/or an oxygen cluster ion), ion implantation method, ion doping method, plasma immersion ion implantation method, plasma treatment, or the like can be used. Further, a gas cluster ion beam may be used for ion implantation method. Oxygen doping treatment may be performed on the whole surface at a time, or may be performed using and moving (scanning) a linear ion beam or the like.

For example, oxygen for the doping (an oxygen radical, an oxygen atom, an oxygen molecule, ozone, an oxygen ion (an oxygen molecule ion) and/or an oxygen cluster ion) 431b may be supplied from a plasma generating apparatus with use of a gas containing oxygen or from an ozone generating apparatus. More specifically, for example, the oxygen 431b can be generated with an apparatus for etching treatment on a semiconductor device, an apparatus for ashing on a resist mask, or the like to process the insulating film 497 and form the insulating film 407.

A gas containing oxygen can be used for oxygen doping treatment. As a gas containing oxygen, oxygen, dinitrogen monoxide, nitrogen dioxide, carbon dioxide, carbon monoxide, or the like can be used. Alternatively, a rare gas can be used for oxygen doping treatment.

The insulating film 407 contains much (excess) oxygen by oxygen doping treatment (it is preferable that the insulating film 407 include a region containing oxygen in excess of that in the stoichiometric composition in a crystalline state); therefore, the insulating film 407 can suitably serve as a source of oxygen to be supplied to the oxide semiconductor film 403.

The oxide semiconductor film 403 is preferably subjected to heat treatment in a state in which part of the oxide semiconductor film 403 (a channel formation region) is in contact with the insulating film 407. By performing the heat treatment, oxygen can be supplied to the oxide semiconductor film 403 from the insulating film 407 effectively.

The temperature of the heat treatment is 250° C. to 700° C. inclusive, preferably 400° C. to 700° C. inclusive, or is lower than the strain point of the substrate. For example, the substrate is introduced into an electric furnace which is one of heat treatment apparatuses, and the heat treatment is performed on the oxide semiconductor film at 250° C. for one hour in a nitrogen atmosphere.

For the heat treatment, a heating method and a heating apparatus similar to those for the heat treatment where a dehydration or dehydrogenation treatment is performed on the insulating film 407 can be employed.

The heat treatment may be performed under reduced pressure, in a nitrogen atmosphere, in an oxygen atmosphere, in ultra-dry air (air in which the moisture amount is less than or equal to 20 ppm (−55° C. by conversion into a dew point), preferably less than or equal to 1 ppm, more preferably less than or equal to 10 ppb, in the measurement with the use of a dew point meter in the cavity ring down laser spectroscopy (CRDS) system), or in a rare gas (argon, helium, or the like) atmosphere. It is preferable that water, hydrogen, and the like be not contained in the nitrogen atmosphere, in the oxygen atmosphere, in the ultra-dry air, in the rare gas atmosphere, or the like. It is also preferable that the purity of nitrogen, oxygen, or the rare gas which is introduced into a heat treatment apparatus be set to higher than or equal to 6N (99.9999%), preferably higher than or equal to 7N (99.99999%) (that is, the impurity concentration is lower than or equal to 1 ppm, preferably lower than or equal to 0.1 ppm).

The oxide semiconductor film 403 and the insulating film 407 including excessive oxygen are in contact with each other when the heat treatment is performed; thus, oxygen which is one of the main components of the oxide semiconductor film 403 can be supplied from the insulating film 407 including oxygen to the oxide semiconductor film 403.

Further, the above heat treatment is preferably performed after the highly dense inorganic insulating film is provided over the insulating film 407. For example, an aluminum oxide film is formed over the insulating film 407 by a sputtering method.

An aluminum oxide film which can be used as an insulating film provided over the insulating film 407 has a high shielding effect (blocking effect) of preventing penetration of both oxygen and impurities such as hydrogen and moisture. The aluminum oxide film has a high density (film density higher than or equal to 3.2 g/cm$^3$, preferably higher than or equal to 3.6 g/cm$^3$), whereby a higher blocking effect can be obtained.

Therefore, the aluminum oxide film covers the insulating film 407 which has been subjected to the oxygen doping treatment and heat treatment is performed thereto, whereby release of oxygen from the insulating film 407 to the aluminum oxide film can be prevented and oxygen can be supplied to the oxide semiconductor film 403 from the insulating film 407 effectively. Moreover, during and after the manufacturing process, the aluminum oxide film functions as a protective film for preventing entry of impurities such as hydrogen and moisture, which causes a change, into the oxide semiconductor film 403 and release of oxygen, which is a main constituent material of the oxide semiconductor, from the oxide semiconductor film 403.

Figure 3F:
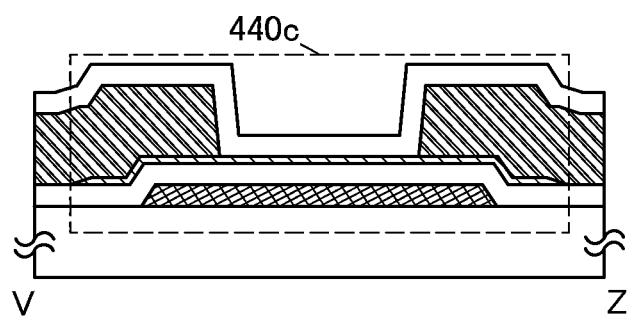

Through the above-described process, the transistor 440c is manufactured (see FIG. 3F).

The transistor 440c in which the gate insulating film 402 and the insulating film 407 which is in contact with the oxide semiconductor film 403 is subjected to dehydration or dehydrogenation treatment by heat treatment and oxygen doping treatment after the dehydration or dehydrogenation treatment has less change in electric characteristics and is thus electrically stable.

Accordingly, the transistor 440c having stable electric characteristics can be manufactured.

In addition, according to one embodiment of the present invention, a semiconductor device having the transistor 440c with high electric characteristics and reliability can be manufactured.

Note that as described above, a gate insulating film and/or an insulating film provided over and in contact with an oxide semiconductor film may have a stacked-layer structure. A transistor 440d and a transistor 440e in each of which a gate insulating film 402 and the insulating film 407 have a stacked-layer structure are shown in FIGS. 17A and 17B.

Figure 17A:
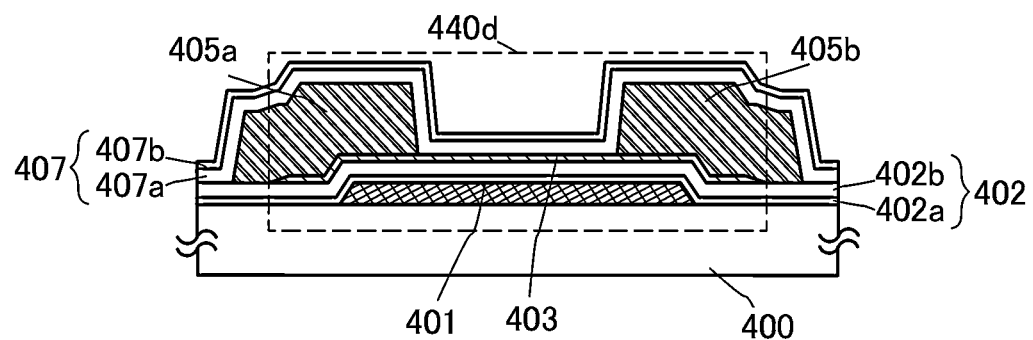
FIGS. 17A and 17B are cross-sectional views each illustrating one embodiment of a semiconductor device.
Figure 17B:
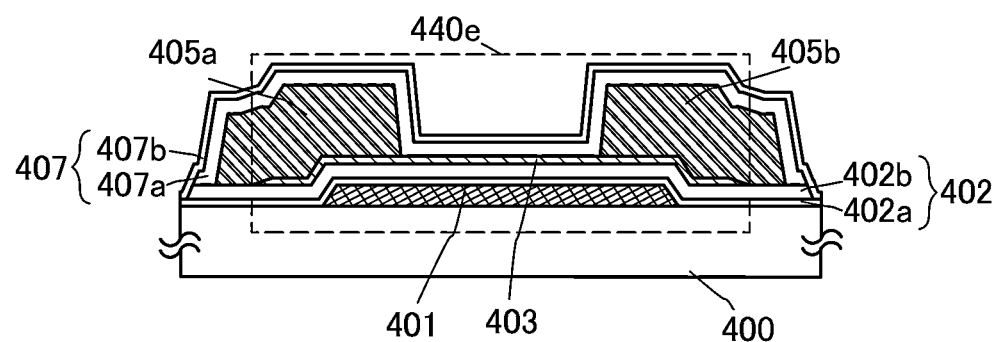

The transistor 440d illustrated in FIG. 17A includes a gate insulating film 402 in which a gate insulating film 402a and a gate insulating film 402b are stacked from the gate electrode layer 401 side, and an insulating film 407 in which an insulating film 407a and an insulating film 407b are stacked from the oxide semiconductor film 403 side.

It is preferable that in at least the gate insulating film 402b which is in contact with the oxide semiconductor film 403 in the stacked structure included in the gate insulating film 402, hydrogen in the film be reduced by dehydration or dehydrogenation treatment, and the film contain excessive oxygen by subsequent oxygen doping treatment. Similarly, it is preferable that in at least the gate insulating film 407a which is in contact with the oxide semiconductor film 403 in the stacked structure included in the insulating film 407, hydrogen in the film be reduced by dehydration or dehydrogenation treatment, and the film contain excessive oxygen by subsequent oxygen doping treatment. Oxygen is supplied from the insulating film in contact with the oxide semiconductor film 403 to the oxide semiconductor film 403, so that oxygen vacancies in the oxide semiconductor film 403 or at an interface between the oxide semiconductor film 403 and the insulating film can be reduced.

In this embodiment, a silicon nitride oxide film is used as the gate insulating film 402b and the insulating film 407a.

The insulating film 407b functions as a protective film of the transistor 440d. Thus, an aluminum oxide film is preferably provided as the insulating film 407b. Similarly, an aluminum oxide film is preferably provided as the gate insulating film 402a which is positioned at the side in contact with the gate electrode layer 401 in the stacked-layer structure included in the gate insulating film 402.

The aluminum oxide film has a high shielding (blocking) effect of preventing penetration of both oxygen and impurities such as hydrogen and moisture. Therefore, the aluminum oxide film is used as the gate insulating film 402a and the insulating film 407b, whereby oxygen can be prevented from being released from the oxide semiconductor film 403, and the gate insulating film 402b and the insulating film 407a which are in contact with the oxide semiconductor film 403, and entry of water and hydrogen into the oxide semiconductor film 403.

Note that when the aluminum oxide film has high density (film density higher than or equal to 3.2 g/cm$^3$, preferably higher than or equal to 3.6 g/cm$^3$), the transistor 440d can have stable electric characteristics, which is more preferable.

Note that in the gate insulating film 402a, hydrogen is reduced in a manner similar to that of the gate insulating film 402b and the film can contain excessive oxygen by the dehydration or dehydrogenation treatment and the subsequent oxygen doping treatment performed on the gate insulating film 402b. Alternatively, a step for the purpose of dehydration or dehydrogenation treatment performed on the gate insulating film 402a or a step for the purpose of oxygen doping treatment performed on the gate insulating film 402a may be additionally provided.

Further, the insulating film 407a may be subjected to the dehydration or dehydrogenation treatment and/or the subsequent oxygen doping treatment before the insulating film 407b is formed or after the insulating film 407b is formed. In the case where dehydration or dehydrogenation treatment and oxygen doping treatment are performed on the insulating film 407a after the insulating film 407b is formed, hydrogen in the insulating film 407b is also reduced and the film can contain excessive oxygen, in a manner similar to that of the insulating film 407a. Alternatively, a step for the purpose of dehydration or dehydrogenation treatment performed on the insulating film 407b or a step for the purpose of oxygen doping treatment performed on the insulating film 407b may be additionally provided.

In the transistor 440d, the gate insulating film 402b and the insulating film 407a are in contact with each other in a region where the source electrode layer 405a and the drain electrode layer 405b are not provided. That is, the oxide semiconductor film 403 is surrounded with the gate insulating film 402b and the insulating film 407a. Note that as in the transistor 440e illustrated in FIG. 17B, the gate insulating film 402a and the insulating film 407b may be in contact with each other in a region where the source electrode layer 405a and the drain electrode layer 405b are not provided in the transistor 440d.

The insulating films which are each in contact with the oxide semiconductor film 403 and in which hydrogen is reduced and excessive oxygen is contained are provided, and the insulating films each having a blocking effect are provided outside the respective insulating films, whereby the electric characteristics of the transistor can be further stabilized.

(Embodiment 4)

In this embodiment, one embodiment of a semiconductor device and a method for manufacturing the semiconductor device is described with reference to FIGS. 5A and 5B. The same portion as or a portion having a function similar to those in the above embodiment can be formed in a manner similar to that described in the above embodiment, and also the steps similar to those in the above embodiment can be performed in a manner similar to that described in the above embodiment, and repetitive description is omitted. In addition, detailed description of the same portions is not repeated.

Figure 5A:
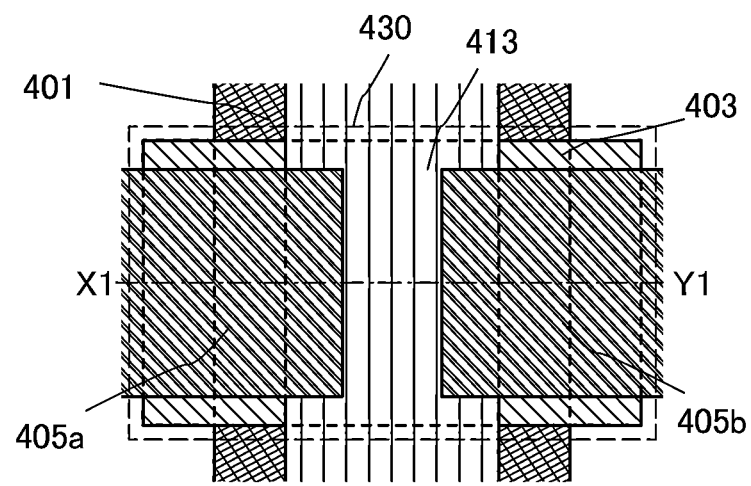
FIGS. 5A and 5B are a plan view and a cross-sectional view illustrating one embodiment of a semiconductor device.
Figure 5B:
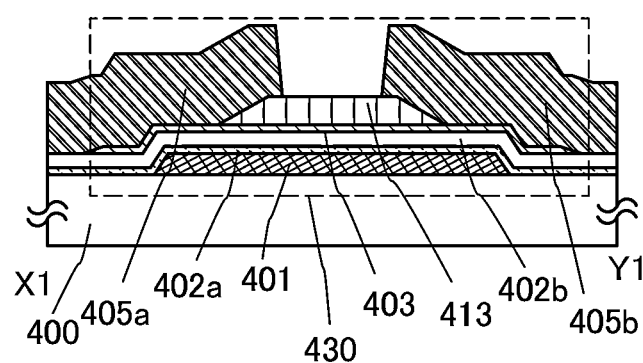

A transistor 430 illustrated in FIGS. 5A and 5B is an example of a transistor which is a kind of bottom-gate transistor referred to as a channel-protective transistor (also referred to as a channel-stop transistor) and is also referred to as an inverted staggered transistor. FIG. 5A is a plan view, and FIG. 5B is a cross-sectional view taken along dashed-dotted line X1-Y1 in FIG. 5A.

As illustrated in FIG. 5B which is the cross-sectional view of the transistor 430 in a channel length direction, a semiconductor device including the transistor 430 includes a gate electrode layer 401 over a substrate 400, and a gate insulating film 402a, a gate insulating film 402b, an oxide semiconductor film 403, a source electrode layer 405a, and a drain electrode layer 405b over the gate electrode layer 401. Further, an insulating layer 413 which is in contact with the oxide semiconductor film 403 is provided.

The transistor 430 includes a gate insulating film having a stacked structure of the gate insulating film 402a and the gate insulating film 402b as an example.

The insulating layer 413 in contact with the oxide semiconductor film 403 is provided over a channel formation region of the oxide semiconductor film 403, which overlaps with the gate electrode layer 401, and functions as a channel protective film.

The cross-sectional shape of the insulating layer 413 which is over and overlaps with the channel formation region, specifically, the cross-sectional shape (e.g., taper angle and thickness) of an end portion of the insulating layer 413 is adjusted, so that electric-field concentration which might occur in the vicinity of an end portion of the drain electrode layer 405b can be reduced and degradation of the switching characteristics of the transistor 430 can be suppressed.

Specifically, the cross-sectional shape of the insulating layer 413 which is over and overlaps with the channel formation region is set to a trapezoid or a triangle, and the taper angle of a lower end portion of the cross-sectional shape is set to 60° or less, preferably 45° or less, further preferably 30° or less. Setting the taper angle within such a range makes it possible to reduce the electric-field concentration which might occur in the vicinity of the end portion of the drain electrode layer 405b when a high gate voltage is applied to the gate electrode layer 401.

The thickness of the insulating layer 413 which is over and overlaps with the channel formation region is less than or equal to 0.3 μm, preferably greater than or equal to 5 nm and less than or equal to 0.1 μm. Setting the thickness within such a range makes it possible to reduce the peak of electric-field intensity, or distribute the electric-field concentration so that the electric-field is concentrated in plural portions, consequently reducing the electric-field concentration which might occur in the vicinity of the end portion of the drain electrode layer 405b.

An example of a method for manufacturing the semiconductor device including the transistor 430 is described below.

In a process for manufacturing the transistor 430 in this embodiment, an insulating film (the gate insulating film 402b and/or the insulating layer 413) which is in contact with the oxide semiconductor film 403 is subjected to dehydration or dehydrogenation treatment by heat treatment and subsequent oxygen doping treatment. In this embodiment, the transistor 430 which is manufactured by performing dehydration or dehydrogenation treatment by heat treatment and then oxygen doping treatment on the gate insulating film 402b and the insulating layer 413 is described as an example. Dehydration or dehydrogenation treatment by heat treatment may be performed on either one of the gate insulating film 402b or the insulating layer 413.

A conductive film is formed over the substrate 400 having an insulating surface and is etched into the gate electrode layer 401. In this embodiment, a tungsten film with a thickness of 100 nm is formed by a sputtering method.

Next, the gate insulating film 402a and the gate insulating film 402b are stacked over the gate electrode layer 401 in this order. In this embodiment, a nitride insulating film (e.g., a silicon nitride film or a silicon nitride oxide film which has a thickness greater than equal to 30 nm and less than or equal to 50 nm) is used as the gate insulating film 402a, and an oxide insulating film (e.g., a silicon oxide film or a silicon oxynitride film) is used as the gate insulating film 402b.

In this embodiment, a silicon nitride film having a thickness of 30 nm is formed as the gate insulating film 402a and a silicon oxynitride film having a thickness of 200 nm is formed as the gate insulating film 402b by a plasma CVD method.

Dehydration or dehydrogenation treatment is performed on the gate insulating films 402a and 402b by heat treatment.

In this embodiment, even if a gas containing hydrogen is used as a deposition gas of the gate insulating films 402a and 402b, dehydrogenation treatment is performed on the gate insulating films 402a and 402b, so that hydrogen in the gate insulating films 402a and 402b can be removed. Thus, a plasma CVD method can be preferably used. A plasma CVD method, which enables the film to be formed thick, is advantageous in productivity because attachment or entry of dust or the like into a film at the film formation unlikely occur and the film can be formed at relatively high deposition rate.

The temperature of the heat treatment is higher than or equal to 300° C. and lower than or equal to 700° C., or lower than the strain point of the substrate. The temperature of the heat treatment is preferably higher than the film formation temperature of the gate insulating films 402a and 402b, because effect of dehydration or dehydrogenation is high. For example, after the substrate is put in an electric furnace which is a kind of heat treatment apparatus, the gate insulating films 402a and 402b are subjected to the heat treatment at 450° C. for one hour under a nitrogen atmosphere.

With the heat treatment, dehydration or dehydrogenation can be performed on the gate insulating films 402a and 402b, so that the gate insulating films 402a and 402b from which impurities such as hydrogen and water causing variation in the characteristics of the transistor 430 are removed can be formed.

Next, oxygen doping treatment is performed on the gate insulating films 402a and 402b which are dehydrated or dehydrogenated, whereby gate insulating films 402a and 402b containing excessive oxygen are formed. The oxygen doping treatment is performed on the gate insulating films 402a and 402b and oxygen is supplied to the gate insulating films 402a and 402b, whereby oxygen is contained in the gate insulating films 402a and 402b or in the gate insulating films 402a and 402b and the vicinity of the interface between each of the gate insulating film 402a, the gate insulating film 402b, and an oxide semiconductor film 403 which is to be formed over the gate insulating film 402b in a later step.

The oxygen doping treatment may be performed on at least the gate insulating film 402b which is in contact with the oxide semiconductor film 403, and the oxygen doping treatment is not necessarily performed on the gate insulating film 402a.

The oxide semiconductor film 403 is formed over the gate insulating films 402a and 402b. In this embodiment, a 35-nm-thick In—Ga—Zn-based oxide film (IGZO film) is formed as the oxide semiconductor film 403 by a sputtering method using a sputtering apparatus including an AC power supply device. In this embodiment, an In—Ga—Zn-based oxide target having an atomic ratio of In:Ga:Zn=1:1:1 (=1/3:1/3:1/3) is used. Note that the film formation condition is as follows: the atmosphere is an atmosphere of oxygen and argon (oxygen flow rate: 50%), the pressure is 0.6 Pa, the power of the power source is 5 kW, and the substrate temperature is 170° C. The deposition rate under the film formation condition is 16 nm/min.

The gate insulating film 402b which is in contact with the oxide semiconductor film 403 can supply oxygen to the oxide semiconductor film 403 because much (excess) oxygen that serves as a source of the oxygen is contained therein.

The oxide semiconductor film 403 is preferably subjected to heat treatment while being in contact with the gate insulating film 402b. With the heat treatment, oxygen can be supplied effectively from the gate insulating film 402b to the oxide semiconductor film 403.

By supply of oxygen to the oxide semiconductor film 403, oxygen vacancies in the film can be repaired.

The heat treatment for supplying oxygen to the oxide semiconductor film 403 from the gate insulating film 402b which is subjected to oxygen doping treatment can also serve as heat treatment performed later. For example, the heat treatment can serve as the heat treatment for dehydration or dehydrogenation or the heat treatment for supplying oxygen to the oxide semiconductor film 403 from the insulating layer 413 which is subjected to the oxygen doping treatment.

Next, an insulating film to be the insulating layer 413 is formed over the channel formation region of the oxide semiconductor film 403, which overlaps with the gate electrode layer 401.

The insulating film to be the insulating layer 413 can be formed by etching an insulating film which is formed by a plasma CVD method or a sputtering method. As the insulating layer 413, a single layer or a stack of one or more inorganic insulating films, typical examples of which are a silicon oxide film, a silicon oxynitride film, an aluminum oxide film, an aluminum oxynitride film, a hafnium oxide film, a gallium oxide film, a silicon nitride film, an aluminum nitride film, a silicon nitride oxide film, an aluminum nitride oxide film, and an aluminum oxide film can be used.

In this embodiment, a silicon oxynitride film having a thickness of 200 nm is formed over and in contact with the oxide semiconductor film 403 as the insulating film by a plasma CVD method.

Dehydration or dehydrogenation treatment is performed on the insulating film by heat treatment.

In this embodiment, even if a gas containing hydrogen is used as a deposition gas of the insulating film, dehydrogenation treatment is performed on the insulating film, so that hydrogen in the insulating film can be removed. Thus, a plasma CVD method can be preferably used. A plasma CVD method, which enables the film to be formed thick, is advantageous in productivity because attachment or entry of dust or the like into a film at the film formation unlikely occur and the film can be formed at relatively high deposition rate.

The temperature of the heat treatment is higher than or equal to 300° C. and lower than or equal to 700° C., or lower than the strain point of the substrate. The temperature of the heat treatment is preferably higher than the film formation temperature of the insulating film, because effect of dehydration or dehydrogenation is high. For example, after the substrate is put in an electric furnace which is a kind of heat treatment apparatus, the insulating film is subjected to the heat treatment at 450° C. for one hour under a nitrogen atmosphere.

With the heat treatment, dehydration or dehydrogenation can be performed on the insulating film, so that the insulating film from which impurities such as hydrogen and water are removed can be formed.

By performing the heat treatment for dehydration or dehydrogenation, impurities contained in the insulating film, such as water or hydrogen, can be removed from the insulating film and reduced. The insulating film contains hydrogen as little as possible, so that the transistor 430 has less change in electric characteristics and has stable electric characteristics.

Next, oxygen doping treatment is performed on the insulating film which is dehydrated or dehydrogenated, whereby an insulating film containing excessive oxygen is formed.

The insulating film contains much (excess) oxygen by oxygen doping treatment (it is preferable that the insulating film include a region containing oxygen in excess of that in the stoichiometric composition in a crystalline state); therefore, the insulating film can suitably serve as a source of oxygen to be supplied to the oxide semiconductor film 403.

The oxide semiconductor film 403 is preferably subjected to heat treatment in a state where the oxide semiconductor film 403 is in contact with the insulating film. By performing the heat treatment, oxygen can be supplied to the oxide semiconductor film 403 from the insulating film effectively. In this embodiment, the heat treatment is performed at 300° C. in a nitrogen atmosphere for one hour.

The silicon oxide film is selectively etched to form the insulating layer 413 having a trapezoidal or triangular cross-sectional shape whose taper angle at the lower end portion is less than or equal to 60°, preferably less than or equal to 45°, further preferably less than or equal to 30°. The planar shape of the insulating layer 413 is a rectangle. In this embodiment, a resist mask is formed over the silicon oxide film through a photolithography process, and selective etching is performed to form a taper with an angle of about 30° at the lower end portion of the insulating layer 413.

Next, a conductive film to be processed into a source electrode layer and a drain electrode layer is formed over the gate electrode layer 401, the gate insulating films 402a and 402b, the oxide semiconductor film 403, and the insulating layer 413.

In this embodiment, as the conductive film, a stack of a titanium film with a thickness of 100 nm, an aluminum film with a thickness of 400 nm, and a titanium film with a thickness of 100 nm which are formed by a sputtering method is used. As the etching of the conductive film, the stack of the titanium film, the aluminum film, and the titanium film is etched by a dry etching method, and the source electrode layer 405a and the drain electrode layer 405b are formed.

In this embodiment, two layers of the titanium film and the aluminum film are etched under a first etching condition, and then the other titanium film is removed singly under a second etching condition. Note that the first etching condition is as follows: an etching gas ($BCl_3$:$Cl_2$=750 sccm: 150 sccm) is used, the bias power is 1500 W, the ICP power supply is 0 W, and the pressure is 2.0 Pa. The second etching condition is as follows: an etching gas ($BCl_3$:$Cl_2$=700 sccm: 100 sccm) is used, the bias power is 750 W, the ICP power supply is 0 W, and the pressure is 2.0 Pa.

Through the above-described process, the transistor 430 of this embodiment is manufactured.

An insulating film may be formed over the source electrode layer 405a and the drain electrode layer 405b.

The insulating film can be formed using a material and a method similar to those of the insulating layer 413. For example, a silicon oxynitride film with a thickness of 400 nm is formed by a CVD method. Further, heat treatment may be performed after the insulating film is formed. For example, the heat treatment is performed at 300° C. for one hour in a nitrogen atmosphere.

In addition, a planarization insulating film may be formed in order to reduce surface roughness due to the transistor 430.

For example, an acrylic resin film with a thickness of 1500 nm is formed as the planarization insulating film over the insulating film. The acrylic resin film can be formed by coating using a coating method and then baking (e.g., at 250° C. under a nitrogen atmosphere for one hour).

Heat treatment may be performed after the planarization insulating film is formed. For example, the heat treatment is performed at 250° C. under a nitrogen atmosphere for one hour.

The transistor 430 in which the gate insulating film 402b and/or the insulating layer 413 which are/is in contact with the oxide semiconductor film 403 are subjected to dehydration or dehydrogenation treatment by heat treatment and oxygen doping treatment after the dehydration or dehydrogenation treatment has less change in electric characteristics and is thus electrically stable.

Accordingly, the transistor 430 having stable electric characteristics can be manufactured.

In addition, according to one embodiment of the present invention, a semiconductor device having the transistor 430 with high electric characteristics and reliability can be manufactured.

(Embodiment 5)

In this embodiment, another embodiment of a semiconductor device and a method for manufacturing the semiconductor device is described with reference to FIGS. 6A and 6B. The same portion as or a portion having a function similar to those in the above embodiment can be formed in a manner similar to that described in the above embodiment, and also the steps similar to those in the above embodiment can be performed in a manner similar to that described in the above embodiment, and repetitive description is omitted. In addition, detailed description of the same portions is not repeated.

Figure 6A:
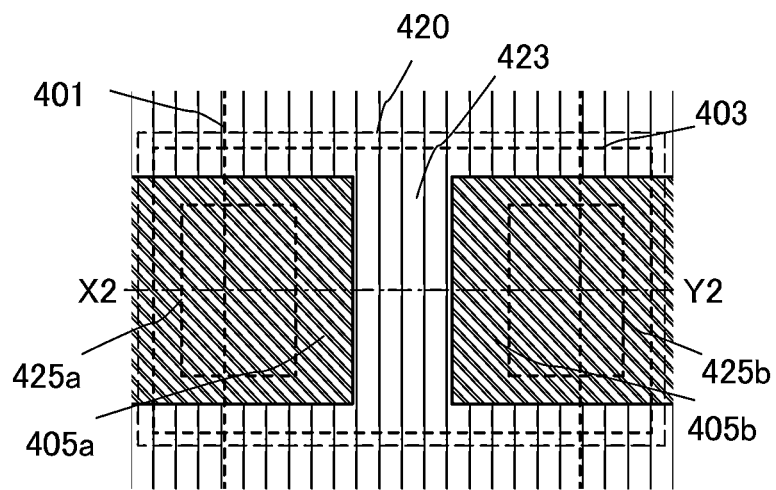
FIGS. 6A and 6B are a plan view and a cross-sectional view illustrating one embodiment of a semiconductor device.
Figure 6B:
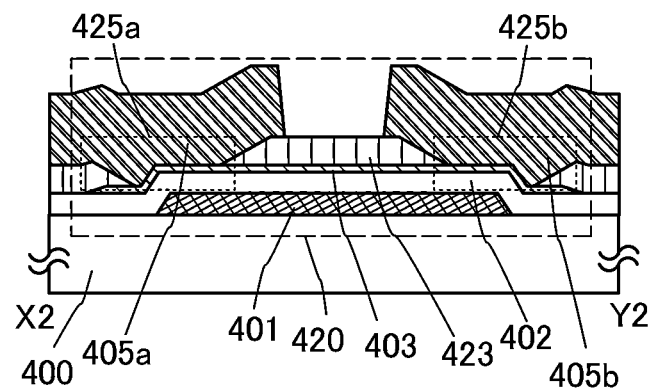

A transistor 420 illustrated in FIGS. 6A and 6B is an example of a transistor which is a kind of bottom-gate transistor referred to as a channel-protective transistor (also referred to as a channel-stop transistor) and is also referred to as an inverted staggered transistor. FIG. 6A is a plan view, and FIG. 6B is a cross-sectional view taken along dashed-dotted line X2-Y2 in FIG. 6A.

As illustrated in FIG. 6B which is the cross-sectional view in a channel length direction, a semiconductor device including the transistor 420 includes a gate electrode layer 401 over a substrate 400, and a gate insulating film 402, an oxide semiconductor film 403, an insulating layer 423, a source electrode layer 405a, and a drain electrode layer 405b over the gate electrode layer 401.

The insulating layer 423 is provided over a region of the oxide semiconductor film 403 including at least the channel formation region of the oxide semiconductor film 403, which overlaps with the gate electrode layer 401, and functions as a channel protective film. The insulating layer 423 includes openings 425a and 425b which reach the oxide semiconductor film 403 and whose inner walls are each covered with the source electrode layer 405a or the drain electrode layer 405b. Accordingly, the insulating layer 423 covers the periphery of the oxide semiconductor film 403, thus functioning also as an interlayer insulating film. Parasitic capacitance can be reduced by locating, in addition to the gate insulating film 402, the insulating layer 423 as an interlayer insulating film at the intersection of a gate wiring and a source wiring.

In the transistor 420, the oxide semiconductor film 403 is covered with the insulating layer 423, the source electrode layer 405a, and the drain electrode layer 405b.

The insulating layer 423 can be formed by etching an insulating film which is formed by a plasma CVD method or a sputtering method. Inner walls of the openings 425a and 425b in the insulating layer 423 are tapered.

The insulating layer 423 is provided over a region of the oxide semiconductor film 403 including at least the channel formation region of the oxide semiconductor film 403, which overlaps with the gate electrode layer 401, and partly functions as a channel protective film.

In a process for manufacturing the transistor 420 in this embodiment, an insulating film (the gate insulating film 402 and/or the insulating layer 423) which is in contact with the oxide semiconductor film 403 is subjected to dehydration or dehydrogenation treatment by heat treatment and subsequent oxygen doping treatment. In this embodiment, the transistor 420 which is manufactured by performing dehydration or dehydrogenation treatment by heat treatment and then oxygen doping treatment on the gate insulating film 402 and the insulating layer 423 is described as an example. Dehydration or dehydrogenation treatment by heat treatment may be performed on either one of the gate insulating film 402 or the insulating layer 423.

Therefore, impurities such as hydrogen and water causing variation in characteristics of the transistor 420 are not mixed into the oxide semiconductor film 403 and oxygen repairing oxygen vacancies is supplied thereto.

The transistor 420 in which the gate insulating film 402 and/or the insulating layer 423 which are/is in contact with the oxide semiconductor film 403 are subjected to dehydration or dehydrogenation treatment by heat treatment and oxygen doping treatment after the dehydration or dehydrogenation treatment has less change in electric characteristics and is thus electrically stable.

Accordingly, the transistor 420 having stable electric characteristics can be manufactured.

In addition, according to one embodiment of the present invention, a semiconductor device having the transistor 420 with high electric characteristics and reliability can be manufactured.

(Embodiment 6)

In this embodiment, another embodiment of a semiconductor device and a method for manufacturing the semiconductor device is described with reference to FIGS. 7A and 7B. The same portion as or a portion having a function similar to those in the above embodiment can be formed in a manner similar to that described in the above embodiment, and also the steps similar to those in the above embodiment can be performed in a manner similar to that described in the above embodiment, and repetitive description is omitted. In addition, detailed description of the same portions is not repeated.

Figure 7A:
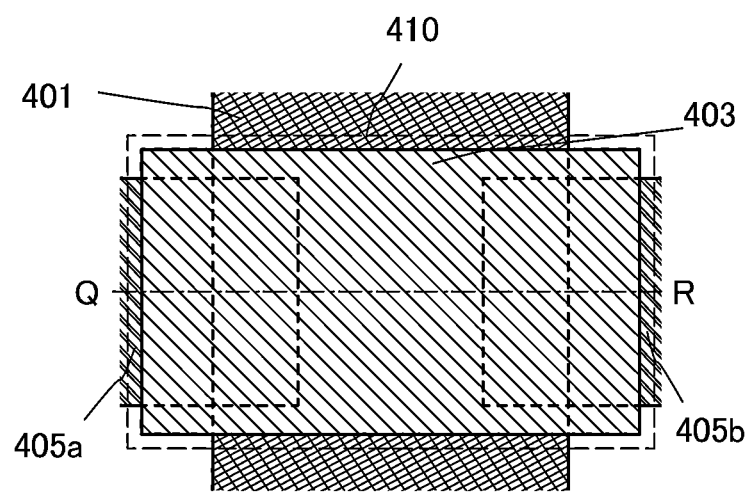
FIGS. 7A and 7B are a plan view and a cross-sectional view illustrating one embodiment of a semiconductor device.
Figure 7B:
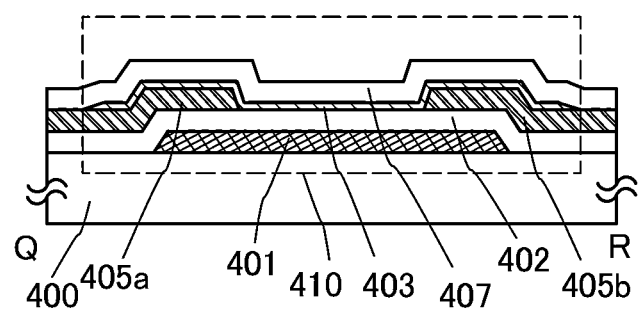

A transistor 410 illustrated in FIGS. 7A and 7B is an example of a bottom-gate transistor. FIG. 7A is a plan view, and FIG. 7B is a cross-sectional view taken along the chain line Q-R in FIG. 7A.

As illustrated in FIG. 7B which is the cross-sectional view of the transistor 410 in a channel length direction, a semiconductor device including the transistor 410 includes a gate electrode layer 401 over a substrate 400, and a gate insulating film 402, a source electrode layer 405a, a drain electrode layer 405b, and an oxide semiconductor film 403 over the gate electrode layer 401. An insulating film 407 is provided in contact with the oxide semiconductor film 403 and to cover the transistor 410.

An example of a method for manufacturing the semiconductor device including the transistor 410 is described below.

In a process for manufacturing the transistor 410 in this embodiment, an insulating film (the gate insulating film 402 and/or the insulating film 407) which is in contact with the oxide semiconductor film 403 is subjected to dehydration or dehydrogenation treatment by heat treatment and subsequent oxygen doping treatment. In this embodiment, the transistor 410 which is manufactured by performing dehydration or dehydrogenation treatment by heat treatment and then oxygen doping treatment on the gate insulating film 402 and the insulating film 407 is described as an example. Dehydration or dehydrogenation treatment by heat treatment may be performed on either one of the gate insulating film 402 or the insulating film 407.

A conductive film is formed over the substrate 400 having an insulating surface and is etched into the gate electrode layer 401. In this embodiment, a tungsten film with a thickness of 100 nm is formed by a sputtering method.

Next, the gate insulating film 402 is formed over the gate electrode layer 401. In this embodiment, a 200-nm-thick silicon oxynitride film is formed by a plasma CVD method.

Dehydration or dehydrogenation treatment is performed on the gate insulating film 402 by heat treatment.

In this embodiment, even if a gas containing hydrogen is used as a deposition gas of the gate insulating film 402, dehydrogenation treatment is performed on the gate insulating film 402, so that hydrogen in the gate insulating film 402 can be removed. Thus, a plasma CVD method can be preferably used. A plasma CVD method, which enables the film to be formed thick, is advantageous in productivity because attachment or entry of dust or the like into a film at the film formation unlikely occur and the film can be formed at relatively high deposition rate.

The temperature of the heat treatment is higher than or equal to 300° C. and lower than or equal to 700° C., or lower than the strain point of the substrate. The temperature of the heat treatment is preferably higher than the film formation temperature of the gate insulating film 402, because effect of dehydration or dehydrogenation is high. For example, after the substrate is put in an electric furnace which is a kind of heat treatment apparatus, the gate insulating film 402 is subjected to the heat treatment at 450° C. for one hour under a nitrogen atmosphere.

With the heat treatment, dehydration or dehydrogenation can be performed on the gate insulating film 402, so that the gate insulating film 402 from which impurities such as hydrogen and water causing variation in the characteristics of the transistor 410 are removed can be formed.

Next, oxygen doping treatment is performed on the gate insulating film 402 which is dehydrated or dehydrogenated, whereby a gate insulating film 402 containing excessive oxygen is formed. The oxygen doping treatment is performed on the gate insulating film 402 and oxygen is supplied to the gate insulating film 402, whereby oxygen is contained in the gate insulating film 402 or in the gate insulating film 402 and the vicinity of the interface between the gate insulating film 402 and an oxide semiconductor film 403 which is to be formed over the gate insulating film 402 in a later step.

Next, a conductive film to be processed into a source electrode layer and a drain electrode layer is formed over the gate electrode layer 401 and the gate insulating film 402.

In this embodiment, as the conductive film, a tungsten film with a thickness of 100 nm which is formed by a sputtering method is used. The conductive film is etched by a dry etching method, so that the source electrode layer 405a and the drain electrode layer 405b are formed.

The oxide semiconductor film 403 is formed over the source electrode layer 405a and the drain electrode layer 405b. In this embodiment, a 35-nm-thick In—Ga—Zn-based oxide film (IGZO film) is formed as the oxide semiconductor film 403 by a sputtering method using a sputtering apparatus including an AC power supply device. In this embodiment, an In—Ga—Zn-based oxide target having an atomic ratio of In:Ga:Zn=1:1:1 (=1/3:1/3:1/3) is used. Note that the film formation condition is as follows: the atmosphere is an atmosphere of oxygen and argon (oxygen flow rate: 50%), the pressure is 0.6 Pa, the power of the power source is 5 kW, and the substrate temperature is 170° C. The deposition rate under the film formation condition is 16 nm/min.

The gate insulating film 402 which is in contact with the oxide semiconductor film 403 can supply oxygen to the oxide semiconductor film 403 because much (excess) oxygen that serves as a source of the oxygen is contained therein.

The oxide semiconductor film 403 is preferably subjected to heat treatment while being in contact with the gate insulating film 402. With the heat treatment, oxygen can be supplied effectively from the gate insulating film 402 to the oxide semiconductor film 403.

By supply of oxygen to the oxide semiconductor film 403, oxygen vacancies in the film can be repaired.

The heat treatment for supplying oxygen to the oxide semiconductor film 403 from the gate insulating film 402 which is subjected to oxygen doping treatment can also serve as heat treatment performed later. For example, the heat treatment can serve as the heat treatment for dehydration or dehydrogenation or the heat treatment for supplying oxygen to the oxide semiconductor film 403 from the insulating film 407 which is subjected to the oxygen doping treatment.

In this embodiment, the insulating film 407 is formed over and in contact with the oxide semiconductor film 403.

In this embodiment, as the insulating film 407, a silicon oxynitride film with a thickness of 400 nm is formed by a plasma CVD method.

Dehydration or dehydrogenation treatment is performed on the insulating film 407 by heat treatment.

In this embodiment, even if a gas containing hydrogen is used as a deposition gas of the insulating film 407, dehydrogenation treatment is performed on the insulating film 407, so that hydrogen in the insulating film 407 can be removed. Thus, a plasma CVD method can be preferably used. A plasma CVD method, which enables the film to be formed thick, is advantageous in productivity because attachment or entry of dust or the like into a film at the film formation unlikely occur and the film can be formed at relatively high deposition rate.

The temperature of the heat treatment is higher than or equal to 300° C. and lower than or equal to 700° C., or lower than the strain point of the substrate. The temperature of the heat treatment is preferably higher than the film formation temperature of the insulating film 407, because effect of dehydration or dehydrogenation is high. For example, after the substrate is put in an electric furnace which is a kind of heat treatment apparatus, the insulating film 407 is subjected to the heat treatment at 450° C. for one hour under a nitrogen atmosphere.

With the heat treatment, dehydration or dehydrogenation can be performed on the insulating film 407, so that an insulating film from which impurities such as hydrogen and water are removed can be formed.

By performing the heat treatment for dehydration or dehydrogenation, impurities contained in the insulating film 407, such as water or hydrogen, can be removed from the insulating film and reduced. The insulating film 407 contains hydrogen as little as possible, so that the transistor 410 has less change in electric characteristics and has stable electric characteristics.

Next, oxygen doping treatment is performed on the insulating film 407 which is dehydrated or dehydrogenated, whereby the insulating film 407 containing excessive oxygen is formed.

The insulating film 407 contains much (excess) oxygen by oxygen doping treatment (it is preferable that the insulating film 407 include a region containing oxygen in excess of that in the stoichiometric composition in a crystalline state); therefore, the insulating film 407 can suitably serve as a source of oxygen to be supplied to the oxide semiconductor film 403.

The oxide semiconductor film 403 is preferably subjected to heat treatment in a state where the oxide semiconductor film 403 is in contact with the insulating film 407. By performing the heat treatment, oxygen can be supplied to the oxide semiconductor film 403 from the insulating film 407 effectively. In this embodiment, the heat treatment is performed at 300° C. in a nitrogen atmosphere for one hour.

Further, the above heat treatment is preferably performed after the highly dense inorganic insulating film is provided over the insulating film 407. For example, an aluminum oxide film is formed over the insulating film 407 by a sputtering method.

Through the above-described process, the transistor 410 of this embodiment is manufactured.

In addition, a planarization insulating film may be formed in order to reduce surface roughness due to the transistor 410.

For example, an acrylic resin film with a thickness of 1500 nm is formed as the planarization insulating film over the insulating film. The acrylic resin film can be formed by coating using a coating method and then baking (e.g., at 250° C. under a nitrogen atmosphere for one hour).

Heat treatment may be performed after the planarization insulating film is formed. For example, the heat treatment is performed at 250° C. under a nitrogen atmosphere for one hour.

The transistor 410 in which the gate insulating film 402 and/or the insulating film 407 which are/is in contact with the oxide semiconductor film 403 are subjected to dehydration or dehydrogenation treatment by heat treatment and oxygen doping treatment after the dehydration or dehydrogenation treatment has less change in electric characteristics and is thus electrically stable.

Accordingly, the transistor 410 having stable electric characteristics can be manufactured.

In addition, according to one embodiment of the present invention, a semiconductor device having the transistor 410 with high electric characteristics and reliability can be manufactured.

(Embodiment 7)

In this embodiment, another embodiment of a semiconductor device and a method for manufacturing the semiconductor device will be described. The same portion as or a portion having a function similar to those in the above embodiment can be formed in a manner similar to that described in the above embodiment, and also the steps similar to those in the above embodiment can be performed in a manner similar to that described in the above embodiment, and repetitive description is omitted. In addition, detailed description of the same portions is not repeated.

In this embodiment, oxygen doping treatment is performed to an insulating film which is in contact with an oxide semiconductor film, which is not yet subjected to dehydration or dehydrogenation treatment by heat treatment is performed to the insulating film as an example.

Note that the insulating film which is in contact with the oxide semiconductor film corresponds to the gate insulating film 402, the insulating film 407, the insulating layer 413, and the insulating layer 423 in Embodiments 1 to 6. This embodiment can be applied to the transistors 440a, 440b, 440c, 430, 420, and 410 in Embodiments 1 to 6.

Oxygen doping treatment may be performed on an insulating film before dehydration or dehydrogenation treatment is performed by heat treatment. The oxygen doping treatment and heat treatment may be performed plural times. When oxygen doping treatment is performed on an insulating film before heat treatment is performed, dehydration or dehydrogenation treatment can be performed effectively on the insulating film.

By doping oxygen to the insulating film which is in contact with the oxide semiconductor film, a bond between hydrogen and an element (e.g., a metal element) included in the insulating film is cut. Thus, hydrogen which is an impurity can be easily detached from the insulating film by heat treatment which is performed after. Further, since a void (defect) is formed in the film by doping oxygen, hydrogen after the bond is cut can be easily detached from the film via the void.

Further, a bond between a hydroxyl group and an element (e.g., a metal element) included in the insulating film is also cut by doping oxygen to the insulating film. Thus, in some cases, hydrogen is detached from the insulating film as water as a result of bonding between hydrogen after the bond is cut and a hydroxyl group after the bond is cut.

For the doped oxygen (an oxygen radical, an oxygen atom, an oxygen molecule, ozone, an oxygen ion (an oxygen molecule ion) and/or an oxygen cluster ion), ion implantation method, ion doping method, plasma immersion ion implantation method, plasma treatment, or the like can be used. Further, a gas cluster ion beam may be used for ion implantation method.

For example, oxygen for the doping (an oxygen radical, an oxygen atom, an oxygen molecule, ozone, an oxygen ion (an oxygen molecule ion) and/or an oxygen cluster ion) may be supplied from a plasma generating apparatus with use of a gas containing oxygen or from an ozone generating apparatus. More specifically, for example, oxygen may be generated with an apparatus for etching treatment on a semiconductor device, an apparatus for ashing on a resist mask, or the like to process the insulating film.

A gas containing oxygen can be used for oxygen doping treatment. As a gas containing oxygen, oxygen, dinitrogen monoxide, nitrogen dioxide, carbon dioxide, carbon monoxide, or the like can be used.

Alternatively, a rare gas can be used as an element which is doped before the heat treatment for dehydration or dehydrogenation is performed.

The rare gas may be used to be mixed into the gas containing oxygen, or both rare gas doping treatment and oxygen doping treatment may be used.

The oxygen doping treatment and heat treatment for dehydration or dehydrogenation treatment may be performed plural times. When oxygen doping treatment is performed on an insulating film which is not yet subjected to heat treatment for dehydration or dehydrogenation treatment is performed, dehydration or dehydrogenation treatment of the insulating film can be performed effectively.

Accordingly, a transistor having stable electric characteristics can be manufactured.

In addition, according to one embodiment of the present invention, a semiconductor device having the transistor with high electric characteristics and reliability can be manufactured.

The structures, methods, and the like described in this embodiment can be combined as appropriate with any of the structures, methods, and the like described in the other embodiments.

(Embodiment 8)

A semiconductor device having a display function (also referred to as a display device) can be manufactured using any of the transistors described in Embodiments 1 to 7. Further, part or all of the driver circuitry which includes the transistor can be formed over a substrate where a pixel portion is formed, whereby a system-on-panel can be formed.

Figure 8A:
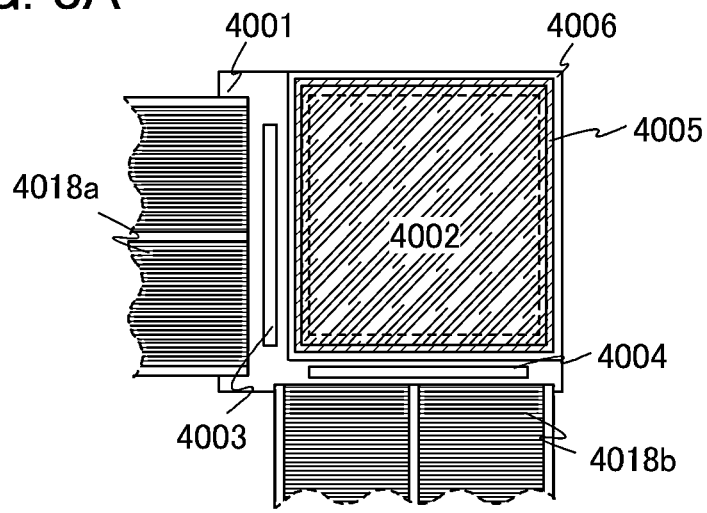
FIGS. 8A to 8C are plan views each illustrating one embodiment of a semiconductor device.

In FIG. 8A, a sealant 4005 is provided so as to surround a pixel portion 4002 provided over a substrate 4001, and the pixel portion 4002 is sealed with a substrate 4006. In FIG. 8A, a scan line driver circuit 4004 and a signal line driver circuit 4003 which are each formed using a single crystal semiconductor film or a polycrystalline semiconductor film over an IC chip or a substrate separately prepared are mounted in a region that is different from the region surrounded by the sealant 4005 over the substrate 4001. A variety of signals and potentials are supplied to the signal line driver circuit 4003 and the scan line driver circuit 4004 each of which is separately formed, and the pixel portion 4002 from flexible printed circuits (FPCs) 4018a and 4018b.

Figure 8B:
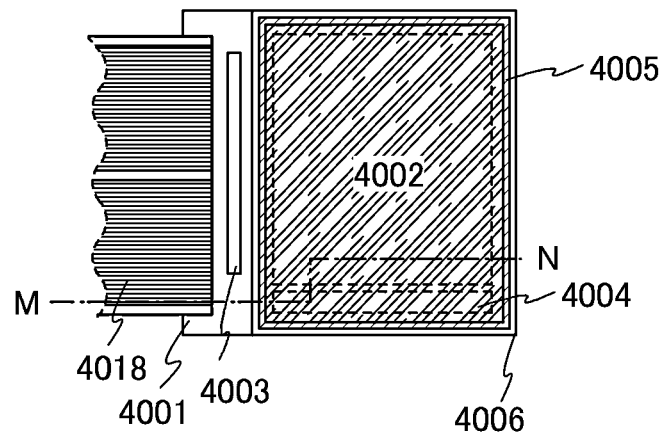
Figure 8C:
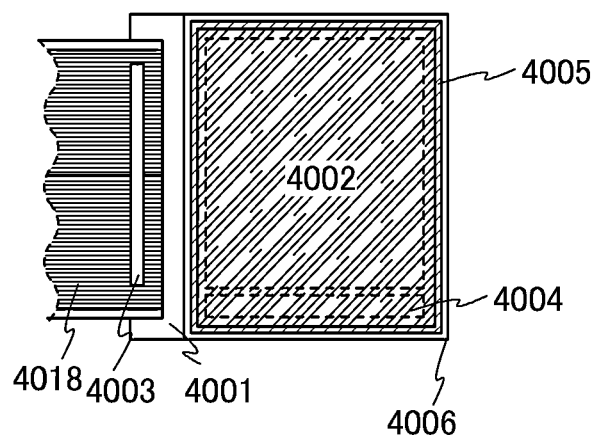

In FIGS. 8B and 8C, the sealant 4005 is provided so as to surround the pixel portion 4002 and the scan line driver circuit 4004 which are provided over the substrate 4001. The substrate 4006 is provided over the pixel portion 4002 and the scan line driver circuit 4004. Consequently, the pixel portion 4002 and the scan line driver circuit 4004 are sealed together with a display element by the substrate 4001, the sealant 4005, and the substrate 4006. In FIGS. 8B and 8C, the signal line driver circuit 4003 which is formed using a single crystal semiconductor film or a polycrystalline semiconductor film over an IC chip or a substrate separately prepared is mounted in a region that is different from the region surrounded by the sealant 4005 over the substrate 4001. In FIGS. 8B and 8C, a variety of signals and potentials are supplied to the signal line driver circuit 4003 which is separately formed, the scan line driver circuit 4004, and the pixel portion 4002 from the FPC 4018.

Although FIGS. 8B and 8C each illustrate an example in which the signal line driver circuit 4003 is formed separately and mounted on the substrate 4001, one embodiment of the present invention is not limited to this structure. The scan line driver circuit may be formed separately and then mounted, or only part of the signal line driver circuit or part of the scan line driver circuit may be formed separately and then mounted.

Note that there is no particular limitation on a connection method of a separately formed driver circuit, and a chip on glass (COG) method, a wire bonding method, a tape automated bonding (TAB) method, or the like can be used. FIG. 8A illustrates an example in which the signal line driver circuit 4003 and the scan line driver circuit 4004 are mounted by a COG method. FIG. 8B illustrates an example in which the signal line driver circuit 4003 is mounted by a COG method. FIG. 8C illustrates an example in which the signal line driver circuit 4003 is mounted by a TAB method.

The display device includes, in its category, a panel in which a display element is sealed, and a module in which an IC or the like including a controller is mounted on the panel.

Note that a display device in this specification means an image display device, a display device, or a light source (including a lighting device). Further, the display device also includes the following modules in its category: a module to which a connector such as an FPC, a TAB tape, or a TCP is attached; a module having a TAB tape or a TCP at the tip of which a printed wiring board is provided; and a module in which an integrated circuit (IC) is directly mounted on a display element by a COG method.

The pixel portion and the scan line driver circuit provided over the substrate include a plurality of transistors, and the transistor described in any of Embodiments 1 to 7 can be applied thereto.

As the display element provided in the display device, a liquid crystal element (also referred to as a liquid crystal display element) or a light-emitting element (also referred to as a light-emitting display element) can be used. The light-emitting element includes, in its category, an element whose luminance is controlled by a current or a voltage, and specifically includes, in its category, an inorganic electroluminescent (EL) element, an organic EL element, and the like. Further, a display medium whose contrast is changed by an electric effect, such as electronic ink, can be used.

Embodiments of the semiconductor device will be described with reference to FIGS. 8A to 8C, FIGS. 9A and 9B, and FIGS. 10A and 10B. FIGS. 10A and 10B correspond to the cross-sectional view taken along line M-N in FIG. 8B.

As illustrated in FIGS. 8A to 8C and FIGS. 10A and 10B, the semiconductor device includes a connection terminal electrode 4015 and a terminal electrode 4016. The connection terminal electrode 4015 and the terminal electrode 4016 are electrically connected to a terminal included in the FPC 4018 (FPCs 4018a and 4018b) through an anisotropic conductive film 4019.

The connection terminal electrode 4015 is formed using the same conductive film as a first electrode layer 4030, and the terminal electrode 4016 is formed using the same conductive film as source electrode layers and drain electrode layers of the transistors 4040 and 4011.

The pixel portion 4002 and the scan line driver circuit 4004 which are provided over the substrate 4001 include a plurality of transistors. FIGS. 8A to 8C and FIGS. 10A and 10B illustrate the transistor 4040 included in the pixel portion 4002 and the transistor 4011 included in the scan line driver circuit 4004. In FIG. 10A, an insulating film 4020 is provided over the transistors 4040 and 4011, and in FIG. 10B, an insulating film 4021 is further provided.

The transistor described in any of Embodiments 1 to 7 can be applied to the transistor 4010 and the transistor 4011. In this embodiment, an example in which a transistor having a structure which is similar to that of the transistor 440 described in Embodiment 1 is used will be described. The transistors 4010 and 4011 are each a staggered transistor having a bottom-gate structure.

The transistors 4010 and 4011 are manufactured by performing dehydration or dehydrogenation treatment by heat treatment and then oxygen doping treatment on a gate insulating film and/or the insulating film 4020 which are/is in contact with the oxide semiconductor film. Therefore, impurities such as hydrogen and water causing variation in characteristics of the transistors 4010 and 4011 are not mixed into the oxide semiconductor film and oxygen repairing oxygen vacancies is supplied thereto. Thus, the transistors 4010 and 4011 have less change in electric characteristics.

Thus, the semiconductor devices including the transistors 4010 and 4011 using an oxide semiconductor film and having stable electric characteristics, illustrated in FIGS. 8A to 8C and FIGS. 10A and 10B according to this embodiment, can have high reliability.

A conductive layer may be further provided so as to overlap with the channel formation region of the oxide semiconductor film of the transistor 4011 for the driver circuit. By providing the conductive layer so as to overlap with the channel formation region of the oxide semiconductor film, the amount of change in the threshold voltage of the transistor 4011 from before to after a bias-temperature stress test (BT test) can be further reduced. The conductive layer may have the same potential as or a potential different from that of the gate electrode layer of the transistor 4011, and can function as a second gate electrode layer. The potential of the conductive layer may be GND or 0 V, or the conductive layer may be in a floating state.

In addition, the conductive layer has a function of blocking an external electric field, that is, a function of preventing an external electric field (particularly, a function of preventing static electricity) from affecting the inside (a circuit portion including a transistor). The blocking function of the conductive layer can prevent fluctuation in electric characteristics of the transistor due to the influence of an external electric field such as static electricity.

The transistor 4010 included in the pixel portion 4002 is electrically connected to a display element to form a display panel. There is no particular limitation on the kind of display element as long as display can be performed, and a variety of kinds of display elements can be employed.

An example of a liquid crystal display device using a liquid crystal element as a display element is illustrated in FIG. 10A. In FIG. 10A, a liquid crystal element 4013 which is a display element includes the first electrode layer 4030, a second electrode layer 4031, and a liquid crystal layer 4008. Insulating films 4032 and 4033 serving as alignment films are provided so that the liquid crystal layer 4008 is sandwiched therebetween. The second electrode layer 4031 is provided on the substrate 4006 side, and the first electrode layer 4030 and the second electrode layer 4031 are stacked with the liquid crystal layer 4008 provided therebetween.

A spacer 4035 is a columnar spacer which is obtained by selective etching of an insulating film, and is provided in order to control the thickness of the liquid crystal layer 4008 (cell gap). Alternatively, a spherical spacer may be used.

In the case where a liquid crystal element is used as the display element, a thermotropic liquid crystal, a low-molecular liquid crystal, a high-molecular liquid crystal, a polymer dispersed liquid crystal, a ferroelectric liquid crystal, an anti-ferroelectric liquid crystal, or the like can be used. Such a liquid crystal material (liquid crystal composition) exhibits a cholesteric phase, a smectic phase, a cubic phase, a chiral nematic phase, an isotropic phase, or the like depending on conditions.

Alternatively, a liquid crystal composition exhibiting a blue phase for which an alignment film is unnecessary may be used for the liquid crystal layer 4008. In this case, the liquid crystal layer 4008 is in contact with the first electrode layer 4030 and the second electrode layer 4031. A blue phase is one of liquid crystal phases, which is generated just before a cholesteric phase changes into an isotropic phase while the temperature of a cholesteric liquid crystal is increased. The blue phase can be exhibited using a liquid crystal composition which is a mixture of a liquid crystal and a chiral agent. To increase the temperature range where the blue phase is exhibited, a liquid crystal layer may be formed by adding a polymerizable monomer, a polymerization initiator, and the like to a liquid crystal composition exhibiting a blue phase and by performing polymer stabilization treatment. The liquid crystal composition exhibiting a blue phase has a short response time, and has optical isotropy, which makes the alignment process unnecessary and the viewing angle dependence small. In addition, since an alignment film does not need to be provided and rubbing treatment is unnecessary, electrostatic discharge damage caused by the rubbing treatment can be prevented and defects and damage of the liquid crystal display device in the manufacturing process can be reduced. Thus, productivity of the liquid crystal display device can be improved. A transistor including an oxide semiconductor film has a possibility that the electric characteristics of the transistor may fluctuate significantly by the influence of static electricity and deviate from the designed range. Thus, it is more effective to use a liquid crystal composition exhibiting a blue phase for the liquid crystal display device including the transistor including an oxide semiconductor film.

The specific resistivity of the liquid crystal material is higher than or equal to $1 \times 10^9$ Ω·cm, preferably higher than or equal to $1 \times 10^{11}$ Ω·cm, further preferably higher than or equal to $1 \times 10^{12}$ Ω·cm. Note that the specific resistivity in this specification is measured at 20° C.

The size of a storage capacitor formed in the liquid crystal display device is set considering the leakage current of the transistor provided in the pixel portion or the like so that charge can be held for a predetermined period. The size of the storage capacitor may be set considering the off-state current of the transistor or the like. By using the transistor including an oxide semiconductor film, which is disclosed in this specification, it is enough to provide a storage capacitor having a capacitance that is 1/3 or less, preferably 1/5 or less of liquid crystal capacitance of each pixel.

In the transistor including an oxide semiconductor film, which is disclosed in this specification, the current in an off state (off-state current) can be made small. Accordingly, an electric signal such as an image signal can be held for a longer period, and a writing interval can be set longer in an on state. Thus, the frequency of refresh operation can be reduced, which leads to an effect of suppressing power consumption.

The transistor including an oxide semiconductor film, which is disclosed in this specification, can have relatively high field-effect mobility and thus can operate at high speed. For example, when such a transistor which can operate at high speed is used for a liquid crystal display device, a switching transistor in a pixel portion and a driver transistor in a driver circuit portion can be formed over one substrate. That is, since a semiconductor device formed of a silicon wafer or the like is not additionally needed as a driver circuit, the number of components of the semiconductor device can be reduced. In addition, by using the transistor which can operate at high speed in the pixel portion, a high-quality image can be provided.

For the liquid crystal display device, a twisted nematic (TN) mode, an in-plane-switching (IPS) mode, a fringe field switching (FFS) mode, an axially symmetric aligned microcell (ASM) mode, an optical compensated birefringence (OCB) mode, a ferroelectric liquid crystal (FLC) mode, an anti-ferroelectric liquid crystal (AFLC) mode, or the like can be used.

A normally black liquid crystal display device such as a transmissive liquid crystal display device utilizing a vertical alignment (VA) mode may be used. Some examples can be given as the vertical alignment mode, and for example a multi-domain vertical alignment (MVA) mode, a patterned vertical alignment (PVA) mode, or an advanced super view (ASV) mode can be used. This embodiment can also be applied to a VA liquid crystal display device. The VA mode is a kind of mode in which alignment of liquid crystal molecules of a liquid crystal display panel is controlled. In the VA liquid crystal display device, liquid crystal molecules are aligned in a vertical direction with respect to a panel surface when no voltage is applied to the display device. It is also possible to use a method called domain multiplication or multi-domain design, in which a pixel is divided into some regions (subpixels) and molecules are aligned in different directions in the respective regions.

In the display device, a black matrix (light-blocking layer), an optical member (optical substrate) such as a polarizing member, a retardation member, or an anti-reflection member, and the like are provided as appropriate. For example, circular polarization may be obtained by using a polarizing substrate and a retardation substrate. In addition, a backlight, a side light, or the like may be used as a light source.

As a display method in the pixel portion, a progressive method, an interlace method, or the like can be employed. Further, color elements controlled in a pixel at the time of color display are not limited to three colors of R, G, and B (R, G, and B correspond to red, green, and blue, respectively). For example, R, G, B, and W (W corresponds to white); or R, G, B, and one or more of yellow, cyan, magenta, and the like can be used. The sizes of display regions may differ between respective dots of color elements. Note that one embodiment of the invention disclosed herein is not limited to the application to a display device for color display and can also be applied to a display device for monochrome display.

Alternatively, as the display element included in the display device, a light-emitting element utilizing electroluminescence can be used. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of voltage to a light-emitting element, electrons and holes are separately injected from a pair of electrodes into a layer containing a light-emitting organic compound, and current flows. The carriers (electrons and holes) are recombined, and thus, the light-emitting organic compound is excited. The light-emitting organic compound returns to a ground state from the excited state, thereby emitting light. Owing to such a mechanism, this light-emitting element is referred to as a current-excitation light-emitting element. In this embodiment, an example of using an organic EL element as a light-emitting element is described.

Inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that an example of an organic EL element as a light-emitting element is described here.

To extract light emitted from the light-emitting element, at least one of the pair of electrodes has a light-transmitting property. A transistor and the light-emitting element are formed over a substrate. The light-emitting element can have any of the following structures: a top emission structure in which light emission is extracted through a surface opposite to the substrate; a bottom emission structure in which light emission is extracted through a surface on the substrate side; and a dual emission structure in which light emission is extracted through the surface opposite to the substrate and the surface on the substrate side.

Figure 9A:
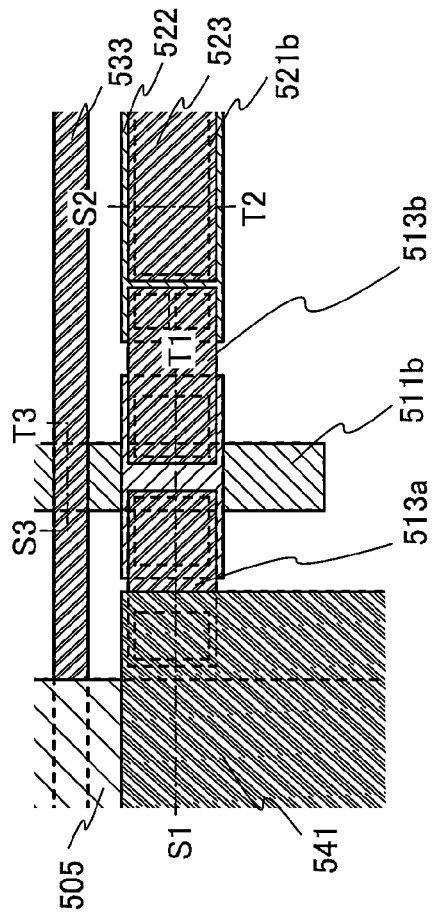
FIGS. 9A and 9B are a plan view and a cross-sectional view illustrating one embodiment of a semiconductor device.
Figure 9B:
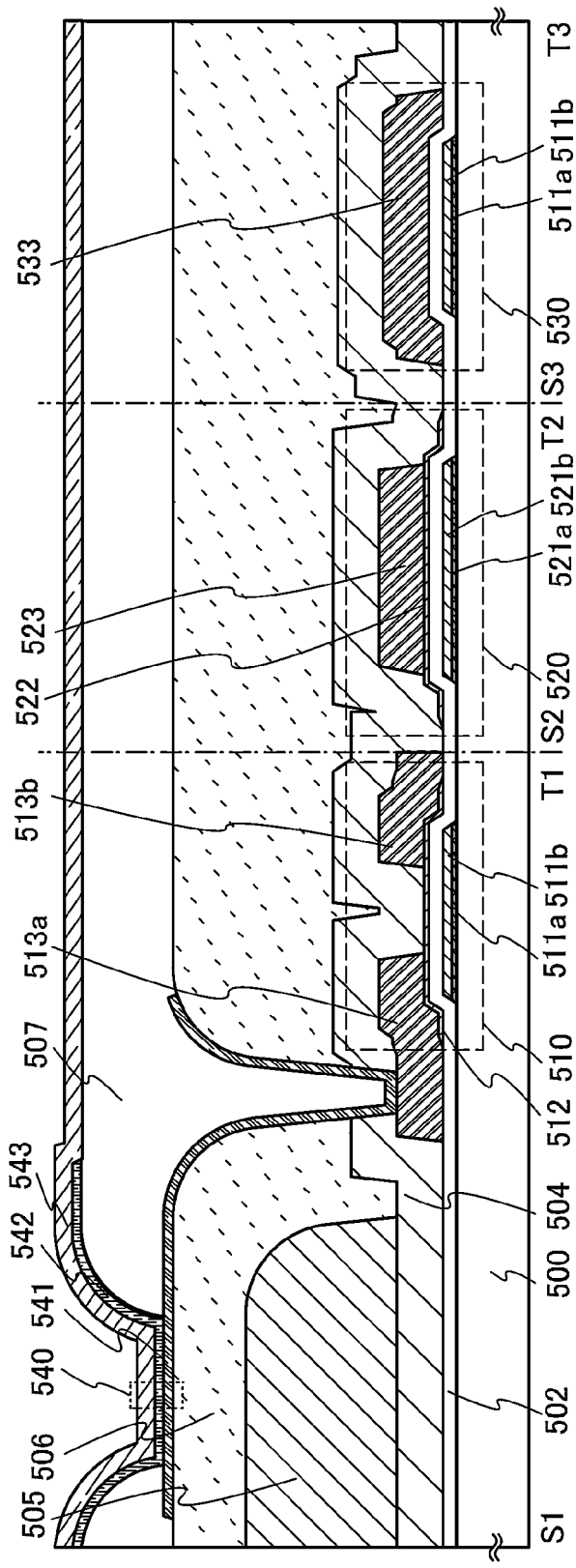

FIGS. 9A and 9B and FIG. 10B illustrate examples of a light-emitting device including a light-emitting element as a display element.

FIG. 9A is a plan view of a light-emitting device and FIG. 9B is a cross-sectional view taken along dashed-dotted lines S1-T1, S2-T2, and S3-T3 in FIG. 9A. Note that, an electroluminescent layer 542 and a second electrode layer 543 are not illustrated in the plan view in FIG. 9A.

The light-emitting device illustrated in FIGS. 9A and 9B includes, over a substrate 500, a transistor 510, a capacitor 520, and an intersection 530 of wiring layers. The transistor 510 is electrically connected to a light-emitting element 540. Note that FIGS. 9A and 9B illustrate a bottom-emission light-emitting device in which light from the light-emitting element 540 is extracted through the substrate 500.

The transistor described in any of Embodiments 1 to 7 can be applied to the transistor 510. In this embodiment, an example in which a transistor having a structure which is similar to that of the transistor 440 described in Embodiment 1 is used will be described. The transistor 510 is a staggered transistor having a bottom-gate structure.

The transistor 510 includes gate electrode layers 511a and 511b, a gate insulating film 502, an oxide semiconductor film 512, and conductive layers 513a and 513b functioning as a source electrode layer and a drain electrode layer.

The transistor 510 is manufactured by performing dehydration or dehydrogenation treatment by heat treatment and then oxygen doping treatment on the gate insulating film 502 and/or the interlayer insulating film 504 which are/is in contact with the oxide semiconductor film. Therefore, impurities such as hydrogen and water causing variation in characteristics of the transistor 510 are not mixed into the oxide semiconductor film and oxygen repairing oxygen vacancies is supplied thereto. Thus, the transistor 510 has less change in electric characteristics.

Thus, the semiconductor device including the transistor 510 using the oxide semiconductor film 512 and having stable electric characteristics, illustrated in FIGS. 9A and 9B according to this embodiment, can have high reliability. Further, such a highly reliable semiconductor device can be manufactured with a high yield, so that high productivity can be achieved.

The capacitor 520 includes conductive layers 521a and 521b, the gate insulating film 502, an oxide semiconductor film 522, and a conductive layer 523. The gate insulating film 502 and the oxide semiconductor film 522 are sandwiched between the conductive layer 523 and the conductive layers 521a and 521b, so that the capacitor is formed.

The intersection 530 of wiring layers is an intersection of a conductive layer 533 and the gate electrode layers 511a and 511b. The conductive layer 533 and the gate electrode layers 511a and 511b intersect with each other with the gate insulating film 502 provided therebetween.

In this embodiment, a 30-nm-thick titanium film is used as the gate electrode layer 511a and the conductive layer 521a, and a 200-nm-thick copper thin film is used as the gate electrode layer 511b and the conductive layer 521b. Thus, the gate electrode layer has a stacked-layer structure of a titanium film and a copper thin film.

A 25-nm-thick IGZO film is used as the oxide semiconductor films 512 and 522.

An interlayer insulating film 504 is formed over the transistor 510, the capacitor 520, and the intersection 530 of wiring layers. Over the interlayer insulating film 504, a color filter layer 505 is provided in a region overlapping with the light-emitting element 540. An insulating film 506 functioning as a planarization insulating film is provided over the interlayer insulating film 504 and the color filter layer 505.

The light-emitting element 540 having a stacked-layer structure in which a first electrode layer 541, the electroluminescent layer 542, and the second electrode layer 543 are stacked in that order is provided over the insulating film 506. The first electrode layer 541 and the conductive layer 513a are in contact with each other in an opening formed in the insulating film 506 and the interlayer insulating film 504, which reaches the conductive layer 513a; thus the light-emitting element 540 and the transistor 510 are electrically connected to each other. Note that a partition 507 is provided so as to cover part of the first electrode layer 541 and the opening.

As the interlayer insulating film 504, a silicon oxynitride film having a thickness greater than or equal to 200 nm and less than or equal to 600 nm, which is formed by a plasma CVD method can be used. Further, a photosensitive acrylic film having a thickness of 1500 nm and a photosensitive polyimide film having a thickness of 1500 nm can be used as the insulating film 506 and the partition 507, respectively.

As the color filter layer 505, for example, a chromatic light-transmitting resin can be used. As such a chromatic light-transmitting resin, a photosensitive organic resin or a nonphotosensitive organic resin can be used. A photosensitive organic resin layer is preferably used, because the number of resist masks can be reduced, leading to simplification of a process.

Chromatic colors are colors except achromatic colors such as black, gray, and white. The color filter layer is formed using a material which transmits only light of the chromatic color. As chromatic color, red, green, blue, or the like can be used. Cyan, magenta, yellow, or the like may also be used. "Transmitting only light of the chromatic color" means that the light transmitted through the color filter layer has a peak at a wavelength of light of the chromatic color. The thickness of the color filter layer may be controlled to be optimal as appropriate in consideration of the relationship between the concentration of a coloring material to be contained and the transmittance of light. For example, the color filter layer 505 may have a thickness greater than or equal to 1500 nm and less than or equal to 2000 nm.

In the light-emitting device illustrated in FIG. 10B, a light-emitting element 4513 which is a display element is electrically connected to the transistor 4010 provided in the pixel portion 4002. A structure of the light-emitting element 4513 is not limited to the shown stacked-layer structure including the first electrode layer 4030, an electroluminescent layer 4511, and the second electrode layer 4031. The structure of the light-emitting element 4513 can be changed as appropriate depending on a direction in which light is extracted from the light-emitting element 4513, or the like.

Partitions 4510 and 507 can be formed using an organic insulating material or an inorganic insulating material. It is particularly preferable that the partitions 4510 and 507 be formed using a photosensitive resin material to have openings over the first electrode layers 4030 and 541, respectively. A sidewall of each opening is formed as a tilted surface with continuous curvature.

The electroluminescent layers 4511 and 542 may be formed using either a single layer or a plurality of layers stacked.

A protective film may be formed over the second electrode layer 4031 and the partition 4510 and over the second electrode layer 543 and the partition 507 in order to prevent entry of oxygen, hydrogen, moisture, carbon dioxide, or the like into the light-emitting elements 4513 and 540. As the protective film, a silicon nitride film, a silicon nitride oxide film, a DLC film, or the like can be formed.

Further, the light-emitting elements 4513 and 540 may be covered with respective layers containing an organic compound deposited by an evaporation method so that oxygen, hydrogen, moisture, carbon dioxide, or the like do not enter the light-emitting elements 4513 and 540.

In addition, in a space which is sealed with the substrate 4001, the substrate 4006, and the sealant 4005, a filler 4514 is provided. In this manner, it is preferable that a panel be packaged (sealed) with a protective film (such as a laminate film or an ultraviolet curable resin film) or a cover material with high air-tightness and little degasification so that the panel is not exposed to the outside air.

As the filler 4514, an ultraviolet curable resin or a thermosetting resin can be used as well as an inert gas such as nitrogen or argon. For example, polyvinyl chloride (PVC), acrylic, polyimide, an epoxy resin, a silicone resin, polyvinyl butyral (PVB), or ethylene vinyl acetate (EVA) can be used. For example, nitrogen is used as the filler.

In addition, as needed, an optical film such as a polarizing plate, a circularly polarizing plate (including an elliptically polarizing plate), a retardation plate (a quarter-wave plate or a half-wave plate), or a color filter may be provided as appropriate on a light-emitting surface of the light-emitting element. Further, the polarizing plate or the circularly polarizing plate may be provided with an anti-reflection film. For example, anti-glare treatment by which reflected light can be diffused by projections and depressions on the surface so as to reduce the glare can be performed.

Further, an electronic paper in which electronic ink is driven can be provided as the display device. The electronic paper is also referred to as an electrophoretic display device (an electrophoretic display) and is advantageous in that it has the same level of readability as plain paper, it has lower power consumption than other display devices, and it can be made thin and lightweight.

An electrophoretic display device can have various modes. An electrophoretic display device contains a plurality of microcapsules dispersed in a solvent or a solute, each microcapsule containing first particles which are positively charged and second particles which are negatively charged. By applying an electric field to the microcapsules, the first particles and the second particles in the microcapsules move in opposite directions to each other and only the color of the particles gathering on one side is displayed. Note that the first particles and the second particles each contain pigment and do not move without an electric field. Moreover, the first particles and the second particles have different colors (which may be colorless).

Thus, an electrophoretic display device is a display device that utilizes a so-called dielectrophoretic effect by which a substance having a high dielectric constant moves to a high-electric field region.

A solution in which the above microcapsules are dispersed in a solvent is referred to as electronic ink. This electronic ink can be printed on a surface of glass, plastic, cloth, paper, or the like. Furthermore, by using a color filter or particles that have a pigment, color display can also be achieved.

Note that the first particles and the second particles in the microcapsules may each be formed of a single material selected from a conductive material, an insulating material, a semiconductor material, a magnetic material, a liquid crystal material, a ferroelectric material, an electroluminescent material, an electrochromic material, and a magnetophoretic material, or formed of a composite material of any of these.

As the electronic paper, a display device using a twisting ball display system can be used. The twisting ball display system refers to a method in which spherical particles each colored in black and white are arranged between a first electrode layer and a second electrode layer which are electrode layers used for a display element, and a potential difference is generated between the first electrode layer and the second electrode layer to control orientation of the spherical particles, so that display is performed.

In FIGS. 8A to 8C, FIGS. 9A and 9B, and FIGS. 10A and 10B, a flexible substrate as well as a glass substrate can be used as any of the substrates 4001 and 500 and the substrate 4006. For example, a plastic substrate having a light-transmitting property or the like can be used. As the plastic substrate, a fiberglass-reinforced plastics (FRP) plate, a polyvinyl fluoride (PVF) film, a polyester film, or an acrylic resin film can be used. In the case where a light-transmitting property is not needed, a metal substrate (metal film) of aluminum, stainless steel, or the like may be used. For example, a sheet with a structure in which an aluminum foil is sandwiched between PVF films or polyester films can be used.

In this embodiment, a silicon oxynitride film formed by a plasma CVD method is used as the insulating film 4020, and heat treatment for dehydration or dehydrogenation and oxygen doping treatment are performed.

Moreover, it is preferable that heat treatment be performed on an aluminum oxide film formed over a silicon oxynitride film subjected to the heat treatment for dehydration or dehydrogenation and the oxygen doping treatment.

The aluminum oxide film has a high shielding effect (blocking effect) of preventing penetration of both oxygen and impurities such as hydrogen and moisture.

Therefore, the aluminum oxide film, during and after the manufacturing process, functions as a protective film preventing mixture of impurities such as hydrogen and moisture which become variation in characteristics into the silicon oxynitride film on which the heat treatment for dehydration or dehydrogenation treatment and the oxygen doping treatment are performed, and release of oxygen from the silicon oxynitride film.

The insulating films 4021 and 506 serving as planarization insulating films can be formed using an organic material having heat resistance, such as an acrylic-, polyimide-, or benzocyclobutene-based resin, polyamide, or epoxy. Other than such organic materials, it is also possible to use a low-dielectric constant material (low-k material), a siloxane-based resin, phosphosilicate glass (PSG), borophosphosilicate glass (BPSG), or the like. Note that the insulating film may be formed by stacking a plurality of insulating films formed using any of these materials.

There is no particular limitation on the methods of forming the insulating films 4021 and 506, and the following method or tool (equipment) can be used depending on the material: a sputtering method, spin coating, dipping, spray coating, a droplet discharge method (such as an inkjet method), a printing method (such as screen printing or offset printing), a doctor knife, a roll coater, a curtain coater, a knife coater, or the like.

The display device displays an image by transmitting light from a light source or a display element. Thus, the substrate and the thin films such as the insulating film and the conductive film provided for the pixel portion where light is transmitted all have light-transmitting properties with respect to light in the visible light wavelength range.

The first electrode layer and the second electrode layer (which may be called a pixel electrode layer, a common electrode layer, a counter electrode layer, or the like) for applying voltage to the display element may have light-transmitting properties or light-reflecting properties, which depends on the direction in which light is extracted, the position where the electrode layer is provided, the pattern structure of the electrode layer, and the like.

The first electrode layers 4030 and 541 and the second electrode layers 4031 and 543 can be formed using a light-transmitting conductive material such as indium oxide containing tungsten oxide, indium zinc oxide containing tungsten oxide, indium oxide containing titanium oxide, indium tin oxide containing titanium oxide, indium tin oxide, indium zinc oxide, indium tin oxide to which silicon oxide is added, or graphene.

The first electrode layers 4030 and 541 and the second electrode layers 4031 and 543 can be formed using one or plural kinds selected from metals such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), and silver (Ag); alloys thereof; and nitrides thereof.

In this embodiment, since the light-emitting device illustrated in FIGS. 9A and 9B has a bottom-emission structure, the first electrode layer 541 has a light-transmitting property and the second electrode layer 543 has a light-reflecting property. Accordingly, in the case of using a metal film as the first electrode layer 541, the film is preferably thin enough to secure a light-transmitting property; and in the case of using a light-transmissive conductive film as the second electrode layer 543, a conductive film having a light-reflecting property is preferably stacked therewith.

A conductive composition containing a conductive high molecule (also referred to as a conductive polymer) can be used for the first electrode layers 4030 and 541 and the second electrode layers 4031 and 543. As the conductive high molecule, what is called a π-electron conjugated conductive polymer can be used. For example, polyaniline or a derivative thereof, polypyrrole or a derivative thereof, polythiophene or a derivative thereof, a copolymer of two or more of aniline, pyrrole, and thiophene or a derivative thereof can be given.

Since the transistor is easily broken by static electricity or the like, a protection circuit for protecting the driver circuit is preferably provided. The protection circuit is preferably formed using a nonlinear element.

As described above, by using the transistor described in any of Embodiments 1 to 7, a semiconductor device having a variety of functions can be provided.

The structures, methods, and the like described in this embodiment can be combined as appropriate with any of the structures, methods, and the like described in the other embodiments.

(Embodiment 9)

A semiconductor device having an image sensor function of reading information on an object can be manufactured using the transistor described in any of Embodiments 1 to 7.

Figure 11A:
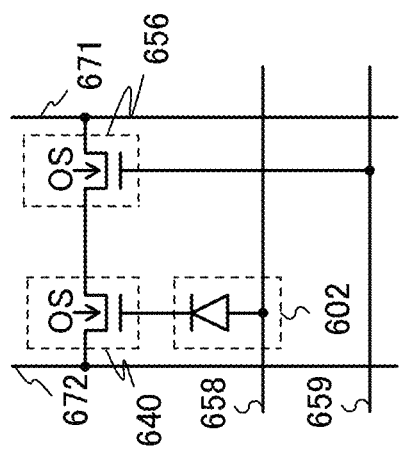
FIGS. 11A and 11B are a circuit diagram and a cross-sectional view illustrating one embodiment of a semiconductor device.

FIG. 11A illustrates an example of a semiconductor device having an image sensor function. FIG. 11A is an equivalent circuit diagram of a photosensor, and FIG. 11B is a cross-sectional view of part of the photosensor.

One electrode of a photodiode 602 is electrically connected to a photodiode reset signal line 658, and the other electrode of the photodiode 602 is electrically connected to a gate of a transistor 640. One of a source and a drain of the transistor 640 is electrically connected to a photosensor reference signal line 672, and the other of the source and the drain of the transistor 640 is electrically connected to one of a source and a drain of a transistor 656. A gate of the transistor 656 is electrically connected to a gate signal line 659, and the other of the source and the drain thereof is electrically connected to a photosensor output signal line 671.

Note that in a circuit diagram in this specification, a transistor including an oxide semiconductor film is denoted by a symbol "OS" so that it can be identified as a transistor including an oxide semiconductor film. In FIG. 11A, the transistor 640 and the transistor 656 are each a transistor including an oxide semiconductor film, to which the transistor described in any of Embodiments 1 to 7 can be applied. Described in this embodiment is an example in which a transistor having a structure which is similar to that of the transistor 440 described in Embodiment 1 is applied. The transistor 640 is a staggered transistor having a bottom-gate structure.

Figure 11B:
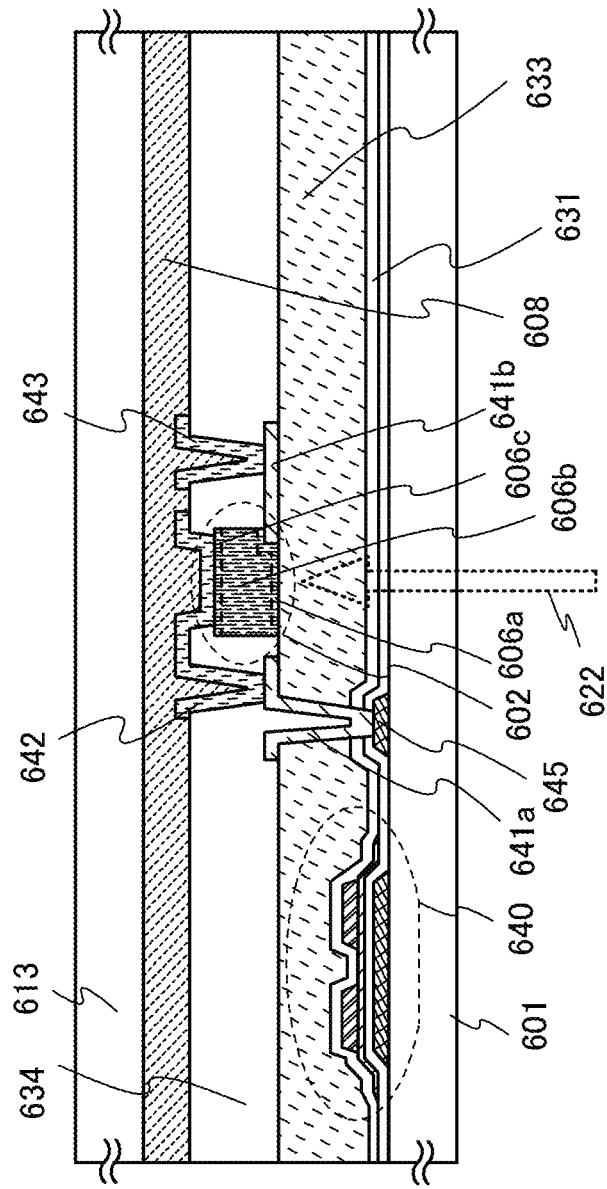

FIG. 11B is a cross-sectional view of the photodiode 602 and the transistor 640 in the photosensor. The transistor 640 and the photodiode 602 functioning as a sensor are provided over a substrate 601 (element substrate) having an insulating surface. A substrate 613 is provided over the photodiode 602 and the transistor 640 with the use of an adhesive layer 608.

An insulating film 631, an interlayer insulating film 633, and an interlayer insulating film 634 are provided over the transistor 640. The photodiode 602 is provided over the interlayer insulating film 633. In the photodiode 602, a first semiconductor film 606a, a second semiconductor film 606b, and a third semiconductor film 606c are sequentially stacked from the interlayer insulating film 633 side, between an electrode layer 642 formed over the interlayer insulating film 634 and electrode layers 641a and 641b formed over the interlayer insulating film 633.

The electrode layer 641b is electrically connected to a conductive layer 643 formed over the interlayer insulating film 634, and the electrode layer 642 is electrically connected to a conductive layer 645 through the electrode layer 641a. The conductive layer 645 is electrically connected to the gate electrode layer of the transistor 640, and the photodiode 602 is electrically connected to the transistor 640.

Here, a pin photodiode in which a semiconductor film having p-type conductivity as the first semiconductor film 606a, a high-resistance semiconductor film (i-type semiconductor film) as the second semiconductor film 606b, and a semiconductor film having n-type conductivity as the third semiconductor film 606c are stacked is illustrated as an example.

The first semiconductor film 606a is a p-type semiconductor film and can be formed using an amorphous silicon film containing an impurity element imparting p-type conductivity. The first semiconductor film 606a is formed by a plasma CVD method with the use of a semiconductor source gas containing an impurity element belonging to Group 13 (e.g., boron (B)). As the semiconductor source gas, silane ($SiH_4$) may be used. Alternatively, $Si_2H_6$, $SiH_2Cl_2$, $SiHCl_3$, $SiCl_4$, $SiF_4$, or the like may be used. Further alternatively, an amorphous silicon film which does not contain an impurity element may be formed, and then an impurity element may be introduced into the amorphous silicon film by a diffusion method or an ion implantation method. Heating or the like may be conducted after introducing the impurity element by an ion implantation method or the like to diffuse the impurity element. In this case, as a method for forming the amorphous silicon film, an LPCVD method, a vapor deposition method, a sputtering method, or the like may be used. The first semiconductor film 606a is preferably formed to have a thickness greater than or equal to 10 nm and less than or equal to 50 nm.

The second semiconductor film 606b is an i-type semiconductor film (intrinsic semiconductor film) and is formed using an amorphous silicon film. As for formation of the second semiconductor film 606b, an amorphous silicon film is formed by a plasma CVD method with the use of a semiconductor source gas. As the semiconductor source gas, silane ($SiH_4$) may be used. Alternatively, $Si_2H_6$, $SiH_2Cl_2$, $SiHCl_3$, $SiCl_4$, $SiF_4$, or the like may be used. The second semiconductor film 606b may be formed by an LPCVD method, a vapor deposition method, a sputtering method, or the like. The second semiconductor film 606b is preferably formed to have a thickness greater than or equal to 200 nm and less than or equal to 1000 nm.

The third semiconductor film 606c is an n-type semiconductor film and is formed using an amorphous silicon film containing an impurity element imparting n-type conductivity. The third semiconductor film 606c is formed by a plasma CVD method with the use of a semiconductor source gas containing an impurity element belonging to Group 15 (e.g., phosphorus (P)). As the semiconductor source gas, silane ($SiH_4$) may be used. Alternatively, $Si_2H_6$, $SiH_2Cl_2$, $SiHCl_3$, $SiCl_4$, $SiF_4$, or the like may be used. Further alternatively, an amorphous silicon film which does not contain an impurity element may be formed, and then an impurity element may be introduced into the amorphous silicon film by a diffusion method or an ion implantation method. Heating or the like may be conducted after introducing the impurity element by an ion implantation method or the like to diffuse the impurity element. In this case, as a method for forming the amorphous silicon film, an LPCVD method, a vapor deposition method, a sputtering method, or the like may be used. The third semiconductor film 606c is preferably formed to have a thickness greater than or equal to 20 nm and less than or equal to 200 nm.

The first semiconductor film 606a, the second semiconductor film 606b, and the third semiconductor film 606c are not necessarily formed using an amorphous semiconductor, and may be formed using a polycrystalline semiconductor or a microcrystalline semiconductor (semi-amorphous semiconductor: SAS).

The mobility of holes generated by the photoelectric effect is lower than the mobility of electrons. Thus, a pin photodiode has better characteristics when a surface on the p-type semiconductor film side is used as a light-receiving plane. Here, an example in which light 622 that passes through a surface of the substrate 601, over which the pin photodiode is formed, is received and converted into electric signals by the photodiode 602 is described. Further, light from the semiconductor film having a conductivity type opposite to that of the semiconductor film on the light-receiving plane is disturbance light; thus, the electrode layer is preferably formed using a light-blocking conductive film. Note that a surface on the n-type semiconductor film side can alternatively be used as the light-receiving plane.

With the use of an insulating material, the insulating film 631, the interlayer insulating film 633 and the interlayer insulating film 634 can be formed, depending on the material, by a sputtering method, a plasma CVD method, spin coating, dipping, spray coating, a droplet discharge method (such as an inkjet method), a printing method (such as screen printing or offset printing), or the like.

The insulating film 631 can be formed using an inorganic insulating material and can have a single-layer structure or a stacked-layer structure including any of oxide insulating films such as a silicon oxide layer, a silicon oxynitride layer, an aluminum oxide layer, and an aluminum oxynitride layer; and nitride insulating films such as a silicon nitride layer, a silicon nitride oxide layer, an aluminum nitride layer, and an aluminum nitride oxide layer.

In this embodiment, a silicon oxynitride film formed by a plasma CVD method is used as the insulating film 631, and heat treatment for dehydration or dehydrogenation and oxygen doping treatment are performed.

Moreover, it is preferable that heat treatment be performed on an aluminum oxide film formed over a silicon oxynitride film subjected to the heat treatment for dehydration or dehydrogenation and the oxygen doping treatment.

The aluminum oxide film has a high shielding effect (blocking effect) of preventing penetration of both oxygen and impurities such as hydrogen and moisture.

Therefore, the aluminum oxide film, during and after the manufacturing process, functions as a protective film preventing mixture of impurities such as hydrogen and moisture which become variation in characteristics into the silicon oxynitride film on which the heat treatment for dehydration or dehydrogenation treatment and the oxygen doping treatment are performed, and release of oxygen from the silicon oxynitride film.

To reduce surface roughness, an insulating film functioning as a planarization insulating film is preferably used as each of the interlayer insulating films 633 and 634. For the interlayer insulating films 633 and 634, for example, an organic insulating material having heat resistance, such as polyimide, acrylic resin, a benzocyclobutene-based resin, polyamide, or an epoxy resin, can be used. Other than such organic insulating materials, it is possible to use a single layer or stacked layers of a low-dielectric constant material (low-k material), a siloxane-based resin, phosphosilicate glass (PSG), borophosphosilicate glass (BPSG), or the like.

By detection of light that enters the photodiode 602, information on a detection object can be read. Note that a light source such as a backlight can be used at the time of reading information on a detected object.

The transistor 640 is manufactured by performing dehydration or dehydrogenation treatment by heat treatment and then oxygen doping treatment on a gate insulating film and/or the insulating film 631 which are/is in contact with the oxide semiconductor film. Therefore, impurities such as hydrogen and water causing variation in characteristics of the transistor 640 are not mixed into the oxide semiconductor film and oxygen repairing oxygen vacancies is supplied thereto. Thus, the transistor 640 has less change in electric characteristics.

Thus, the semiconductor device including the transistor 640 using an oxide semiconductor film and having stable electric characteristics according to this embodiment can have high reliability. Further, such a highly reliable semiconductor device can be manufactured with a high yield, so that high productivity can be achieved.

The structures, methods, and the like described in this embodiment can be combined as appropriate with any of the structures, methods, and the like described in the other embodiments.

(Embodiment 10)

A semiconductor device disclosed in this specification can be applied to a variety of electronic devices (including game machines). Examples of electronic devices include a television set (also referred to as a television or a television receiver), a monitor of a computer or the like, cameras such as a digital camera and a digital video camera, a digital photo frame, a mobile phone, a portable game machine, a portable information terminal, an audio reproducing device, a game machine (e.g., a pachinko machine or a slot machine), a game console, and the like. Specific examples of such electronic devices are illustrated in FIGS. 12A to 12C.

Figure 12A:
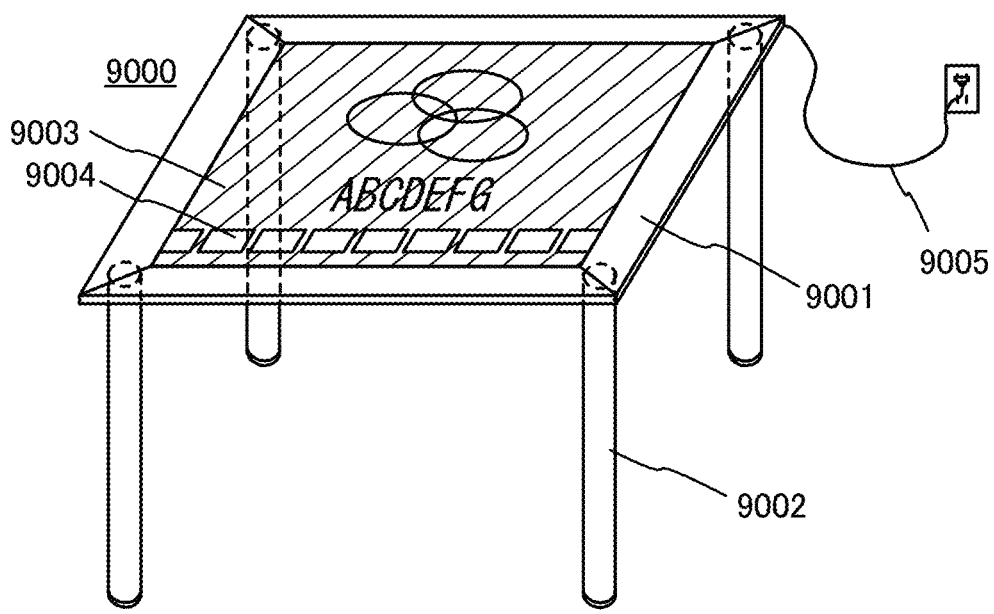
FIGS. 12A to 12C each illustrate an electronic device.
Figure 12B:
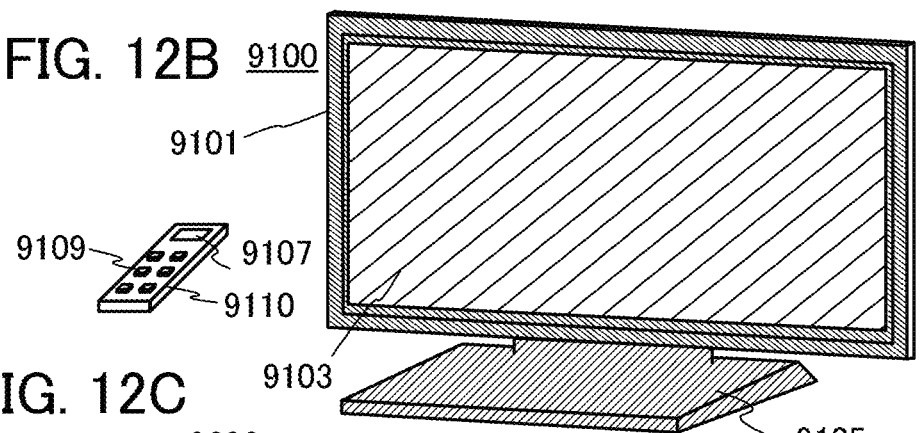
Figure 12C:
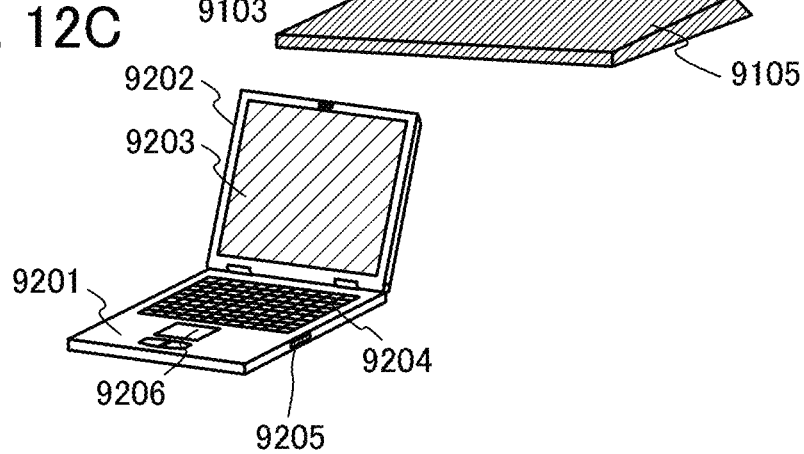

FIG. 12A illustrates a table 9000 having a display portion. In the table 9000, a display portion 9003 is incorporated in a housing 9001 and an image can be displayed on the display portion 9003. Note that the housing 9001 is supported by four leg portions 9002. Further, the housing 9001 is provided with a power cord 9005 for supplying power.

The semiconductor device described in any of Embodiments 1 to 9 can be used in the display portion 9003 so that the electronic device can have high reliability.

The display portion 9003 has a touch-input function. When displayed buttons 9004 which are displayed on the display portion 9003 of the table 9000 are touched with his/her finger or the like, operation of the screen and input of information can be carried out. Further, the table 9000 may be made to communicate with home appliances or control the home appliances, so that the table 9000 can function as a control device which controls the home appliances by operation on the screen. For example, with use of the semiconductor device having an image sensing function described in Embodiment 9, the display portion 9003 can have a touch input function.

Further, it is possible to stand the screen of the display portion 9003 so as to be perpendicular to a floor by using a hinge on the housing 9001; thus, the table 9000 can also be used as a television set. When a television set having a large screen is set in a small room, an open space is reduced; however, when a display portion is incorporated in a table, a space in the room can be efficiently used.

FIG. 12B illustrates a television set 9100. In the television set 9100, a display portion 9103 is incorporated in a housing 9101 and an image can be displayed on the display portion 9103. Note that the housing 9101 is supported by a stand 9105 here.

The television set 9100 can be operated with an operation switch of the housing 9101 or a separate remote controller 9110. Channels and volume can be controlled with operation keys 9109 of the remote controller 9110 so that an image displayed on the display portion 9103 can be controlled. Further, the remote controller 9110 may be provided with a display portion 9107 for displaying data output from the remote controller 9110.

The television set 9100 illustrated in FIG. 12B is provided with a receiver, a modem, and the like. With the receiver, the television set 9100 can receive a general television broadcast. Further, when the television set 9100 is connected to a communication network with or without wires connection via the modem, one-way (from a transmitter to a receiver) or two-way (between a transmitter and a receiver or between receivers) data communication can be performed.

The semiconductor device described in any of Embodiments 1 to 9 can be used in the display portions 9103 and 9107 so that the television set and the remote controller can have high reliability.

FIG. 12C illustrates a computer which includes a main body 9201, a housing 9202, a display portion 9203, a keyboard 9204, an external connection port 9205, a pointing device 9206, and the like.

The semiconductor device described in any of Embodiments 1 to 9 can be used in the display portion 9203, in which case, the computer can have high reliability.

Figure 13A:
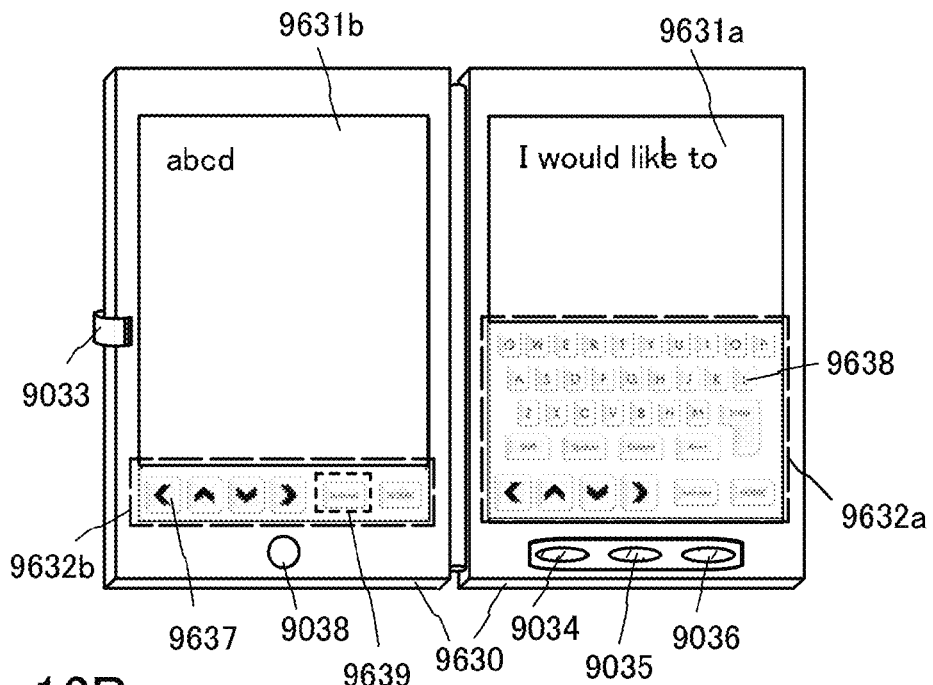
FIGS. 13A to 13C illustrate an electronic device.
Figure 13B:
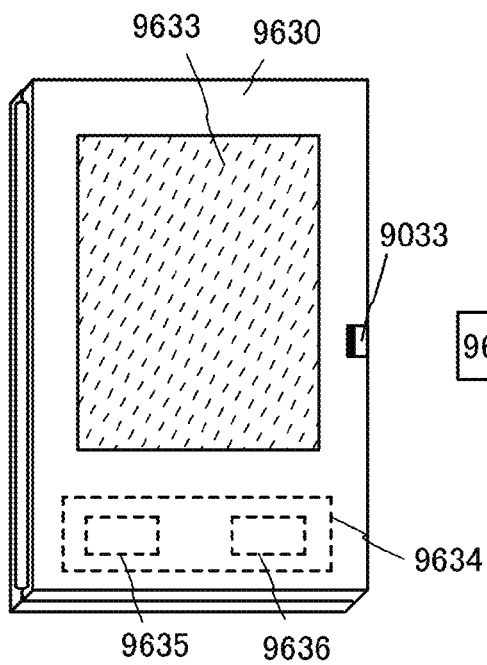

FIGS. 13A and 13B illustrate a tablet terminal that can be folded. In FIG. 13A, the tablet terminal is opened, and includes a housing 9630, a display portion 9631a, a display portion 9631b, a display-mode switch 9034, a power switch 9035, a power-saving-mode switch 9036, a clip 9033, and an operation switch 9038.

The semiconductor device described in any of Embodiments 1 to 9 can be used in the display portion 9631a and the display portion 9631b so that the tablet terminal can have high reliability.

A touch panel area 9632a can be provided in part of the display portion 9631a, in which area, data can be input by touching displayed operation keys 9638. In FIG. 13A, a half of the display portion 9631a has only a display function and the other half has a touch panel function. However, one embodiment of the present invention is not limited to this structure, and the whole display portion 9631a may have a touch panel function. For example, the display portion 9631a can display a keyboard in the whole region to be used as a touch panel, and the display portion 9631b can be used as a display screen.

A touch panel area 9632b can be provided in part of the display portion 9631b like in the display portion 9631a. By touching a keyboard display switching button 9639 displayed on the touch panel with a finger, a stylus, or the like, a keyboard can be displayed on the display portion 9631b.

Touch input can be performed concurrently on the touch panel area 9632a and the touch panel area 9632b.

The display-mode switch 9034 allows switching between a landscape mode and a portrait mode, color display and black-and-white display, and the like. The power-saving-mode switch 9036 allows optimizing the display luminance in accordance with the amount of external light in use which is detected by an optical sensor incorporated in the tablet terminal. In addition to the optical sensor, another detecting device such as a sensor for detecting inclination, like a gyroscope or an acceleration sensor, may be incorporated in the tablet terminal.

Although the display portion 9631a and the display portion 9631b have the same display area in FIG. 13A, one embodiment of the present invention is not limited to this example. The display portion 9631a and the display portion 9631b may have different areas or different display quality. For example, higher definition images may be displayed on one of the display portions 9631a and 9631b.

FIG. 13B illustrates the tablet terminal folded, which includes the housing 9630, a solar battery 9633, a charge and discharge control circuit 9634, a battery 9635, and a DCDC converter 9636. Note that FIG. 13B shows an example in which the charge and discharge control circuit 9634 includes the battery 9635 and the DCDC converter 9636.

Since the tablet terminal can be folded, the housing 9630 can be closed when not in use. Thus, the display portions 9631a and 9631b can be protected, which makes it possible to provide a tablet terminal with high durability and improved reliability for long-term use.

The tablet terminal illustrated in FIGS. 13A and 13B can have other functions such as a function of displaying a variety of kinds of data (e.g., a still image, a moving image, and a text image), a function of displaying a calendar, a date, the time, or the like on the display portion, a touch-input function of operating or editing the data displayed on the display portion by touch input, and a function of controlling processing by a variety of kinds of software (programs).

The solar battery 9633, which is attached on the surface of the tablet terminal, supplies electric power to a touch panel, a display portion, an image signal processor, and the like. Note that the solar battery 9633 can be provided on one or both surfaces of the housing 9630, so that the battery 9635 can be charged efficiently, which is preferable. The use of a lithium ion battery as the battery 9635 is advantageous in downsizing or the like.

Figure 13C:
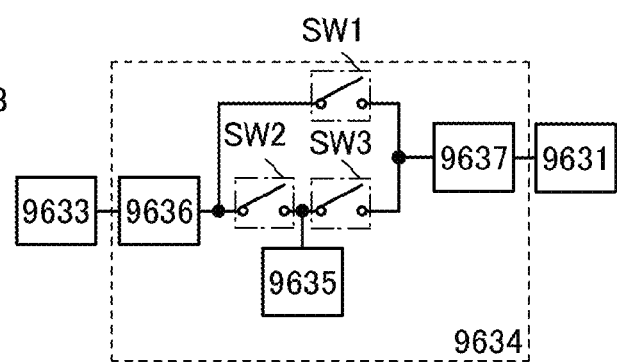

The structure and operation of the charge and discharge control circuit 9634 illustrated in FIG. 13B are described with reference to a block diagram of FIG. 13C. FIG. 13C illustrates the solar battery 9633, the battery 9635, the DCDC converter 9636, a converter 9637, switches SW1 to SW3, and the display portion 9631. The battery 9635, the DCDC converter 9636, the converter 9637, and the switches SW1 to SW3 correspond to the charge and discharge control circuit 9634 in FIG. 13B.

First, description is given of an example of the operation in the case where power is generated by the solar battery 9633 using external light. The voltage of power generated by the solar battery is raised or lowered by the DCDC converter 9636 so that a voltage for charging the battery 9635 is obtained. When the power from the solar battery 9633 is used for the operation of the display portion 9631, the switch SW1 is turned on and the voltage of the power is raised or lowered by the converter 9637 to a voltage needed for operating the display portion 9631. When display is not performed on the display portion 9631, the switch SW1 is turned off and the switch SW2 is turned on so that the battery 9635 can be charged.

Although the solar battery 9633 is shown as an example of a charge means, there is no particular limitation on the charge means and the battery 9635 may be charged with another means such as a piezoelectric element or a thermoelectric conversion element (Peltier element). For example, the battery 9635 may be charged with a non-contact power transmission module that transmits and receives power wirelessly (without contact) to charge the battery or with a combination of other charging means.

The structures, methods, and the like described in this embodiment can be combined as appropriate with any of the structures, methods, and the like described in the other embodiments.

EXAMPLE

Figure 15A:
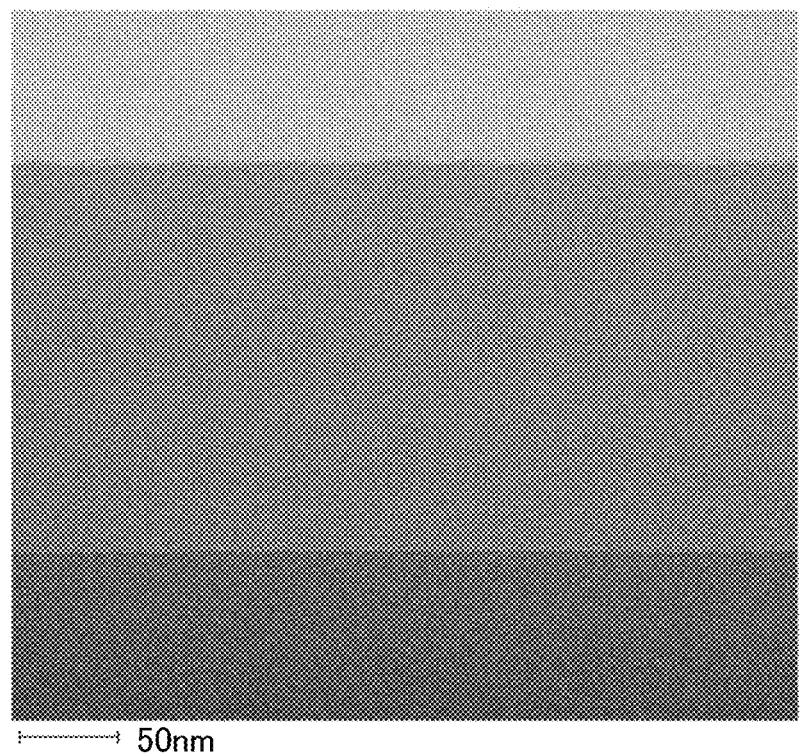
FIGS. 15A and 15B are cross-sectional TEM photographs of Sample A fabricated in Example.
Figure 15B:
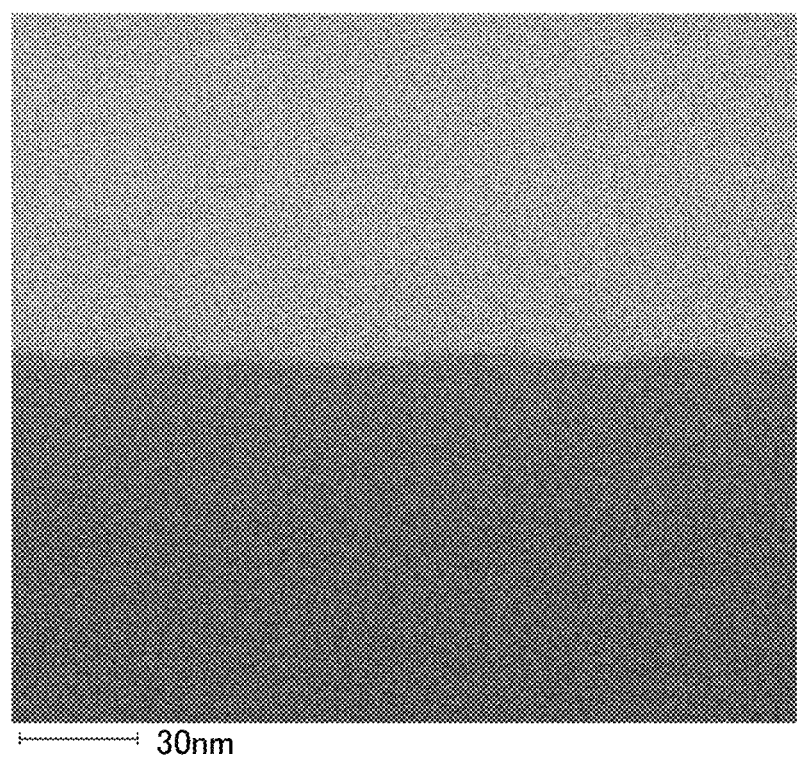

In this example, FIGS. 15A and 15B show results of a cross section of an insulating film which has not yet been subjected to oxygen doping treatment and an insulating film which has been subjected to oxygen doping treatment, which are observed by a transmission electron microscope (TEM).

In Sample A in this example, a silicon nitride oxide film having a thickness of 200 nm was formed over a glass substrate. Further, Sample B was subjected to oxygen doping treatment performed on Sample A.

In Sample A and Sample B, a plasma CVD apparatus was used for formation of the silicon nitride oxide film. The deposition conditions were as follows: $SiH_4$ and $N_2O$ ($SiH_4$:$N_2O$=100 sccm: 2000 sccm) were used for the deposition gas; the pressure was 40 Pa; the substrate temperature was 350° C.; and high-frequency (RF) power was 1000 W.

Further, in Sample B, an ashing apparatus was used for the oxygen doping treatment. The conditions for the oxygen doping treatment were as follows: inductively coupled plasma (ICP) power was 9000 W; bias power was 5000 W; the pressure was 1.33 Pa; the $O_2$ gas was flowed at the flow rate of 250 sccm ($^{16}O$:$^{18}O$=150 sccm:100 sccm).

Figure 16A:
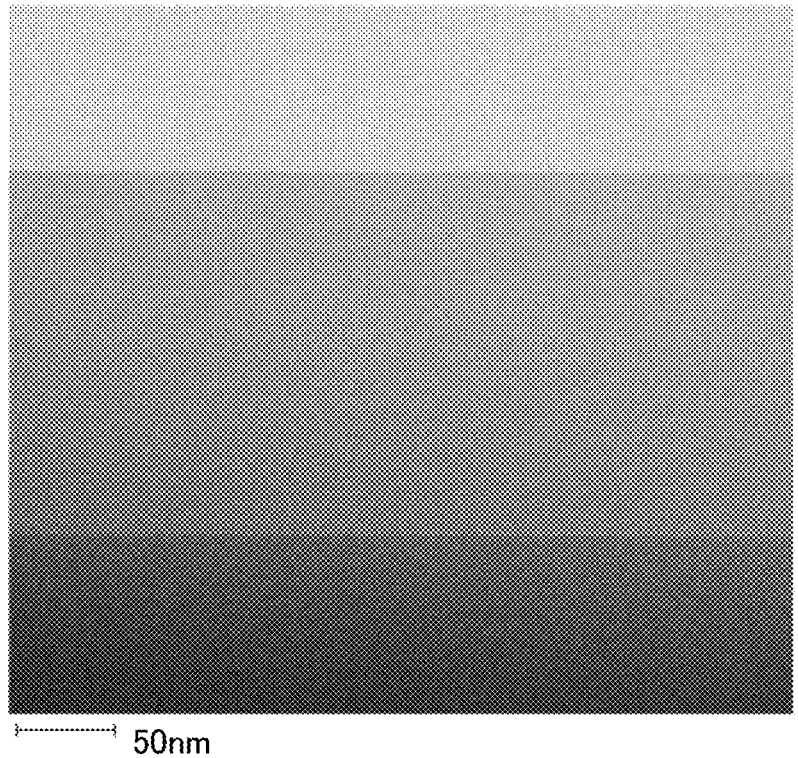
FIGS. 16A and 16B are cross-sectional TEM photographs of Sample B fabricated in Example.
Figure 16B:
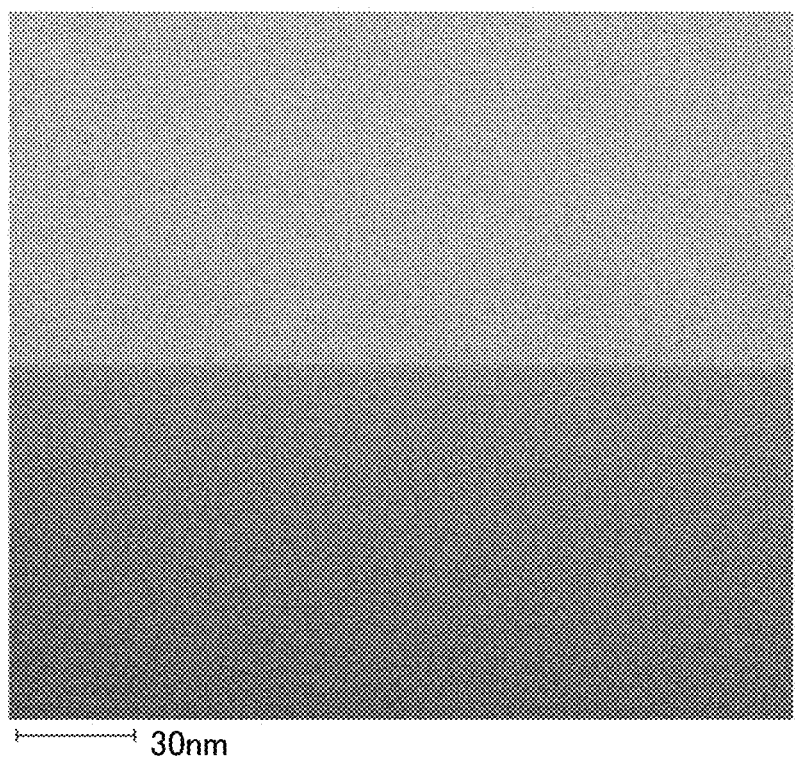

FIGS. 15A and 15B and FIGS. 16A and 16B are cross-sectional TEM images of Sample A and Sample B, which were taken with a TEM. FIG. 15A is a cross-sectional TEM image of Sample A at 500000-fold magnification, and FIG. 15B is a cross-sectional TEM image of Sample A at 1000000-fold magnification. Further, FIG. 16A is a cross-sectional TEM image of Sample B at 500000-fold magnification, and FIG. 16B is a cross-sectional TEM image of Sample B at 1000000-fold magnification. Note that in this example, the cross-sectional TEM image was taken using H-9000NAR manufactured by Hitachi High-Technologies Corporation, with an accelerating voltage of 300 kV.

As shown in FIGS. 15A and 15B, in Sample A, a surface of the silicon nitride oxide film on which the oxygen doping treatment was not performed had projections and depressions. On the other hand, as shown in FIGS. 16A and 16B, in Sample B, it was found that a surface of the silicon nitride oxide film on which the oxygen doping treatment was performed has few projections and depressions, and high planarity. Moreover, while the thickness of the silicon nitride oxide film was 197.5 nm in Sample A, the thickness of the silicon nitride oxide film was 182.2 nm in Sample B, and it was found that the thickness of the silicon nitride oxide film was reduced by the oxygen doping treatment.

As described above, it is shown that planarity of a surface of an insulating film is improved by performing oxygen doping treatment (oxygen plasma doping treatment in this example) on the insulating film.

The insulating film on which the oxygen doping treatment is performed is used, for example, as the gate insulating film of the transistor described in the above embodiments, whereby the planarity of the surface on which an oxide semiconductor film is formed can be improved; therefore, the surface of the oxide semiconductor film which is to be formed over the gate insulating film is improved. Thus, mobility of the transistor using the oxide semiconductor film can be improved. Further, by improving the planarity of the surface on which the oxide semiconductor film is formed, crystallinity of the oxide semiconductor film can be improved and a CAAC-OS film can be formed effectively.

This application is based on Japanese Patent Application serial no. 2011-257793 filed with Japan Patent Office on Nov. 25, 2011, and Japanese Patent Application serial no. 2011-267307 filed with Japan Patent Office on Dec. 6, 2011, the entire contents of which are hereby incorporated by reference.

What is claimed is:

1. A method for manufacturing a semiconductor device, comprising the steps of:
   forming a gate electrode layer;
   forming a gate insulating film over the gate electrode layer;
   removing water or hydrogen from the gate insulating film by performing a first heat treatment on the gate insulating film;
   supplying oxygen to the gate insulating film by performing a first oxygen doping treatment on the gate insulating film after performing the first heat treatment;

forming an oxide semiconductor film over a region of the gate insulating film, which overlaps with the gate electrode layer; and forming a source electrode layer and a drain electrode layer electrically connected to the oxide semiconductor film.

2. The method for manufacturing a semiconductor device according to claim 1, further comprising the step of performing a second oxygen doping treatment on the gate insulating film before performing the first heat treatment.

3. The method for manufacturing a semiconductor device according to claim 1, further comprising performing a second heat treatment on the gate insulating film and the oxide semiconductor film after forming the oxide semiconductor film.

4. The method for manufacturing a semiconductor device according to claim 1, wherein the gate insulating film is formed by a chemical vapor deposition method.

5. The method for manufacturing a semiconductor device according to claim 1, wherein a temperature of the first heat treatment is higher than or equal to 300° C. and lower than or equal to 700° C.

6. The method for manufacturing a semiconductor device according to claim 1, wherein the first oxygen doping treatment is performed by any one of ion implantation method, ion doping method, plasma immersion ion implantation method, and plasma treatment.

7. A method for manufacturing a semiconductor device, comprising the steps of:
    forming a gate electrode layer;
    forming a gate insulating film over the gate electrode layer;
    forming an oxide semiconductor film over a region of the gate insulating film, which overlaps with the gate electrode layer;
    forming a source electrode layer and a drain electrode layer electrically connected to the oxide semiconductor film;
    forming an insulating film over the oxide semiconductor film, the source electrode layer, and the drain electrode layer and in contact with the oxide semiconductor film;
    removing water or hydrogen from the insulating film by performing a first heat treatment on the insulating film; and
    supplying oxygen to the insulating film by performing a first oxygen doping treatment on the insulating film after performing the first heat treatment.

8. The method for manufacturing a semiconductor device according to claim 7, further comprising the step of performing a second oxygen doping treatment on the gate insulating film before performing the first heat treatment.

9. The method for manufacturing a semiconductor device according to claim 7, further comprising the steps of:
    forming an aluminum oxide film covering the gate insulating film, the oxide semiconductor film, and the insulating film, and
    performing a second heat treatment on the gate insulating film, the oxide semiconductor film, and the insulating film after forming the aluminum oxide film.

10. The method for manufacturing a semiconductor device according to claim 7, wherein the insulating film is formed by a chemical vapor deposition method.

11. The method for manufacturing a semiconductor device according to claim 7, wherein a temperature of the first heat treatment is higher than or equal to 300° C. and lower than or equal to 700° C.

12. The method for manufacturing a semiconductor device according to claim 7, wherein the first oxygen doping treatment is performed by any one of ion implantation method, ion doping method, plasma immersion ion implantation method, and plasma treatment.

13. A method for manufacturing a semiconductor device, comprising the steps of:
    forming a gate electrode layer;
    forming a gate insulating film over the gate electrode layer;
    removing water or hydrogen from the gate insulating film by performing a first heat treatment on the gate insulating film;
    supplying oxygen to the gate insulating film by performing a first oxygen doping treatment on the gate insulating film after performing the first heat treatment;
    forming an oxide semiconductor film over a region of the gate insulating film, which overlaps with the gate electrode layer;
    forming a source electrode layer and a drain electrode layer electrically connected to the oxide semiconductor film;
    forming an insulating film in contact with the oxide semiconductor film and over the oxide semiconductor film, the source electrode layer, and the drain electrode layer;
    removing water or hydrogen from the insulating film by performing a second heat treatment on the insulating film; and
    supplying oxygen to the insulating film by performing a second oxygen doping treatment on the insulating film after performing the second heat treatment.

14. The method for manufacturing a semiconductor device according to claim 13, further comprising the step of performing a third oxygen doping treatment on the gate insulating film before performing the first heat treatment.

15. The method for manufacturing a semiconductor device according to claim 13, further comprising the step of performing a third oxygen doping treatment on the insulating film before performing the second heat treatment.

16. The method for manufacturing a semiconductor device according to claim 13, further comprising the steps of:
    forming an aluminum oxide film covering the gate insulating film, the oxide semiconductor film, and the insulating film, and
    performing a third heat treatment on the gate insulating film, the oxide semiconductor film, and the insulating film after forming the aluminum oxide film.

17. The method for manufacturing a semiconductor device according to claim 13, wherein the gate insulating film is formed by a chemical vapor deposition method.

18. The method for manufacturing a semiconductor device according to claim 13, wherein the insulating film is formed by a chemical vapor deposition method.

19. The method for manufacturing a semiconductor device according to claim 13, wherein a temperature of the first heat treatment is higher than or equal to 300° C. and lower than or equal to 700° C.

20. The method for manufacturing a semiconductor device according to claim 13, wherein the first oxygen doping treatment is performed by any one of ion implantation method, ion doping method, plasma immersion ion implantation method, and plasma treatment.

* * * * *